(12) United States Patent
Chung et al.

(10) Patent No.: US 12,713,857 B2
(45) Date of Patent: Aug. 18, 2026

(54) METHOD FOR MANUFACTURING SEMICONDUCTOR DEVICE

(71) Applicant: SAMSUNG ELECTRONICS CO., LTD., Suwon-si (KR)

(72) Inventors: Sanggyo Chung, Suwon-si (KR); Seunghee Han, Suwon-si (KR); Seulgi Lee, Suwon-si (KR); Chanmi Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 283 days.

(21) Appl. No.: 18/407,536

(22) Filed: Jan. 9, 2024

(65) Prior Publication Data

US 2024/0297051 A1 Sep. 5, 2024

(30) Foreign Application Priority Data

Mar. 2, 2023 (KR) ........................ 10-2023-0027558

(51) Int. Cl.

*H10P 50/00* (2026.01)
*H10P 50/28* (2026.01)
*H10P 76/40* (2026.01)

(52) U.S. Cl.

CPC ............ *H10P 50/73* (2026.01); *H10P 50/283* (2026.01); *H10P 76/405* (2026.01)

(58) Field of Classification Search

CPC ......... H10B 12/00; H10B 12/09; H10P 50/00; H10P 50/28; H10P 50/283; H10P 50/695;

(Continued)

(56) References Cited

U.S. PATENT DOCUMENTS 8,368,182 B2 2/2013 Lee et al.
9,324,619 B2 4/2016 Baek et al.

(Continued)

FOREIGN PATENT DOCUMENTS

KR 10-2016-0085043 A 7/2016
KR 10-2420150 B1 7/2022

(Continued)

OTHER PUBLICATIONS

Notice of Allowance in Taiwanese Appln. No. 113100645, mailed on Feb. 12, 2025, 9 pages (with Machine translation).

*Primary Examiner* — Brook Kebede
(74) *Attorney, Agent, or Firm* — Fish & Richardson P.C.

(57) ABSTRACT

A method for manufacturing a semiconductor device includes stacking an etch target layer and an etching mask layer on a substrate having first through third regions, forming first photoresist patterns on the etching mask layer in the first and second regions and a second photoresist pattern to completely cover the third mask layer in the third region, etching the etching mask layer using the first and second photoresist patterns as etching masks to form first mask patterns on the first and second regions and a second mask pattern on the third region, forming a filling pattern in a first opening between first mask patterns on the second region, etching the etch target layer using the first and second mask patterns and the filling pattern as etching masks to form first patterns including second openings on the first region and a bulk pattern covering second and third regions of the substrate.

20 Claims, 43 Drawing Sheets

(58) Field of Classification Search
CPC .......... H10P 50/71; H10P 50/73; H10P 76/20; H10P 76/204; H10P 76/2043; H10P 76/40; H10P 76/405; H10P 76/408; H10P 76/4085
See application file for complete search history.

(56) References Cited

U.S. PATENT DOCUMENTS

| | | | | |
|---|---|---|---|---|
| 9,524,870 | B2 | 12/2016 | Kang et al. | |
| 9,837,273 | B2 | 12/2017 | Lee et al. | |
| 9,859,283 | B1 | 1/2018 | Feng et al. | |
| 10,096,603 | B2 | 10/2018 | Kim et al. | |
| 10,475,649 | B2 | 11/2019 | Chuang et al. | |
| 11,289,493 | B2 | 3/2022 | Lin et al. | |
| 11,355,498 | B2 | 6/2022 | Choi et al. | |
| 2007/0249117 | A1* | 10/2007 | Kang | H10P 50/71 524/602 |
| 2021/0351036 | A1* | 11/2021 | Wang | H10P 76/4085 |
| 2022/0199616 | A1* | 6/2022 | Park | H10D 84/83 |
| 2022/0293421 | A1 | 9/2022 | Park et al. | |

FOREIGN PATENT DOCUMENTS

| | | | |
|---|---|---|---|
| KR | 10-2022-0127417 | A | 9/2022 |
| TW | 201611273 | A | 3/2016 |

* cited by examiner 126
112a
130a
126
126a
110a
108
106
104
102
100
112b
110b
II
II'
A
B
C 142
142
126
130a
126
140a
110a
108a
106
104
102
100
110b
108b
140b
II
II'
A
B
C

METHOD FOR MANUFACTURING SEMICONDUCTOR DEVICE

CROSS-REFERENCE TO RELATED APPLICATION

This application claims priority under 35 USC § 119 to Korean Patent Application No. 10-2023-0027558, filed on Mar. 2, 2023, in the Korean Intellectual Property Office (KIPO), the contents of which are incorporated by reference herein in their entirety.

BACKGROUND

1. Field

Example embodiments relate to a method for manufacturing a semiconductor device. Particularly, example embodiments relate to a method for manufacturing a semiconductor device including patterns.

2. Description of the Related Art

A semiconductor device may include a first region designed to form regularly arranged patterns and a second region designed to form a bulk pattern. The patterns formed on an edge of the first region may have a pattern arrangement density different from a pattern arrangement density of the bulk pattern on the second region adjacent thereto.

SUMMARY

According to example embodiments, there is provided a method for manufacturing a semiconductor device. In the method, a first mask layer, a second mask layer and a third mask layer may be stacked on a substrate including a first region, a second region surrounding the first region and designed as a bulk region, and a third region positioned outside the second region and designed as the bulk region. First photoresist patterns may be formed on the third mask layer in the first and second regions, and a second photoresist pattern may be formed to cover the third mask layer in the third region. The first photoresist patterns may include lines and spaces repeatedly arranged. The third mask layer may be etched using the first and second photoresist patterns as etching masks to form first structures on the first and second regions and second structures on the third region, respectively. A first spacer layer may be conformally formed on surfaces of the first and second structures and the first mask layer. A filling pattern may be formed to fill a first opening between first structures on the second region. The first spacer layer on the first region may be anisotropically etched to form first spacers on sidewalls of the first structures on the first region. The first structures between first spacers on the first region may be removed. The second mask layer may be etched using the first spacers on the first region and the first and second structures and the filling pattern on the second and third regions as etching masks to form first mask patterns on the first mask layer in the first region and a second mask pattern on the first mask layer in the second and third regions. The first mask patterns may include lines and spaces repeatedly arranged.

According to example embodiments, there is provided a method for manufacturing a semiconductor device. In the method, a first mask layer, a second mask layer and a third mask layer may be sequentially stacked on a substrate including a first region, a second region surrounding the first region and designed as a bulk region, and a third region positioned outside the second region and designed as the bulk region. A first photoresist pattern may be formed on the third mask layer in the first and second regions, and a second photoresist pattern may be formed to cover the third mask layer in the third region. The first photoresist patterns may include lines and spaces repeatedly arranged. The third mask layer may be etched using the first and second photoresist patterns as etching masks to form first structures on the first and second regions and second structures on the third region, respectively. A first spacer layer may be conformally formed on surfaces of the first and second structures and the first mask layer. A filling pattern may be formed to fill a first opening between first structures in the second region. The first spacer layer on the first region may be anisotropically etched to form first spacers on sidewalls of first structures on the first region. The first structures between first spacers of the first region may be removed. The second mask layer may be etched using the first spacers on the first region and the first and second structures and the filling pattern on the second and third regions as etching masks to form first mask patterns including a second opening on the first mask layer in the first region and a second mask pattern covering the first mask layer in the second and third regions. Second spacers may be formed on sidewalls of the first mask pattern and the second mask pattern. The first mask pattern may be removed. The first mask layer may be etched using the second spacers and second mask pattern as etching masks to form third mask patterns including a third opening on the first region of the substrate and a fourth mask pattern on the second and third regions.

According to example embodiments, there is provided a method for manufacturing a semiconductor device. In the method, an etch target layer and an etching mask layer may be stacked on a substrate including a first region, a second region surrounding the first region and designed as a bulk region, and a third region positioned outside the second region and designed as the bulk region. First photoresist patterns may be formed on the etching mask layer in the first and second regions and a second photoresist pattern may be formed to completely cover the third mask layer in the third region. The first photoresist patterns may include lines and spaces repeatedly arranged. The etching mask layer may be etched using the first and second photoresist patterns as etching masks to form first mask patterns on the first and second regions and a second mask pattern on the third region, respectively. A filling pattern may be formed to fill a first opening between first mask patterns on the second region. The etch target layer may be etched using the first and second mask patterns and the filling pattern as etching masks to form first patterns including second openings on the first region and a bulk pattern covering second and third regions of the substrate. The first patterns include lines and spaces repeatedly arranged.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, preferred embodiments will be described in detail with reference to the accompanying drawings.

Hereinafter, a first direction and a second direction may be parallel to an upper surface of a substrate, and may be perpendicular to each other. In addition, a direction parallel to the upper surface of the substrate and oblique to the first direction is referred to as a third direction.

FIGS. 1 to 13 are cross-sectional views and plan views of stages in a method of manufacturing a semiconductor device according to example embodiments. FIGS. 1, 3, 4A, 4B, 6A, 6B, 7A, 7B, 9, 11 and 12A, 12B are cross-sectional views, and FIGS. 2, 5, 8, 10 and 13 are plan views. Each of the cross-sectional views is a view taken along line I-I' of a corresponding plan view.

Figure 1:
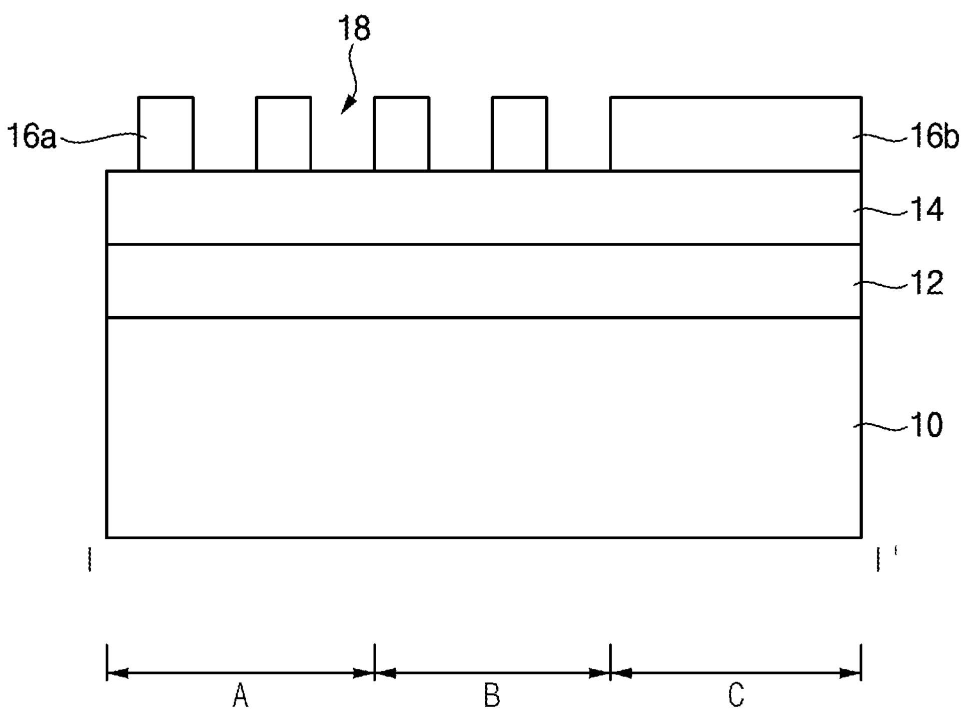
FIGS. 1 to 13 are cross-sectional views and plan views of stages in a method of manufacturing a semiconductor device according to example embodiments.
Figure 2:
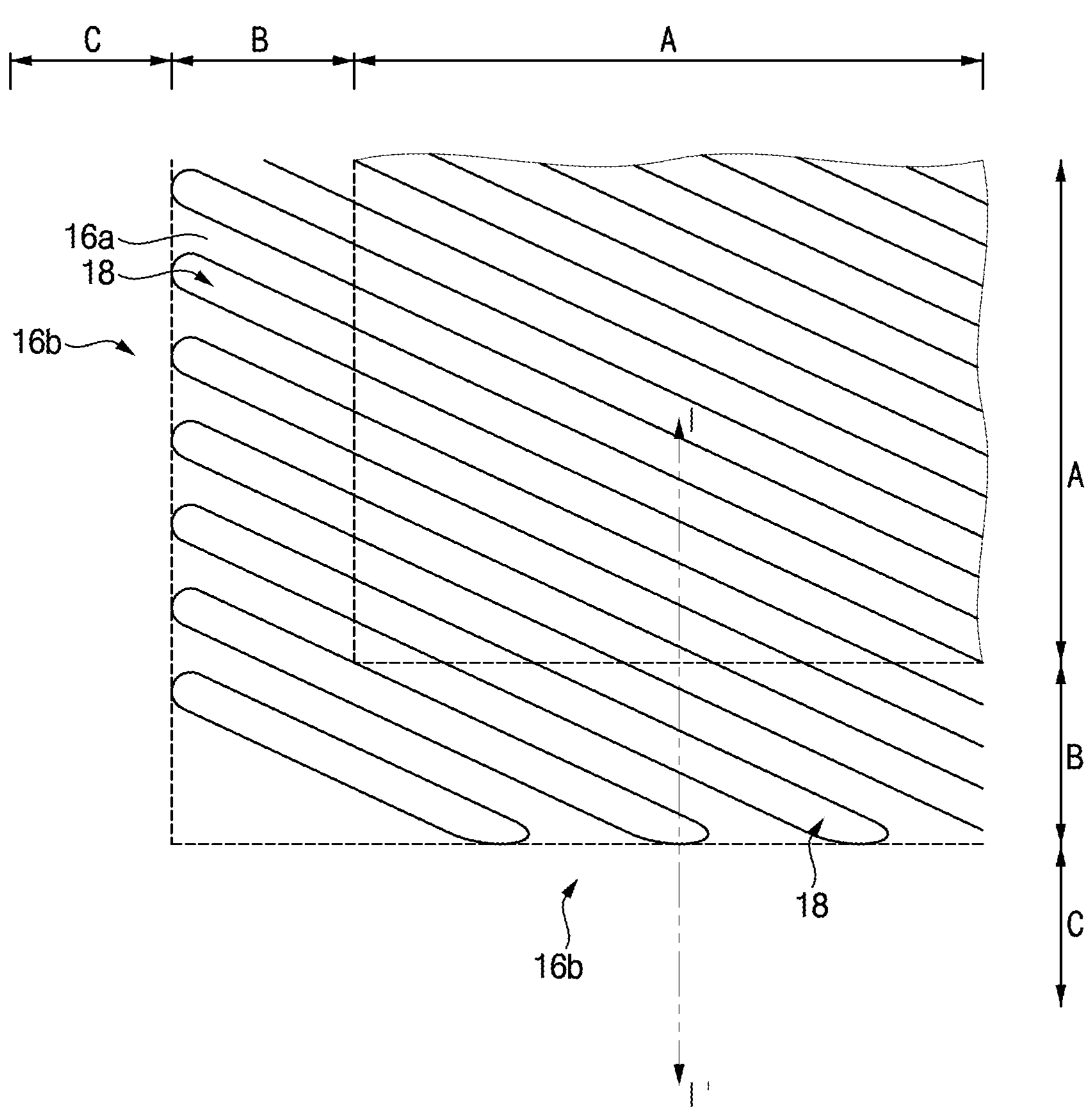

Referring to FIGS. 1 and 2, an etch target layer 12 and an etching mask layer 14 may be formed on a substrate 10. The substrate 10 may include a first region A, a second region B, and a third region C. The first region A may be a region for forming fine patterns having a regular arrangement (e.g., a constant pitch) and a fine critical dimension (i.e., non-bulk patterns). The second region B may be adjacent to the first region A, and may surround an edge of the first region A. The third region C may be disposed outside the second region B. The second region B may be disposed between the first and third regions A and C.

The first region A may be a pattern region designed to form the fine patterns. The first region A may be an area where designed first exposure patterns for forming the fine patterns are actually formed by an exposure process. The area where the first exposure patterns are formed by the exposure process may be referred to as a pattern exposure area. An area where a bulk exposure pattern is formed by the exposure process may be referred to as a bulk exposure area. Therefore, the first region A may correspond to the pattern exposure area. The second region B may be a bulk region for forming the bulk pattern. However, the second region B may be an area where the first exposure patterns instead of a bulk exposure pattern are formed by the exposure process. Therefore, the second region B may correspond to the pattern exposure area. The second region B may be an area where the bulk exposure pattern may not be actually formed by the exposure process. The third region C may be the bulk region for forming the bulk pattern. The third region C may be an area where designed bulk exposure patterns are actually formed by the exposure process. Therefore, the third region C may correspond to the bulk exposure area. For example, the first exposure patterns may be formed on the first region A and the second region B.

Therefore, the first region A may be the pattern region designed to form the fine patterns. The second and third regions B and C may be the bulk region designed to form the bulk pattern. Also, the first and second region A and B may be the pattern exposure area, and the third region C may be the bulk exposure area (e.g., the second region B may be a pattern exposure area where a bulk pattern may be formed).

Herein, the fine patterns may include openings and protrusions so as to have concave and convex shapes. The bulk pattern may be a wide pattern having a flat upper surface and having no patterns having the concave and convex shapes.

In the following description, each of the first, second, and third regions A, B, and C may include a surface of the substrate 10 and a region perpendicular to the surface of the substrate 10.

The substrate 10 may include a single crystal semiconductor material. The substrate 10 may include a semiconductor material, e.g., silicon, germanium, or silicon-germanium. In example embodiments, the substrate 10 may be monocrystalline silicon.

A photoresist layer may be coated on the etching mask layer 14. An exposure process and a development process may be performed on the photoresist layer, so that a first photoresist pattern 16*a* may be formed on the etching mask layer 14 in the first and second regions A and B, and a second photoresist pattern 16*b* may be formed on the etching mask layer 14 in the third region C.

A first opening 18 having a line shape may be formed between the first photoresist patterns 16*a*. Therefore, the first photoresist patterns 16*a* may include lines and spaces alternately arranged.

In example embodiments, the first openings 18 between the first photoresist patterns 16*a* may extend in the third direction. The first openings 18 may be spaced apart from each other in a direction perpendicular to the third direction. Ends of the first openings 18 in the third direction may extend into an end of the second region B adjacent to the third region C, e.g., the first openings 18 may extend continuously in the third direction through the first and second regions A and B to an edge of the second region B adjacent to the third region C.

The second photoresist pattern 16*b* may, e.g., continuously, cover the entire etching mask layer 14 on the third region C. The second photoresist pattern 16*b* may have a plate shape without separate patterns, e.g., a single photoresist pattern covering the entire third region C. The second photoresist pattern 16*b* may not include openings.

The first photoresist patterns 16*a* may be exposure patterns for forming target circuit patterns. Therefore, the exposure process may be performed to form the exposure patterns for forming target circuit patterns (e.g., the first exposure patterns) on the first and second regions A and B. The second photoresist pattern 16*b* may be the bulk exposure pattern for forming the bulk pattern. Therefore, the photoresist layer on the third region C may not be exposed by the exposure process.

By performing the exposure process for forming the first and second photoresist patterns 16*a* and 16*b*, the first openings 18 may be formed in the photoresist layer on the first and second regions A and B, and the first openings 18 may not be formed in the photoresist layer on the third region C.

In general, in an exposure process for forming photoresist patterns, the photoresist patterns disposed on an edge of one of the regions may have a lower uniformity than the uniformity of the photoresist patterns disposed on a center of the one of the regions, due to a difference of a pattern arrangement density.

However, in example embodiments, the first photoresist patterns 16*a* may be formed not only on the first region A (which is the pattern region) but also in the second region B (which is the bulk region adjacent thereto). The first photoresist patterns 16*a* may be formed on the first region A, in which an actual patterning process is performed for forming the fine patterns, and on the second region B designed to form the bulk pattern. Therefore, at least the first photoresist pattern 16*a* on the entire first region A may be uniformly formed as desired fine patterns. For example, a width of at least the first photoresist pattern 16*a* and a width of at least the first opening 18 on the first region A may have target values.

Figure 3:
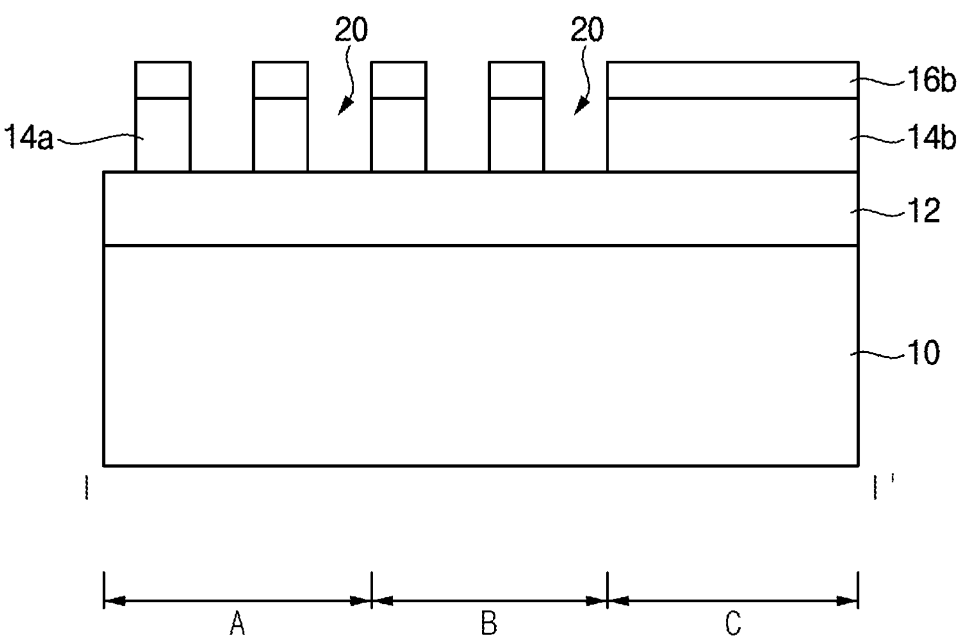

Referring to FIG. 3, the etching mask layer 14 may be etched using the first and second photoresist patterns 16*a* and 16*b* as etching masks to form first mask patterns 14*a* on the first and second regions A and B and a second mask pattern 14*b* on the third region C.

Since the first mask patterns 14*a* are transferred by the first photoresist patterns 16*a*, in a plan view, the first mask patterns 14*a* may have the same shapes as the shapes of the first photoresist patterns 16*a*. A second opening 20 may be included between the first mask patterns 14*a*. A plurality of second openings 20 may overlap the first openings 18 (referred to FIG. 1). The etch target layer 12 may be exposed by a bottom of each of the second openings 20.

Since the second mask pattern 14*b* is transferred by the second photoresist pattern 16*b*, in a plan view, the second mask pattern 14*b* may have a same shape as the shape of the second photoresist pattern 16*b*. The second mask pattern 14*b* may not include openings, and the second mask pattern 14*b* may completely cover the etch target layer 12 on the third region C.

After that, the first and second photoresist patterns 16*a* and 16*b* may be removed.

FIGS. 4B, 6B, 7B, and 12B are cross-sectional views illustrating that a boundary of a third photoresist pattern does not coincide, e.g., align, with a boundary of the first region due to a void included in the third photoresist pattern. In each of the cross-sectional views, except for FIGS. 4B, 6B, 7B, and 12B, the boundary of the third photoresist pattern may be positioned at the boundary of the first region (i.e., a target region). However, the boundary of the third photoresist pattern 30 may be irregularly formed, as shown in each of the plan views.

Figure 4A:
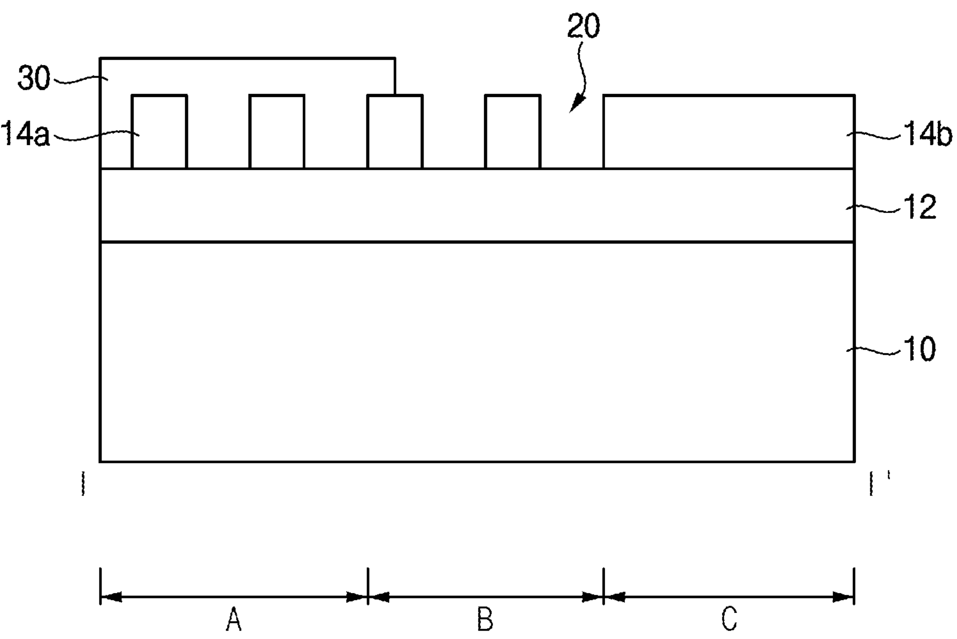
Figure 4B:
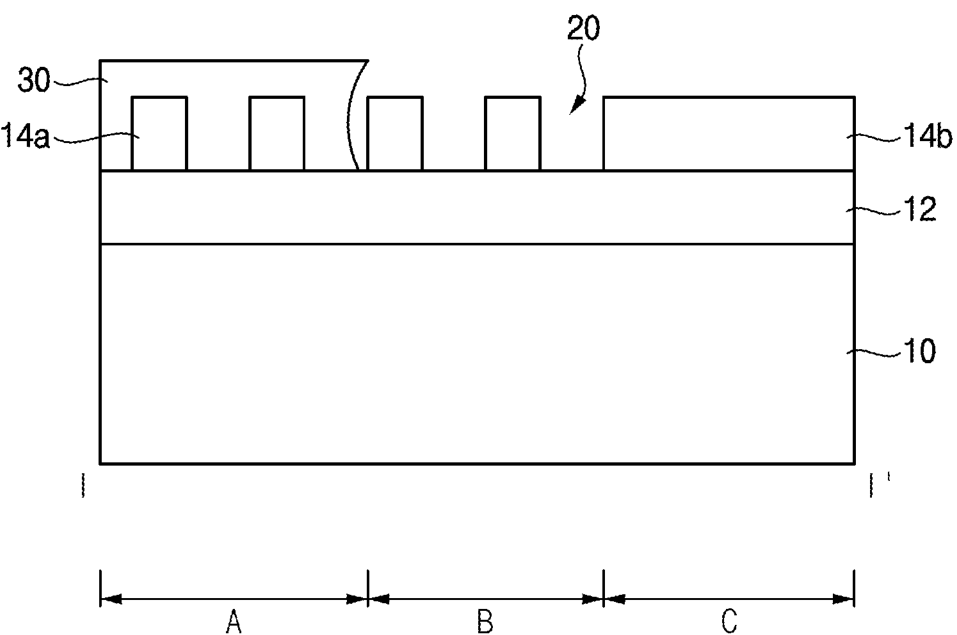
Figure 5:
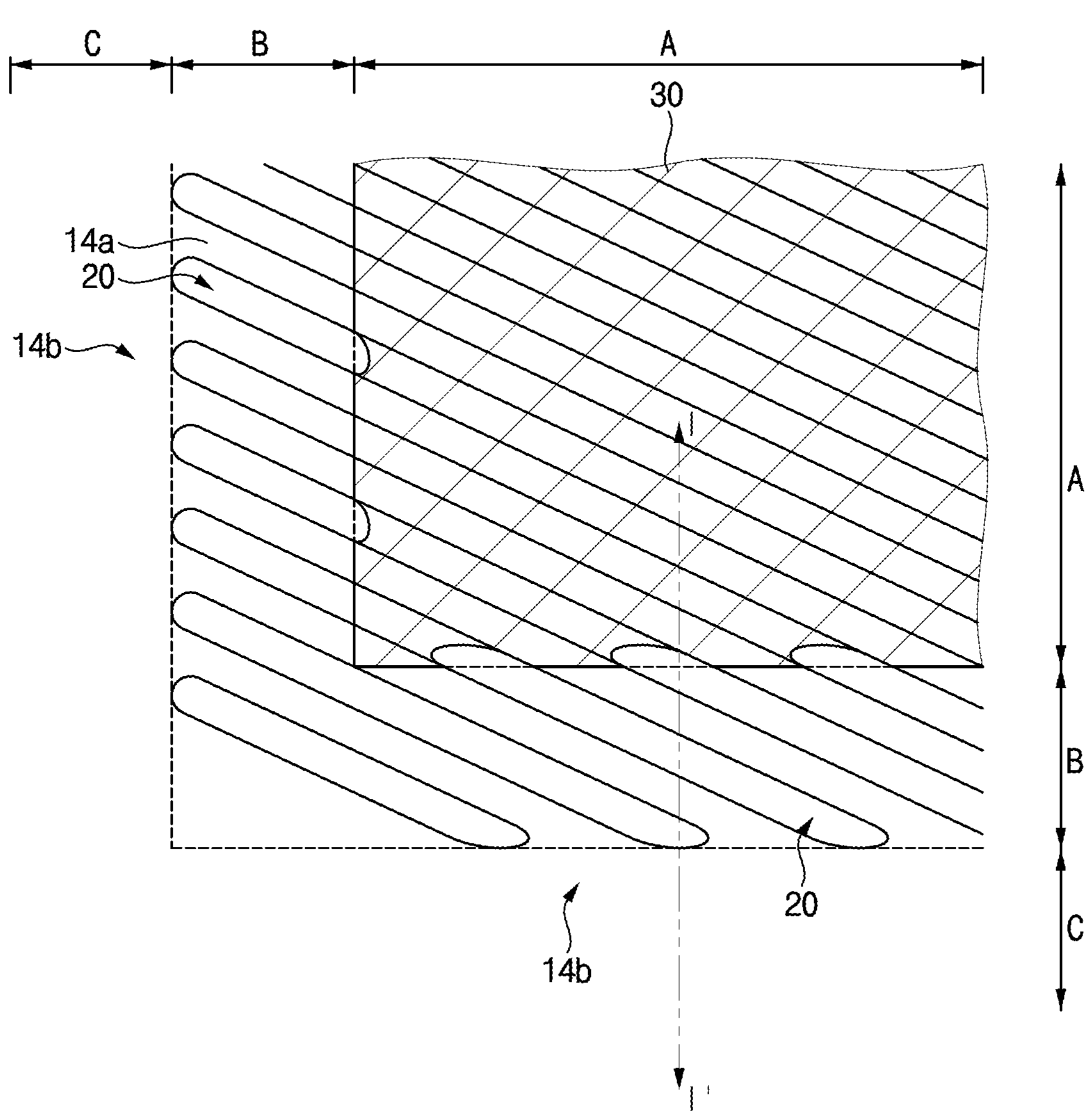

Referring to FIGS. 4A, 4B, and 5, a third photoresist layer may be formed on the first mask pattern 14*a*, the second mask pattern 14*b*, and the etch target layer 12. The third photoresist layer may, e.g., completely, cover the first mask pattern 14*a*, the second mask pattern 14*b*, and the etch target layer 12 to fill the second opening 20.

The third photoresist layer may be patterned by an exposure process to form the third photoresist pattern 30 covering the first mask pattern 14*a* and the etch target layer 12 on the first region A (e.g., only in the first region A among the first through third regions A through C). The third photoresist pattern 30 may expose the first mask pattern 14*a*, the second mask pattern 14*b*, and the etch target layer 12 on the second and third regions B and C.

In some example embodiments, since the third photoresist pattern 30 is formed to cover the entirety of the first mask pattern 14*a* and the etch target layer 12 on the first region A, the third photoresist pattern 30 may be formed to additionally cover a portion of the second region B to increase process margin.

In some example embodiments, when the third photoresist layer is formed, voids may be formed in the third photoresist layer.

When the third photoresist pattern 30 is formed by the exposure process, an edge of the third photoresist pattern 30 may not be aligned along a straight line, and a boundary of the third photoresist pattern 30 may be irregularly disposed. For example, as shown in FIGS. 4B and 5, a portion of the boundary of the third photoresist pattern 30 may be positioned at an inner portion of the first region A.

Figure 6A:
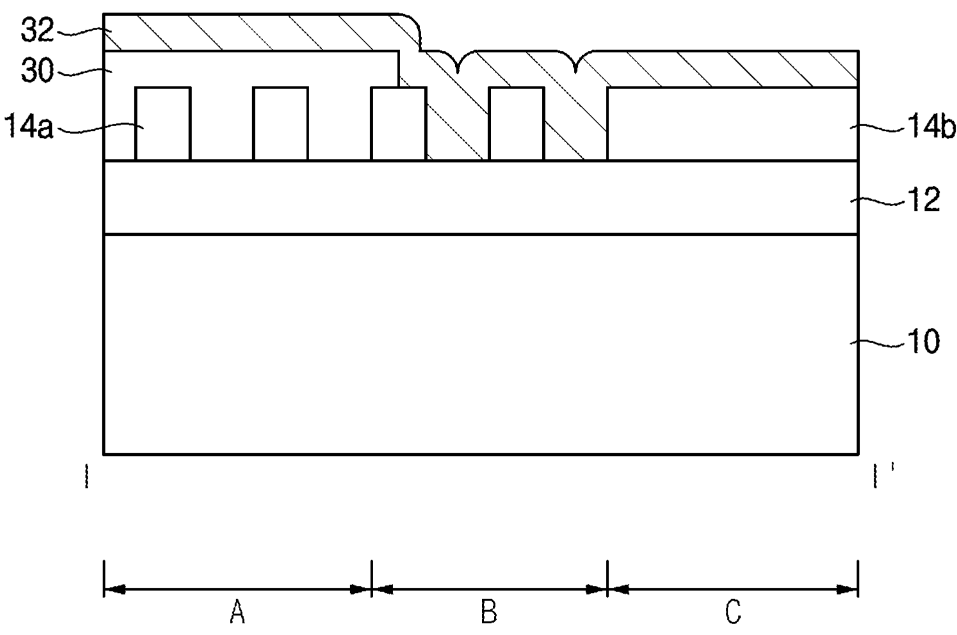
Figure 6B:
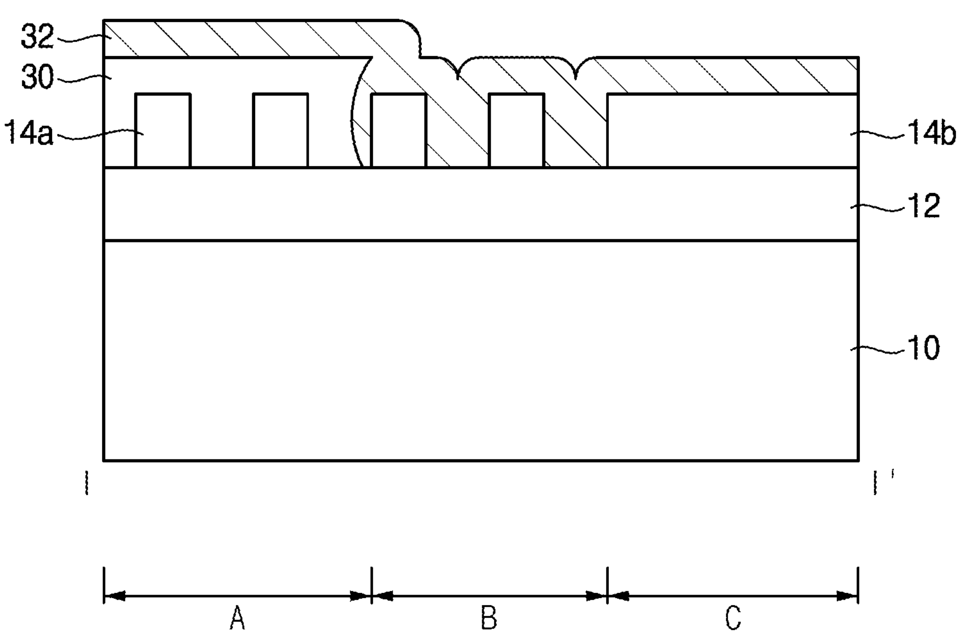

Referring to FIGS. 6A and 6B, a filling layer 32 may be formed on the third photoresist pattern 30, the first mask pattern 14*a*, the second mask pattern 14*b*, and the etch target layer 12. The filling layer 32 may be formed to fill an inner space of the second opening 20 on the second region B. Accordingly, a thickness of the filling layer 32 in the second opening 20 (e.g., along a direction normal to a bottom of the substrate 10) may be greater than a thickness of the filling layer 32 on other regions (e.g., on upper surfaces of the third photoresist pattern 30, the first mask pattern 14*a*, and the second mask pattern 14*b*).

The filling layer 32 may be conformally formed on surfaces of the third photoresist pattern 30, the first mask pattern 14*a*, the second mask pattern 14*b*, and the etch target layer 12. In example embodiments, the filling layer 32 may include silicon oxide. In example embodiments, the filling layer 32 may be formed by an atomic layer deposition (ALD) process.

As shown in FIG. 6B, when the boundary of the third photoresist pattern 30 is irregularly formed, a portion of the filling layer 32 contacting the boundary of the third photoresist pattern 30 may also be irregularly formed.

Figure 7A:
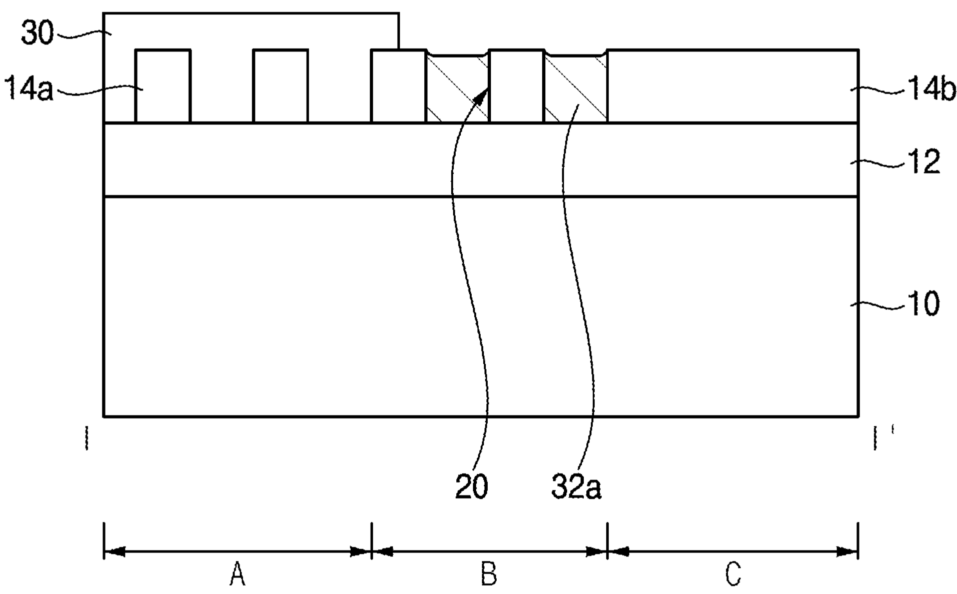
Figure 7B:
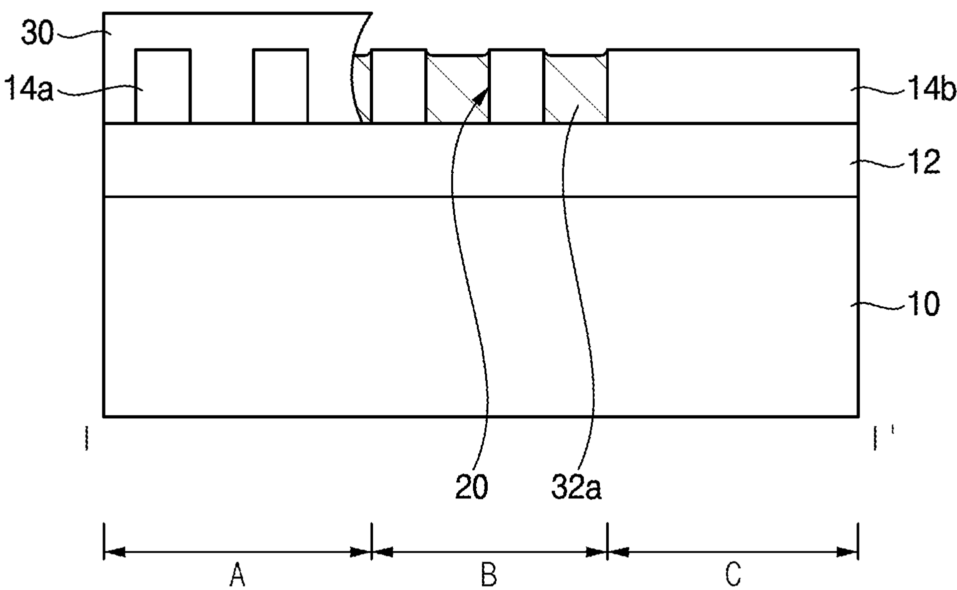
Figure 8:
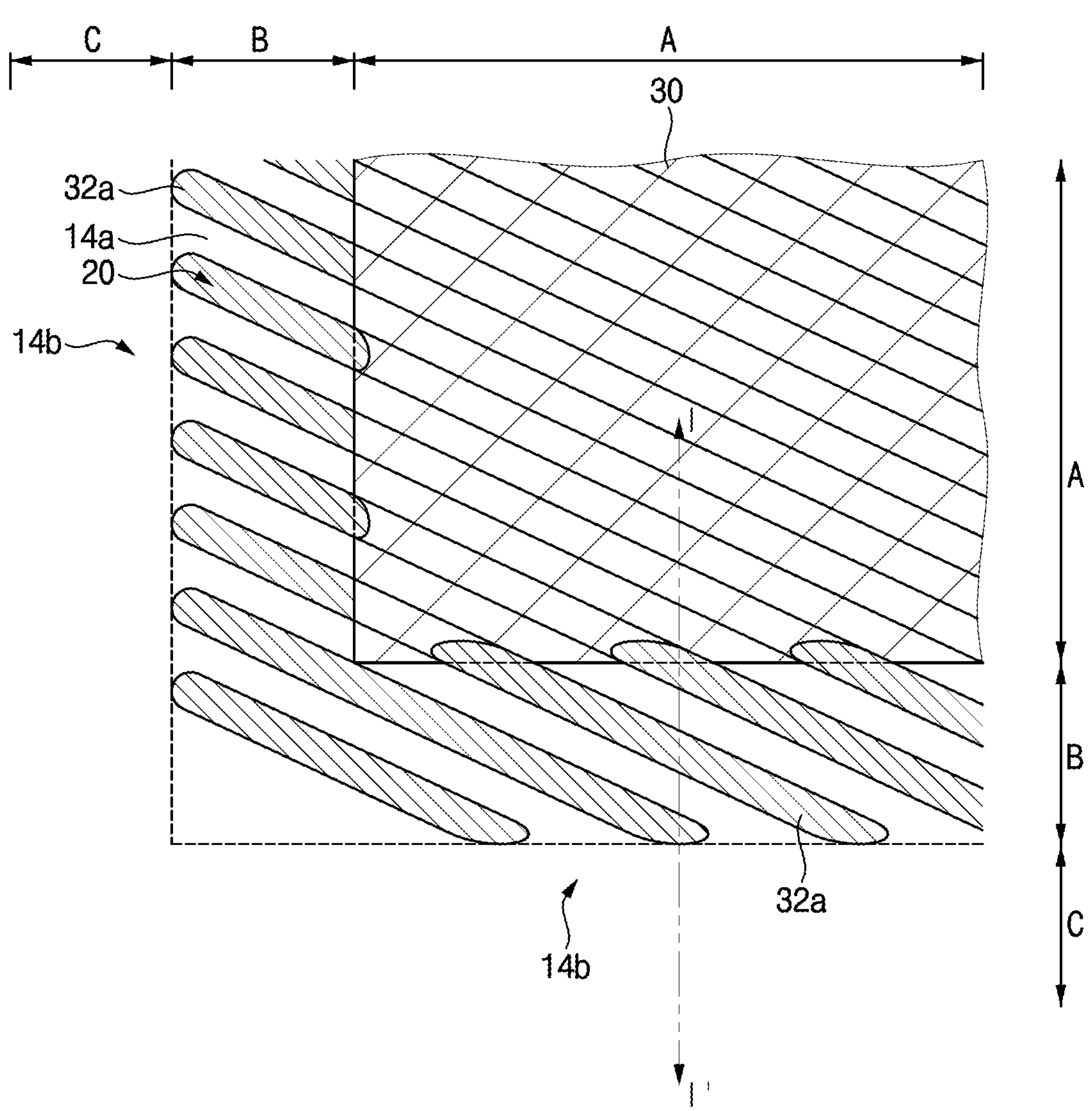

Referring to FIGS. 7A, 7B and 8, the filling layer 32 may be etched to expose upper surfaces of the third photoresist pattern 30 and second mask pattern 14*b*. The etching process may include anisotropic etching, e.g., a dry etching process. Since the thickness of the filling layer 32 in the second opening 20 is greater than the thickness of the filling layer 32 on other regions, the filling layer 32 in the second opening 20 on the second region B may remain to form the first filling pattern 32*a* filling the second opening 20, after the etching process. For example, as illustrated in FIG. 7A, all portions of the filling layer 32 other than the first filling pattern 32*a* filling the second opening 20 may be removed. In another example, the filling layer 32 positioned on the sidewall of an edge of the third photoresist pattern 30 may partially remain.

By the above process, as the first filling pattern 32*a* fills the second opening 20 on the second region B, a bulk mask pattern may be formed on the second region B. That is, the bulk mask pattern on the second region B may include the first mask pattern 14*a* and the first filling pattern 32*a*, e.g., the bulk mask pattern on the second region B may be defined by the combined first mask pattern 14*a* and first filling pattern 32*a*.

Figure 9:
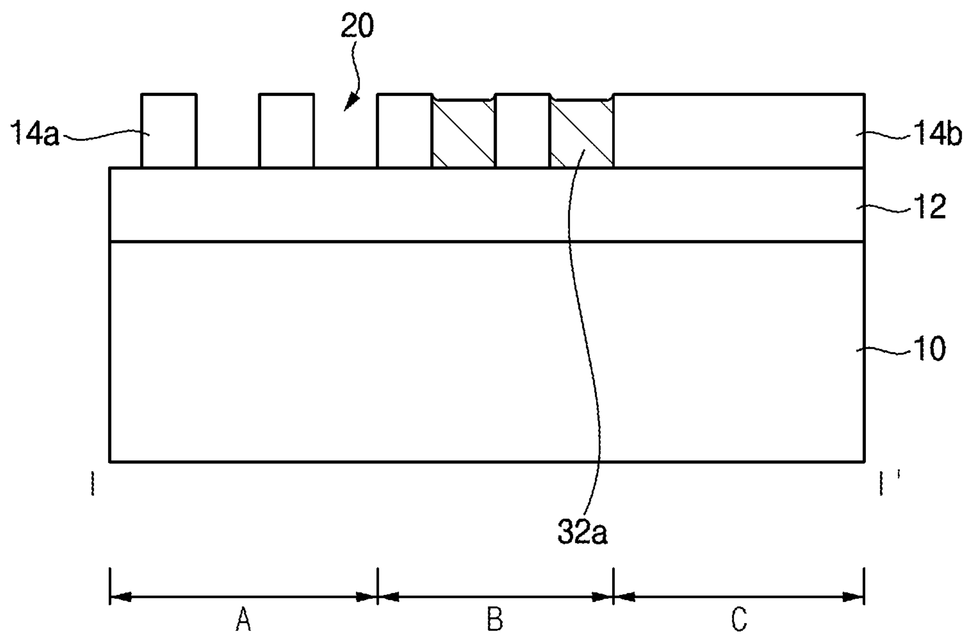
Figure 10:
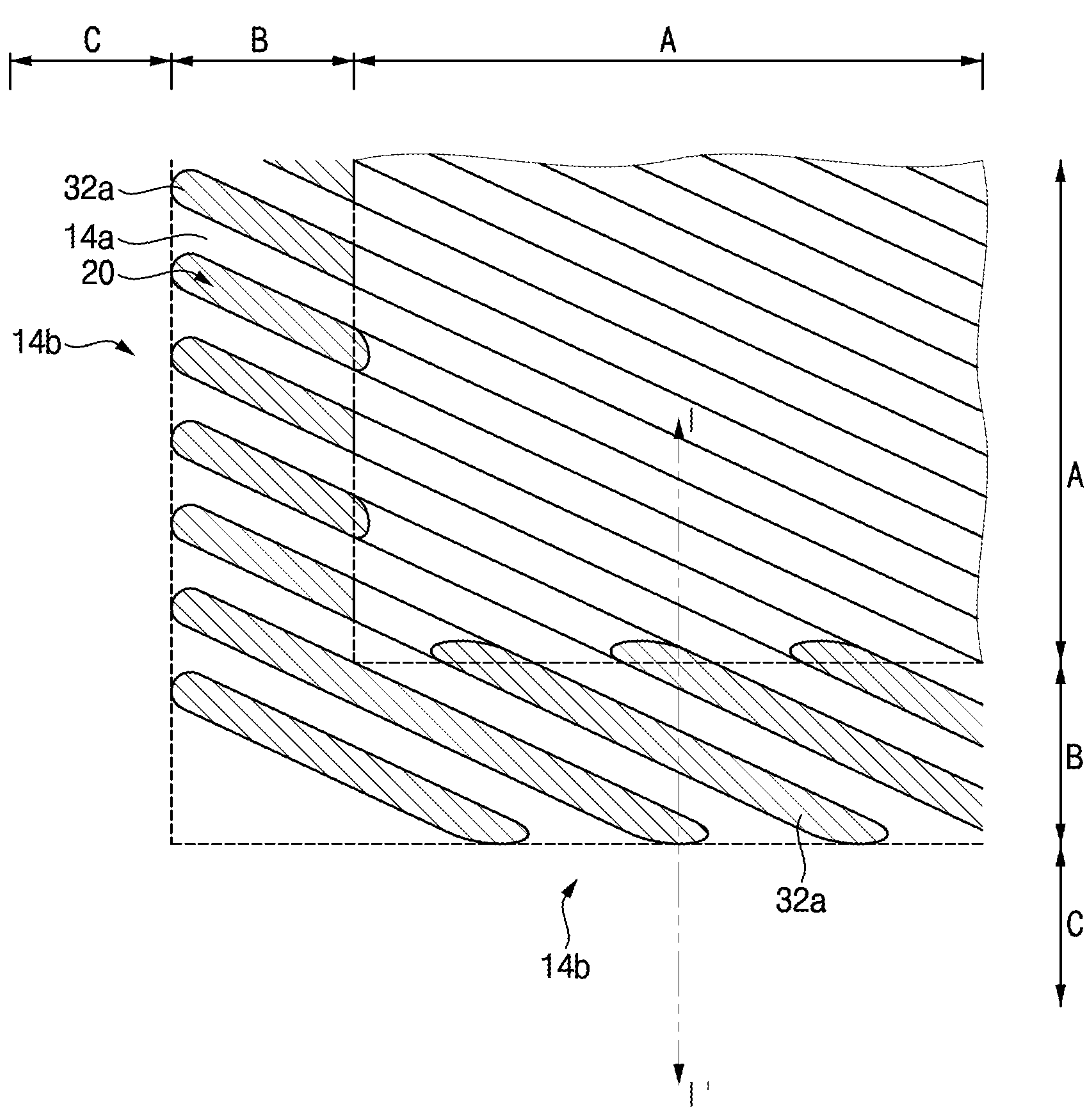

Referring to FIGS. 9 and 10, the third photoresist pattern 30 may be removed. Accordingly, the first mask patterns 14*a* may be exposed on the etch target layer 12 in the first region A, while the combined first mask patterns 14*a* and the first filling pattern 32*a* with the second mask pattern 14*b* may remain as the bulk mask pattern on the etch target layer 12 in the second region B and the third region C. As such, the etch target layer 12 on the second and third regions B and C may be entirely covered by the first and second mask patterns 14*a* and 14*b* and the first filling pattern 32*a*.

Figure 11:
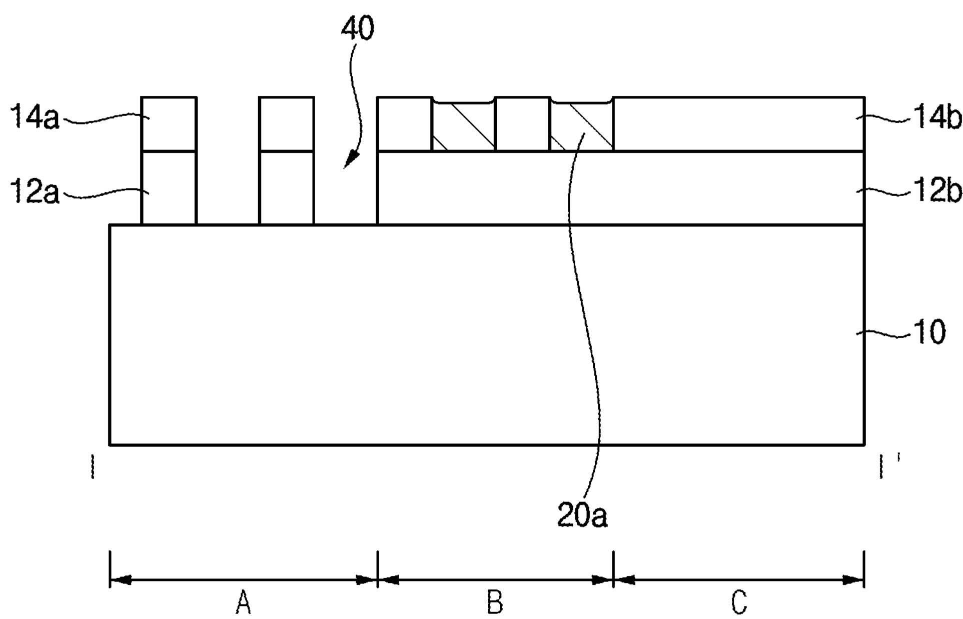

Referring to FIG. 11, the etch target layer 12 may be etched using the first mask pattern 14*a*, the first filling pattern 32*a* and the second mask pattern 14*b* as etching masks. Accordingly, first patterns 12*a* may be formed on the first region A, and the bulk pattern 12*b* may be formed on the second and third regions B and C.

A third opening 40 may be formed between the first patterns 12*a*. The bulk pattern 12*b* may cover the entire second and third regions B and C of the substrate 100. The bulk pattern 12*b* may not include openings.

Figure 12A:
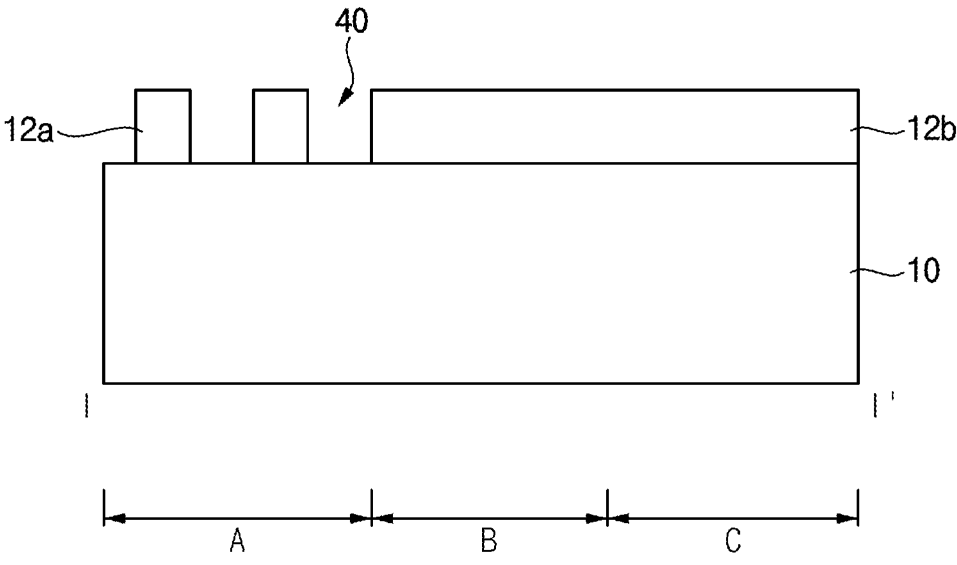
Figure 12B:
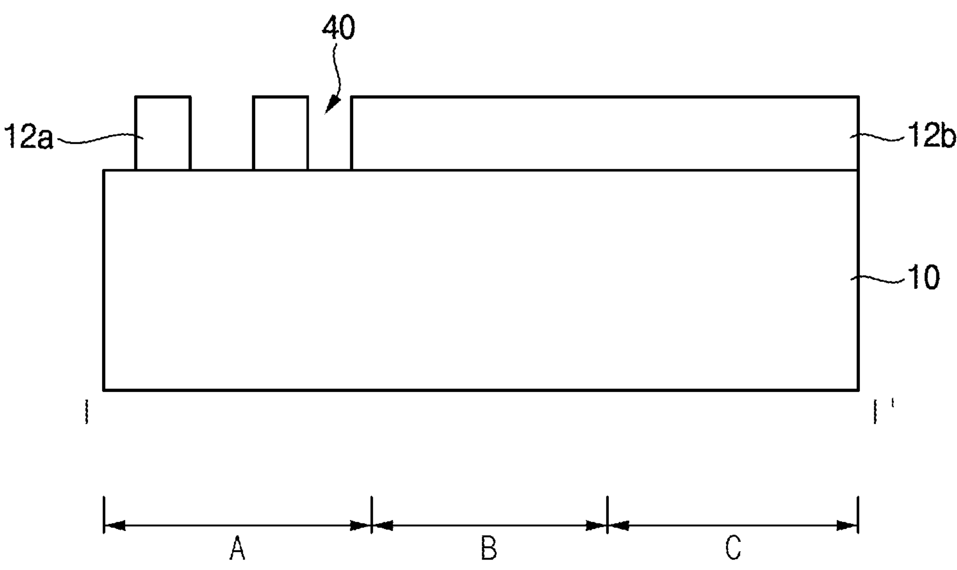
Figure 13:
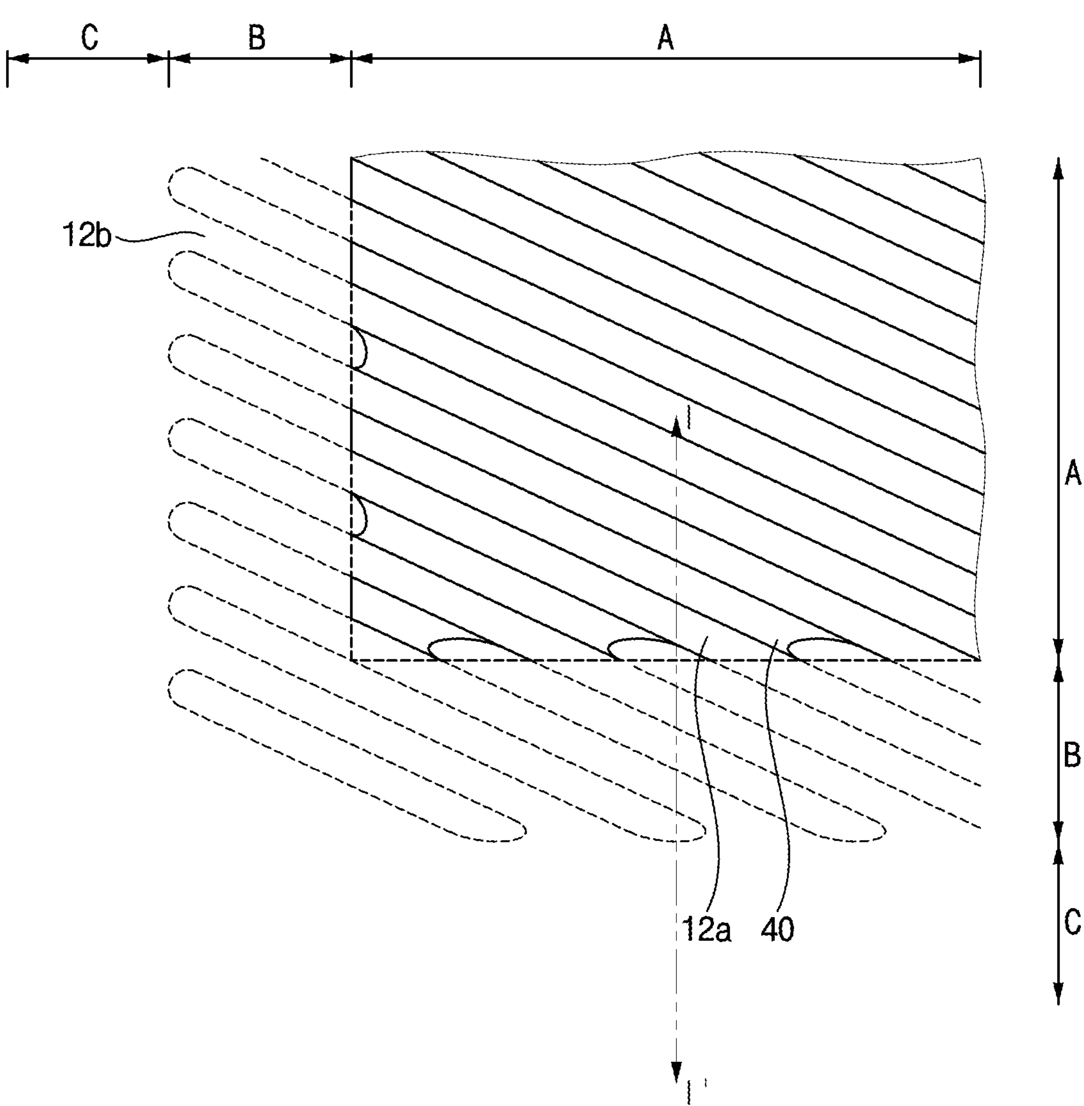

Referring to FIGS. 12A, 12B and 13, the first mask pattern 14*a*, the first filling pattern 32*a*, and the second mask pattern 14*b* on the first pattern 12*a* and the bulk pattern 12*b* may be removed.

Accordingly, the first patterns 12*a* may be formed on the first region A. In example embodiments, the substrate 10 may be exposed by a bottom of the third openings 40 between the first patterns 12*a*. As the third openings 40 are formed by transferring of the third photoresist pattern 30, ends of the third openings 40 may not be aligned along a straight line. The ends of the third openings 40 may be irregularly arranged. In example embodiments, the ends of some of the third openings 40 may be positioned at the inner portion of an edge of the first region A.

By performing the above processes, defects of the first patterns 12*a* positioned on the edge of the first region A due to the exposure process may not occur. The bulk pattern 12*b* may be formed on the second region B. Even if the first mask patterns 14*a* are formed on the first and second regions A and B, the bulk pattern 12*b* may be formed on the second and third regions B and C. Therefore, the bulk region for forming the bulk pattern 12*b* may not be decreased. An area of the bulk region for forming devices (e.g., peripheral circuits) may be sufficiently secured.

The processes for forming the first mask patterns on the first and second regions and forming the filling pattern filling the opening between the first mask patterns on the second region may include a double patterning tech (DPT) process or a quadruple patterning tech (QPT) process.

FIGS. 14 to 40 are cross-sectional views and plan views of stages in a method of manufacturing a semiconductor device according to example embodiments.

FIGS. 14, 15, 17, 18, 19, 21, 22, 24, 26, 27, 29, 30, 31, 33, 34, 35, 37 to 40 are cross-sectional views. FIGS. 16, 20, 23, 25, 28, 32 and 36 are plan views. Each of the cross-sectional views is a view taken along line II-II' of the plan view.

Figure 14:
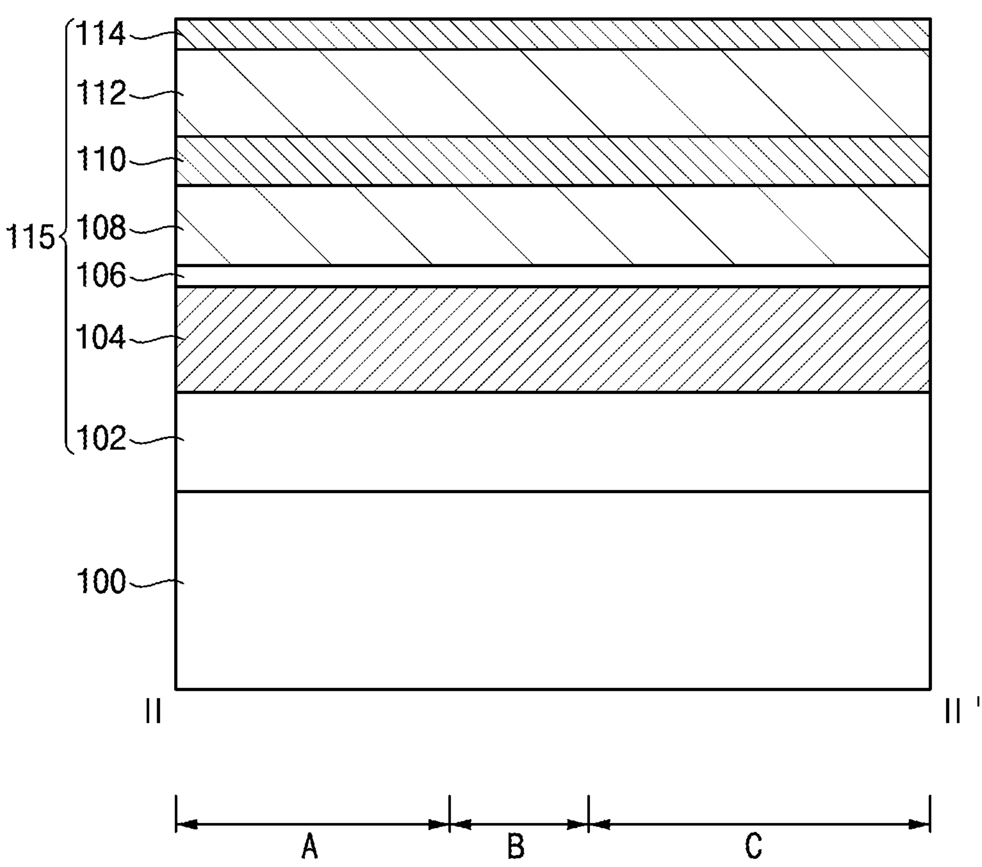
FIGS. 14 to 40 are cross-sectional views and plan views of stages in a method of manufacturing a semiconductor device according to example embodiments.

Referring to FIG. 14, a mask layer structure 115, in which layers serving as etching mask layers are sequentially stacked, may be formed on the substrate 100.

The substrate 100 may include the first region A, the second region B, and the third region C. The first region A may be a region in which memory cells may be formed. The second region B may surround an edge of the first region A, and may be adjacent to the first region A. The third region C may be outside the second region B. The second region B may be disposed between the first and third regions A and C. The memory cells may not be formed on the second and third regions B and C. The second and third regions B and C may be a bulk region in which no memory cell may be formed. In the second region B, exposure patterns for forming the memory cells may be temporarily formed by an exposure process, and then the exposure pattern may be replaced with a bulk pattern. The second and third regions B and C may be regions in which circuits (e.g., peripheral circuits) for driving the memory cells may be formed. Therefore, a peripheral circuit pattern for the peripheral circuits may be formed on the second and third regions B and C by processes after forming the bulk pattern.

The mask layer structure 115 may include at least one of mask layers 102 and 104, and a buffer layer 106, a first mandrel layer 108, and a second mandrel layer 112. For example, the mask layer structure 115 may include the first mask layer 102, the second mask layer 104, the buffer layer 106, the first mandrel layer 108, the first separation layer 110, the second mandrel layer 112, and the second separation layer 114 sequentially stacked.

The first mask layer 102 may be a mask layer for finally etching the substrate 100. The first mask layer 102 may include a material having an etching selectivity with respect to the substrate 100. The first mask layer 102 may include, e.g., a silicon oxide layer. The second mask layer 104 may be a mask layer for patterning the first mask layer 102. Accordingly, the second mask layer 104 may include a material having an etching selectivity with respect to the first mask layer 102. The second mask layer 104 may include, e.g., polysilicon.

The buffer layer 106 may include silicon oxide. In example embodiments, the buffer layer 106 may be formed by an atomic layer deposition process.

The first mandrel layer 108 may be a sacrificial layer for forming a second spacer used as an etching mask in subsequent processes. Thus, the first mandrel layer 108 may include a material that may be easily removed by a subsequent etching process. In example embodiments, the first mandrel layer 108 may include amorphous carbon.

The first separation layer 110 may include silicon oxynitride (SiON). The first separation layer 110 may include a material having an etch selectivity with respect to the first mandrel layer 108.

The second mandrel layer 112 may include a spin on hardmask (SOH) material. The spin-on hardmask material may include amorphous carbon.

The first separation layer 110 may be interposed between the first and second mandrel layers 108 and 112, so that the first and second mandrel layers 108 and 112 may be distinguished, e.g., separated, from each other.

The second separation layer 114 may include silicon oxynitride. The second separation layer 114 may be formed to distinguish, e.g., separate, the second mandrel layer 112 and a photoresist layer subsequently formed. Thus, the second separation layer 114 may be interposed between the second mandrel layer 112 and the photoresist layer. The first and second separation layers 110 and 114 may also serve as anti-reflection layers.

Figure 15:
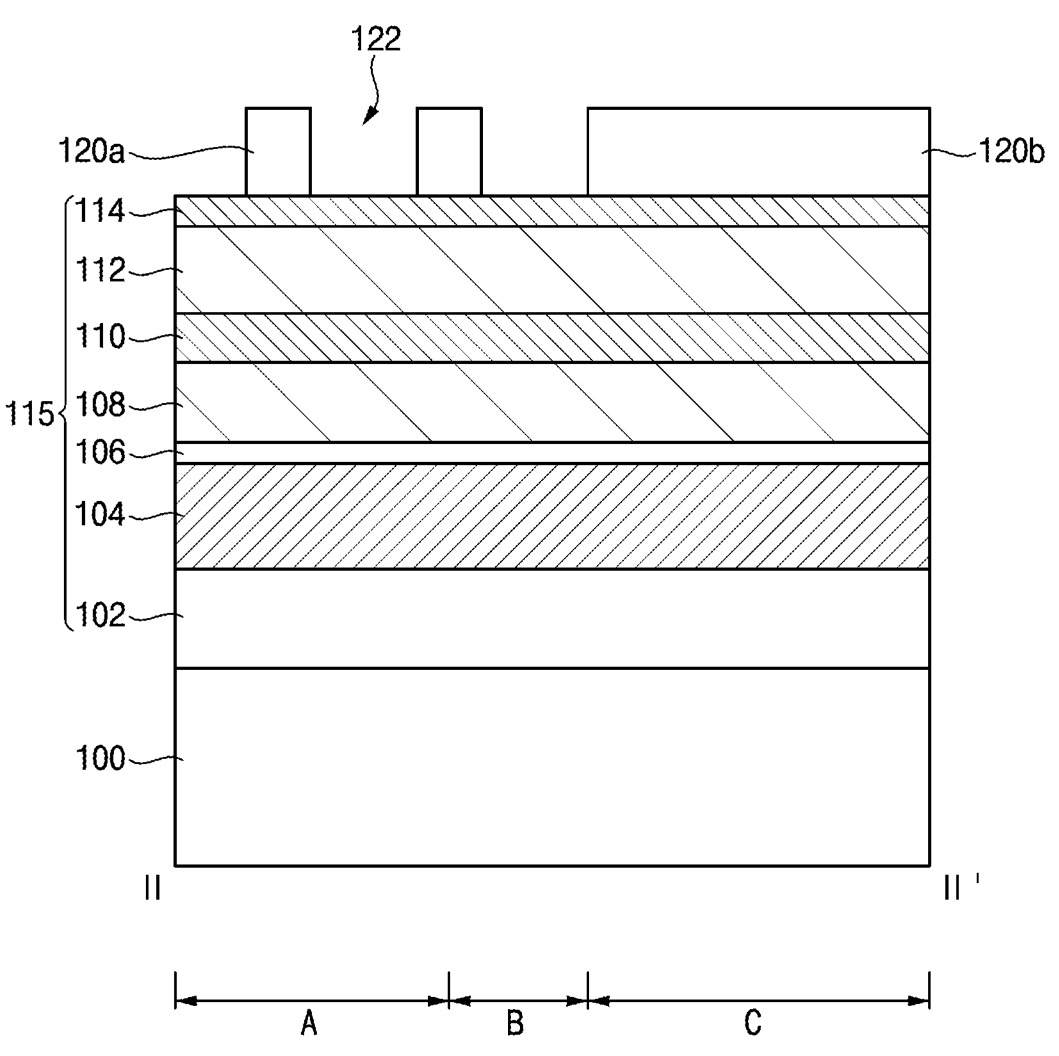
Figure 16:
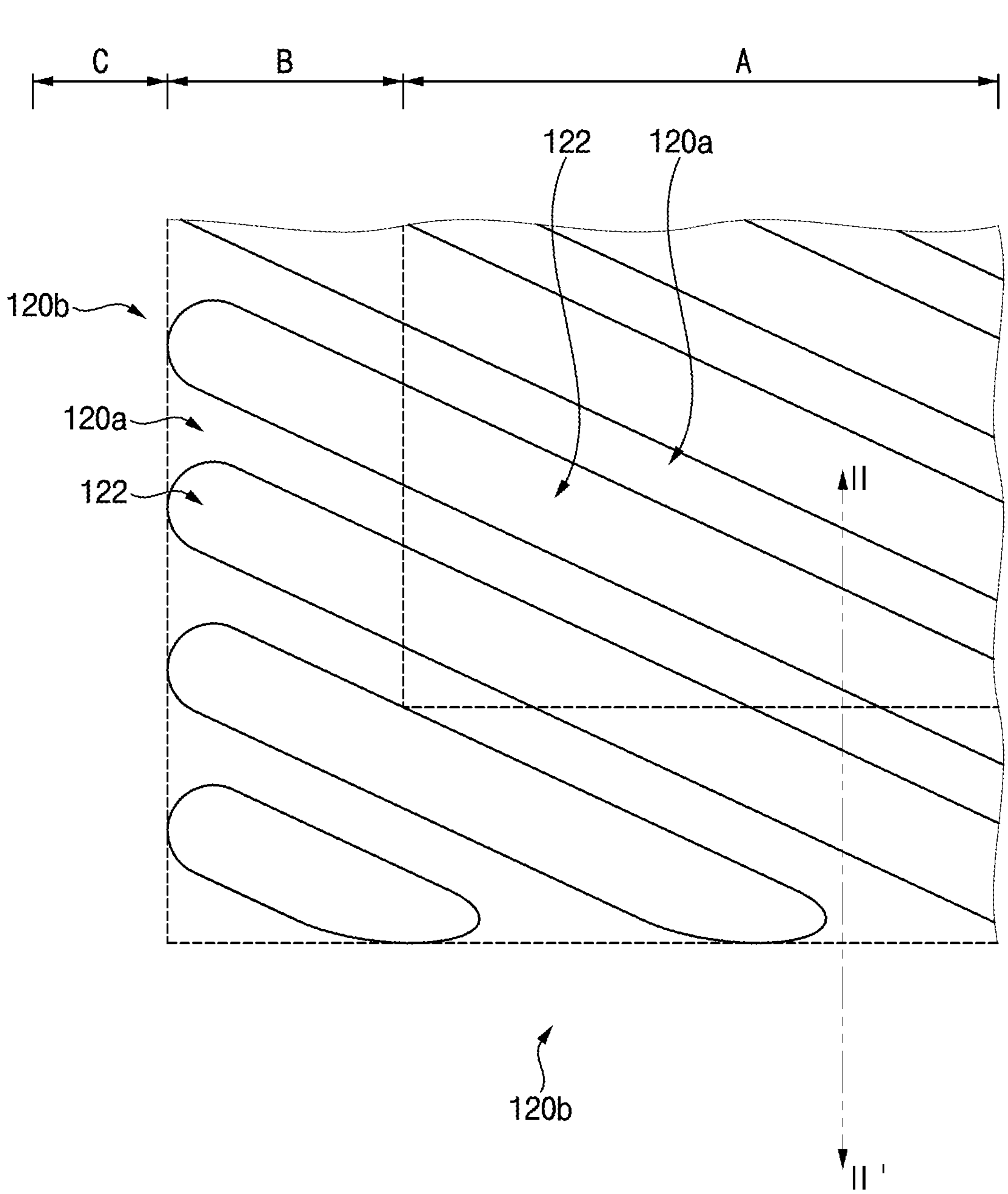

Referring to FIGS. 15 and 16, the photoresist layer may be coated on the mask layer structure 115. Exposure and development processes may be performed on the photoresist layer to form a first photoresist pattern 120*a* on the first mask layer structure of the first region A and the second region B, and a second photoresist pattern 120*b* on the mask layer structure 115 of the third region C.

A first opening 122 having a line shape may be formed between the first photoresist patterns 120*a*. The first photoresist patterns 120*a* may include lines and spaces alternately and repeatedly arranged.

In example embodiments, the first photoresist patterns 120*a* may serve as first exposure patterns for forming patterns (e.g., etching mask pattern) on the first region A of the substrate 100. The second region B may be designed to form the bulk pattern on the substrate 100, but the first photoresist pattern 120*a* may be further formed on the second region B by the exposure process.

In example embodiments, the first opening 122 between the first photoresist patterns 120*a* may extend in the third direction. A plurality of first openings 122 may be repeatedly arranged to be spaced apart from each other. Ends of the first openings 122 in the third direction may extend to an edge of the second region B adjacent to the third region C.

The second photoresist pattern 120*b* may cover the entirety of the mask layer structure 115 on the third region C. That is, the second photoresist pattern 120*b* may have a plate shape without a separate pattern. The second photoresist pattern 120*b* may not include openings.

In the exposure process for forming the first and second photoresist patterns 120*a* and 120*b*, the photoresist layer on the first and second regions A and B may be exposed so as to form a desired pattern including the first openings 122.

However, the photoresist layer on the third region B may not be exposed by the exposure process.

In example embodiments, the first opening 122 may have a width of about five (5) times a first line width that is a target line width of a final pattern (e.g., a first active pattern serving as a cell active pattern) to be formed. The first photoresist pattern 120*a* may have a line width about three times the first line width.

The first photoresist pattern 120*a* may be an initial etching mask pattern for forming final patterns included in the memory cells on the first region A. As described above, the first photoresist pattern 120*a* may be formed not only in the first region A for forming the memory cells but also in the second region B designed as the bulk region adjacent the first region A.

In general, in the process for forming photoresist patterns, an edge region for forming the photoresist patterns (e.g., an edge region adjacent to the bulk region) may have a pattern arrangement density different form a pattern arrangement density of other regions for forming the photoresist patterns. Therefore, it may be difficult to form normal exposure patterns on the edge region by an exposure process due to the difference of the pattern arrangement density. In order to form the normal exposure patterns on an edge region of the first region A, the first photoresist patterns 120*a* may be formed not only the first region A (where actual exposure patterns are formed), but also on the second region B adjacent to the first region A and designed as the bulk region. Accordingly, the first photoresist patterns 120*a* on the entire first region A may have no difference in the pattern arrangement density (e.g., the first photoresist patterns 120*a* on the entire first region A may have a uniform pattern arrangement density), so that the first photoresist patterns 120*a* on at least the first region A may be formed as desired patterns, e.g., in terms of size and density. For example, the width of the first photoresist pattern 120*a* on at least the first region A and the width of the first opening 122 may have target values, respectively.

Figure 17:
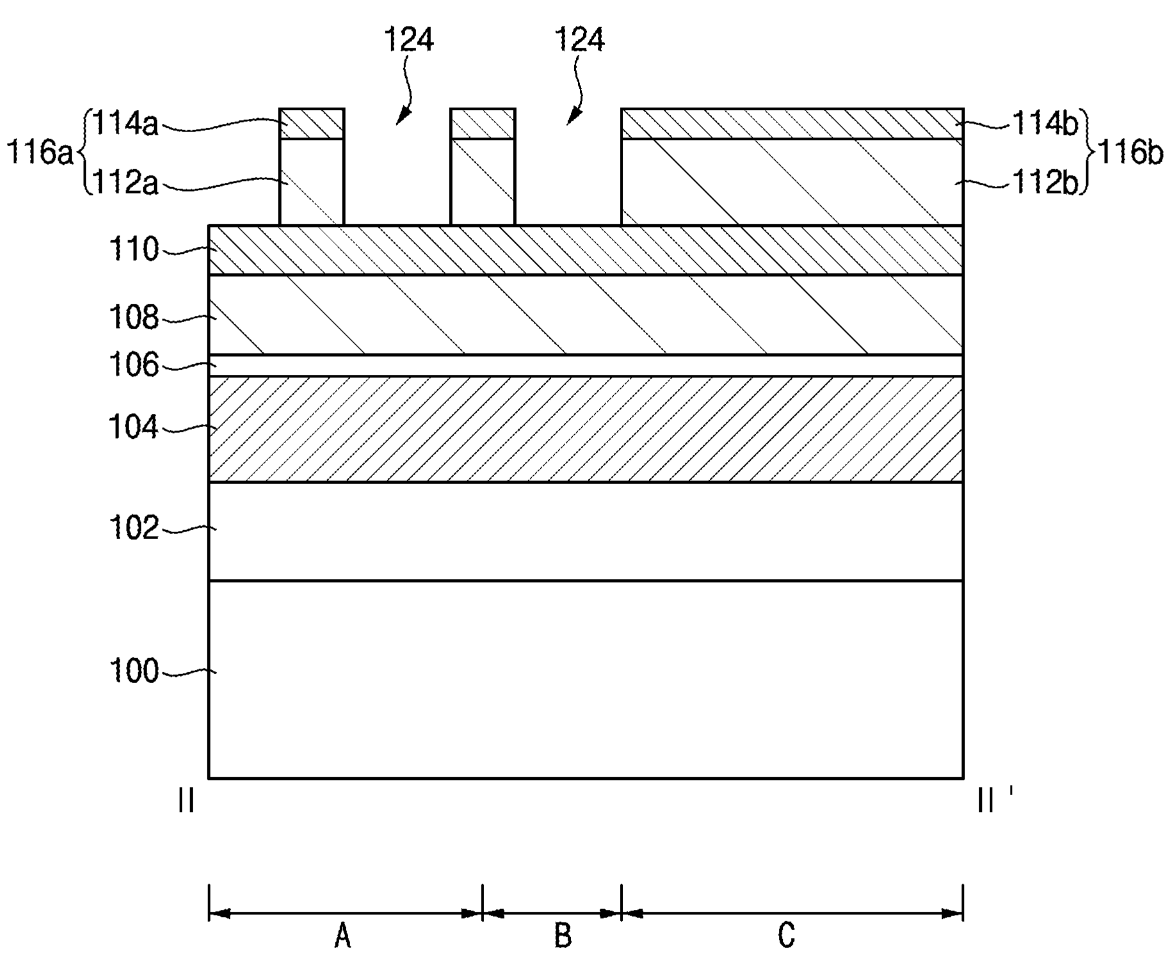

Referring to FIG. 17, the second separation layer 114 and the second mandrel layer 112 may be sequentially etched using the first and second photoresist patterns 120*a* and 120*b* as etching masks. Therefore, a first mandrel pattern 112*a* and a first separation layer pattern 114*a* may be formed on the first separation layer 110 in the first and second regions A and B, and a second mandrel pattern 112*b* and a second separation layer pattern 114*b* may be formed on the first separation layer 110 in the third region C.

A first stacked structure 116*a* in which the first mandrel pattern 112*a* and the first separation layer pattern 114*a* are stacked may be formed by transferring of the first photoresist pattern 120*a*. Thus, in the plan view, the first stacked structure 116*a* may have a same shape as the shape of the first photoresist pattern 120*a*. Accordingly, a second opening 124 may be formed between the first stacked structures 116*a*. The first separation layer 110 may be exposed by the bottom of the second opening 124. The second opening 124 may overlap the first opening 122.

A second stacked structure 116*b* in which the second mandrel pattern 112*b* and the second separation layer pattern 114*b* are stacked may be formed by transferring the second photoresist pattern 120*b*. Thus, in the plan view, the second stacked structure 116*b* may have a same shape as the second photoresist pattern 120*b*. Accordingly, the second stacked structure 116*b* may completely cover the first separation layer 110 on the third region C, and the second stacked structure 116*b* may not include openings.

Thereafter, the first and second photoresist patterns 120*a* and 120*b* may be removed.

Figure 18:
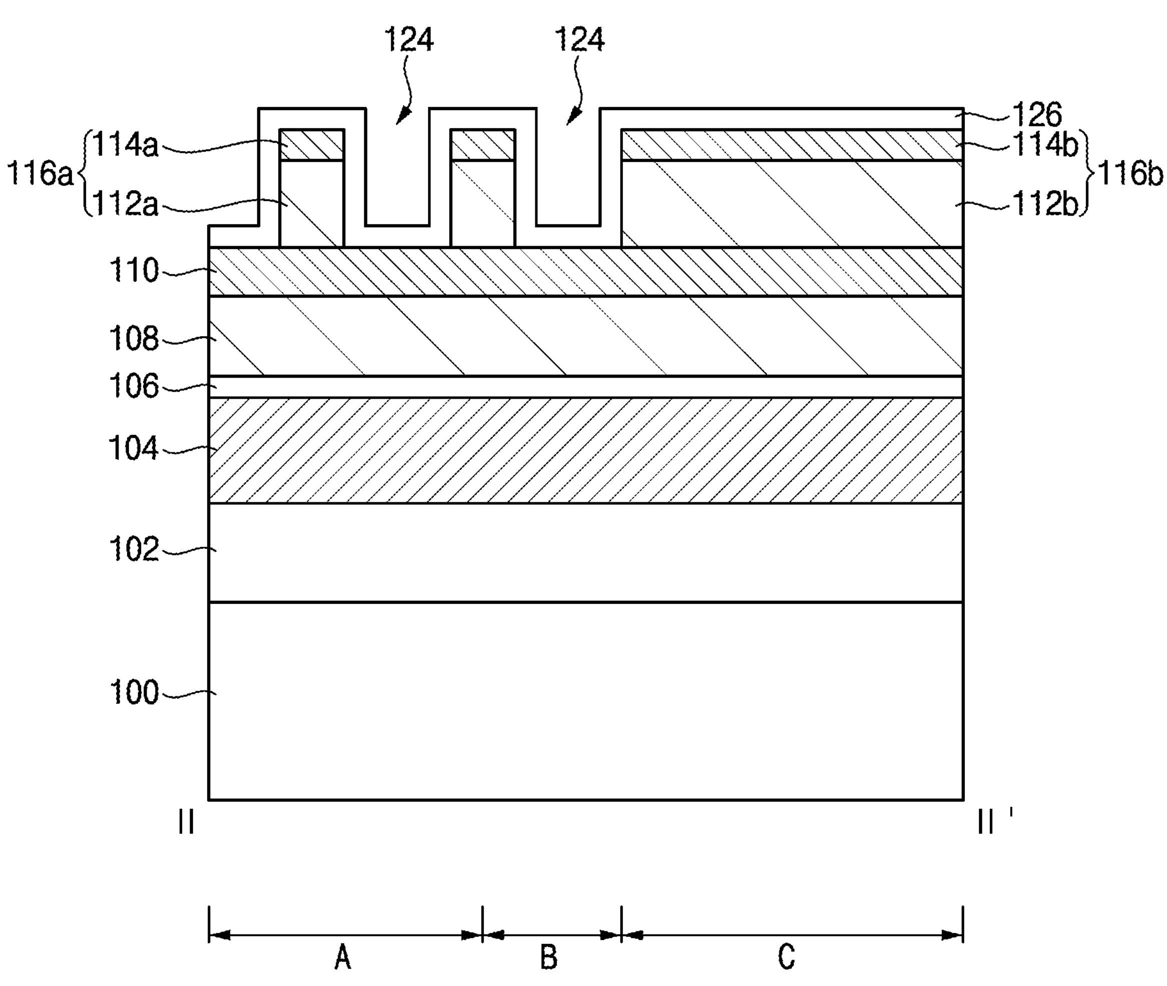

Referring to FIG. 18, a first spacer layer 126 may be formed along surface profiles of the first stacked structure 116*a*, the second stacked structure 116*b*, and the first separation layer 110. The first spacer layer 126 may be conformally formed on the first stacked structure 116*a*, the second stacked structure 116*b*, and the first separation layer 110. After forming the first spacer layer 126, an inner space of the second opening 124 on the first and second regions A and B may remain.

The first spacer layer 126 may serve as an etching mask for etching the first separation layer 110 and the first mandrel layer 108 formed thereunder. In example embodiments, the first spacer layer 126 may include silicon oxide.

In example embodiments, the first spacer layer 126 may be deposited to have a deposition thickness substantially equal to the first line width. In order to form the first spacer layer 126 having a thin thickness, the first spacer layer 126 may be formed by an atomic layer deposition process.

Figure 19:
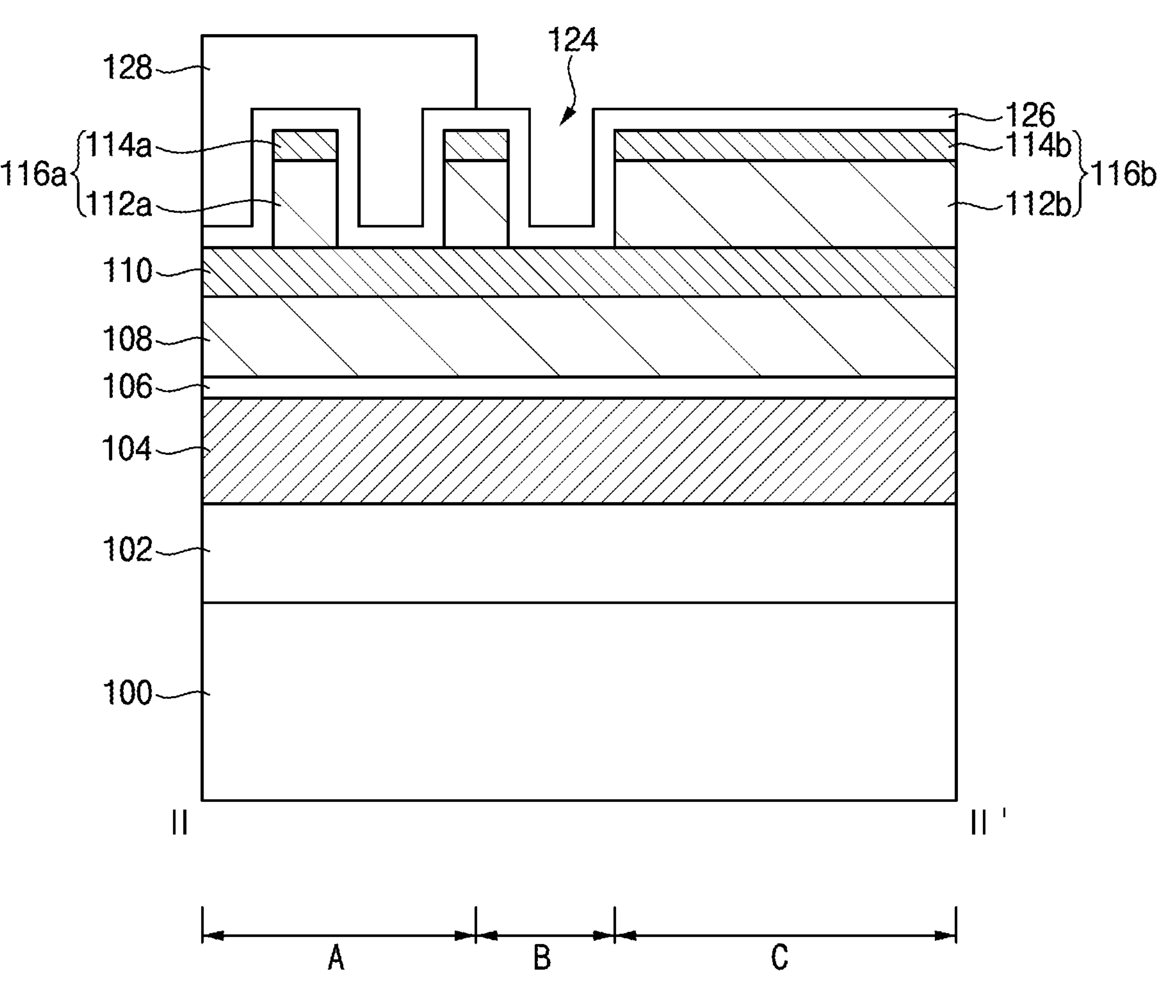
Figure 20:
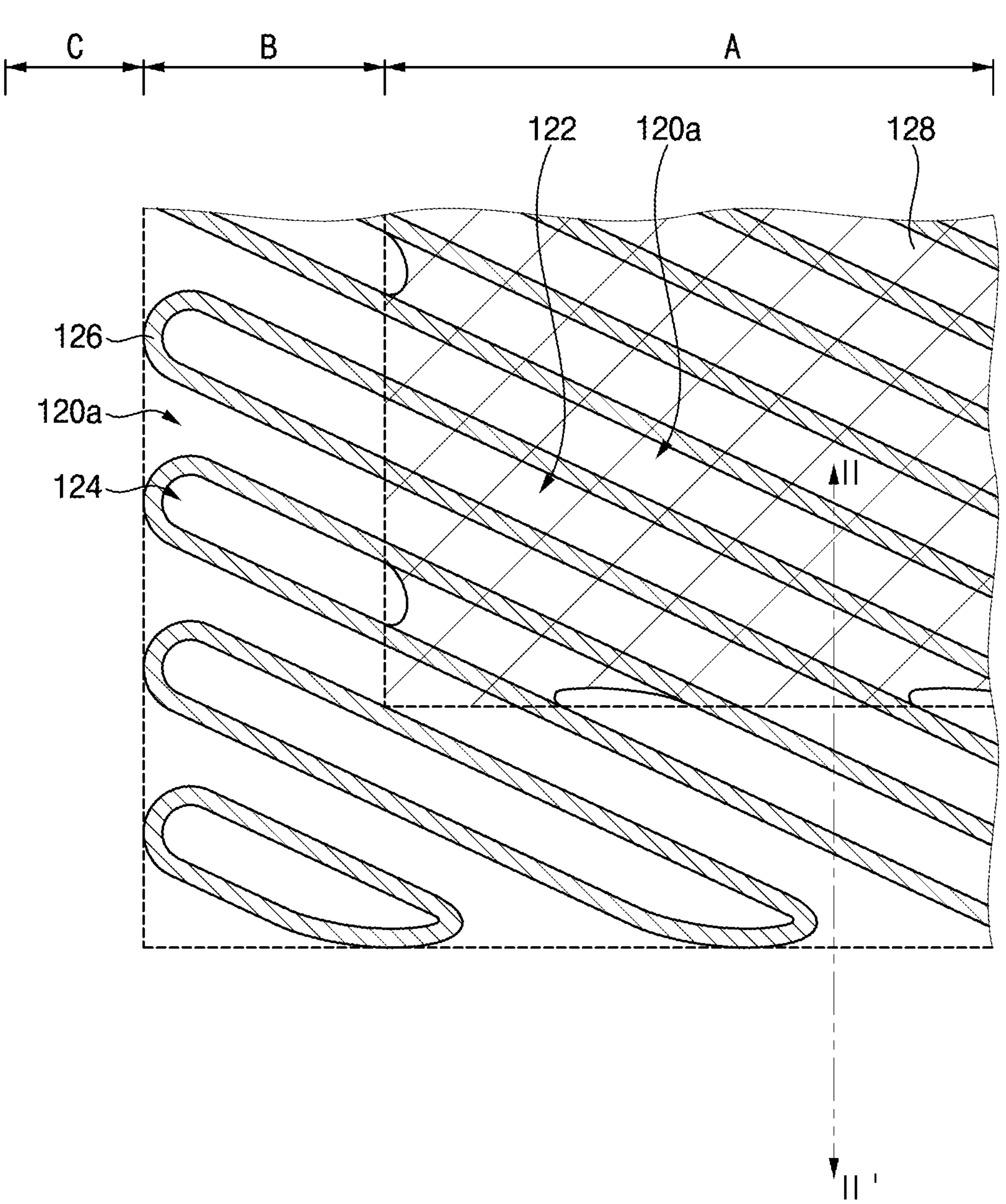

Referring to FIGS. 19 and 20, a third photoresist layer may be formed on the first spacer layer 126 to fill the second openings 124. An exposure process may be performed on the third photoresist layer to form a third photoresist pattern 128 covering an entirety of the first spacer layer 126 on the first region A (e.g., only in the first region A).

In example embodiments, the exposure process for forming the third photoresist layer may be performed using, e.g., an argon fluoride laser, an immersion argon fluoride laser, or a krypton fluoride laser as a light source.

The third photoresist pattern 128 may not be formed on the first spacer layer 126 on the second and third regions B and C. Thus, the first spacer layer 126 on the second and third regions B and C may be exposed by the third photoresist pattern 128.

An upper surface of the third photoresist pattern 128 may be substantially flat. In example embodiments, the third photoresist pattern 128 may be formed to have a thickness of about 50 angstroms to about 2000 angstroms from an upper surface of the first spacer layer 126 on the first stacked structure 116*a*.

In some example embodiments, since the third photoresist pattern 128 covers the entirety of the first spacer layer 126 on the first region A, the third photoresist pattern 128 may be formed to additionally cover a portion of the edge of the second region B to increase process margin.

Figure 23:
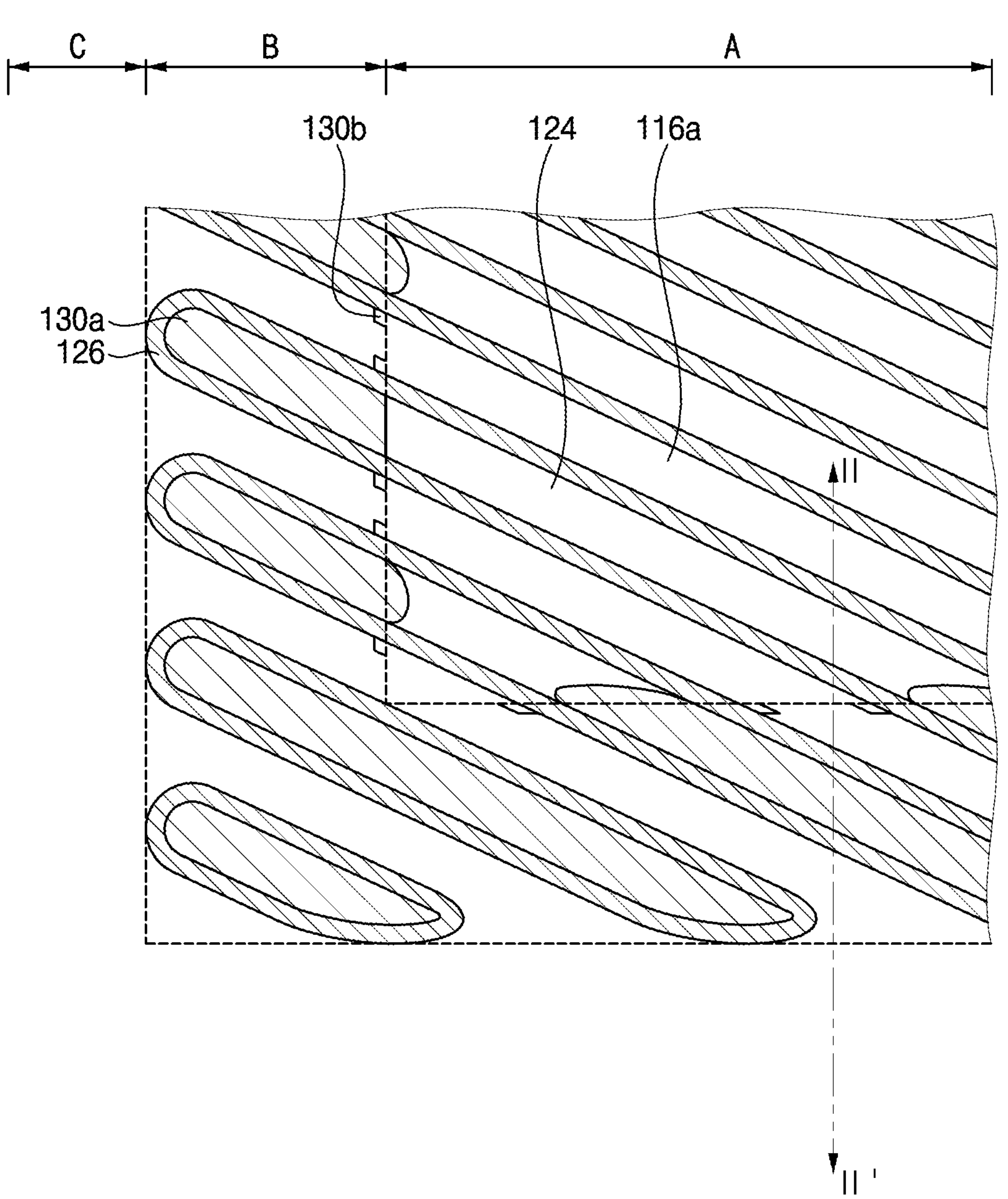

When the third photoresist layer is formed, voids may be included in the third photoresist layer filling the second opening 124 and the third photoresist layer on the first stacked structure 116*a*. When the third photoresist layer is patterned, a boundary of a removing region (e.g., a boundary between the first and second regions) of the third photoresist layer may be irregularly formed due to the void therein. Accordingly, an edge of the third photoresist pattern 128 may not be aligned along a straight line, and may be irregularly arranged. For example, a portion of the edge of the third photoresist pattern 128 may be positioned at an inner portion of the first region A, as indicated by a dotted line in FIG. 21. In FIGS. 20 and 23, the first spacer layer 126 may be shown only on a sidewall of the second opening 124, in order to avoid the complexity of the drawing.

Figure 21:
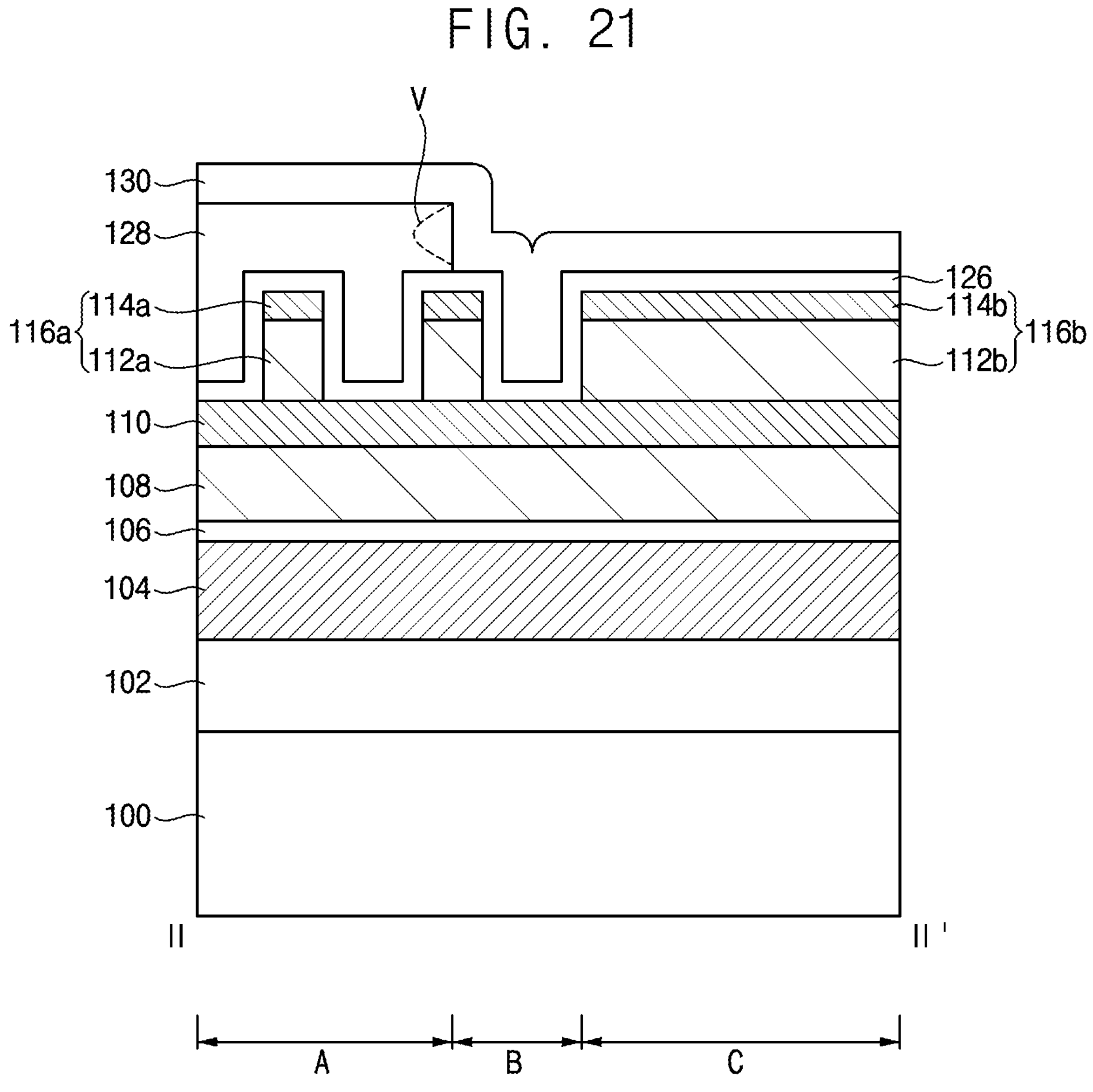

Referring to FIG. 21, a filling layer 130 may be formed on the third photoresist pattern 128 and the first spacer layer 126. The filling layer 130 may be formed to fill at least a remaining inner space of the second opening 124 on the second region B. Accordingly, a thickness of the filling layer 130 in the second opening 124 may be greater than a thickness of the filling layer 130 on other regions (e.g., on the third photoresist pattern 128 and the first and second stacked structures 116*a* and 116*b*).

The filling layer 130 may be conformally formed on surfaces of the third photoresist pattern 128 and the first spacer layer 126. In example embodiments, the filling layer 130 may be formed by an atomic layer deposition process. In example embodiments, the filling layer 130 may include silicon oxide.

When a thickness of the third photoresist pattern 128 from the upper surface of the first spacer layer 126 on the first stacked structure 116*a* is less than 50 angstroms, the second opening 124 may not be completely filled with the third photoresist pattern 128. Thus, the filling layer 130 may remain on the first region A, during subsequent processes. When the thickness of the third photoresist pattern 128 from the upper surface of the first spacer layer 126 on the first stacked structure 116*a* is greater than 2000 angstroms, a height of the filling layer 130 on a sidewall of the third photoresist pattern 128 may be increased. Thus, the filling layer 130 may remain without being removed, and a parasitic pattern may be formed in a subsequent process.

When the void V is formed at the edge of the third photoresist pattern 128, the boundary of the third photoresist pattern 128 may be irregularly formed. Therefore, a portion of the filling layer 130 contacting the boundary of the third photoresist pattern 128 may also be irregularly formed.

Figure 22:
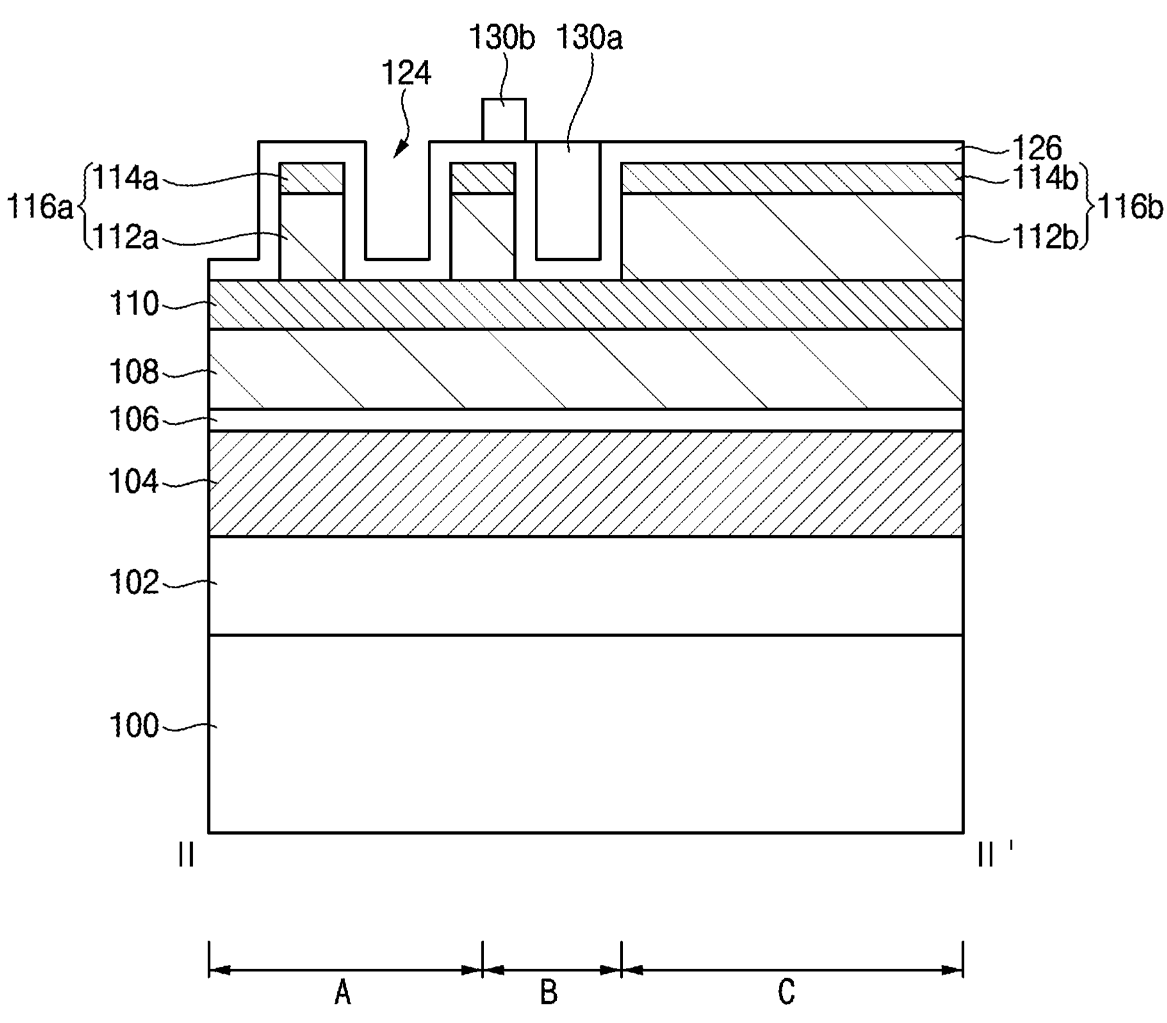

Referring to FIGS. 22 and 23, the filling layer 130 may be etched to expose an upper surface of the third photoresist pattern 128. The etching process may include anisotropic etching, e.g., a dry etching process.

Since the thickness of the filling layer 130 in the second opening 124 on the second region B is greater than the thickness of the filling layer 130 on other regions, after etching the filling layer 130 to expose the third photoresist pattern 128, the filling layer 130 in the second opening 124 may remain to form a first filling pattern 130*a* filling the second opening 124. In addition, a second filling pattern 130*b* may be further formed on the first stacked structure 116*a* in the second region B contacting the boundary between the first and second regions A and B. The second filling pattern 130*b* may be a remaining filling layer having a relatively thick thickness on the sidewall of the edge of the third photoresist pattern 128.

Since the second filling pattern 130*b* is the parasitic pattern, preferably, the second filling pattern 130*b* may not be formed or may have a thin thickness. In order to decrease a thickness of the second filling pattern 130*b*, argon gas or oxygen gas may be included and a bias of about 50 V to about 1000 V may be applied, in the etching process of the filling layer 130. In this case, the second filling pattern 130*b* may be additionally removed by a three-dimensional effect.

By the above process, the second opening 124 on the second region B may be filled with the first filling pattern 130*a*, so that a pattern portion corresponding to the second opening 124 may be replaced with a bulk pattern on the second region B.

After that, the third photoresist pattern 128 may be removed. Accordingly, upper surfaces of the first spacer layer 126 and the first and second filling patterns 130*a* and 130*b* may be exposed on the second region B. The upper surface of the first spacer layer 126 may be exposed on the first region A and the third region C. The inner space of the second opening 124 may be re-formed on the first spacer layer 126 of the first region A.

Figure 24:
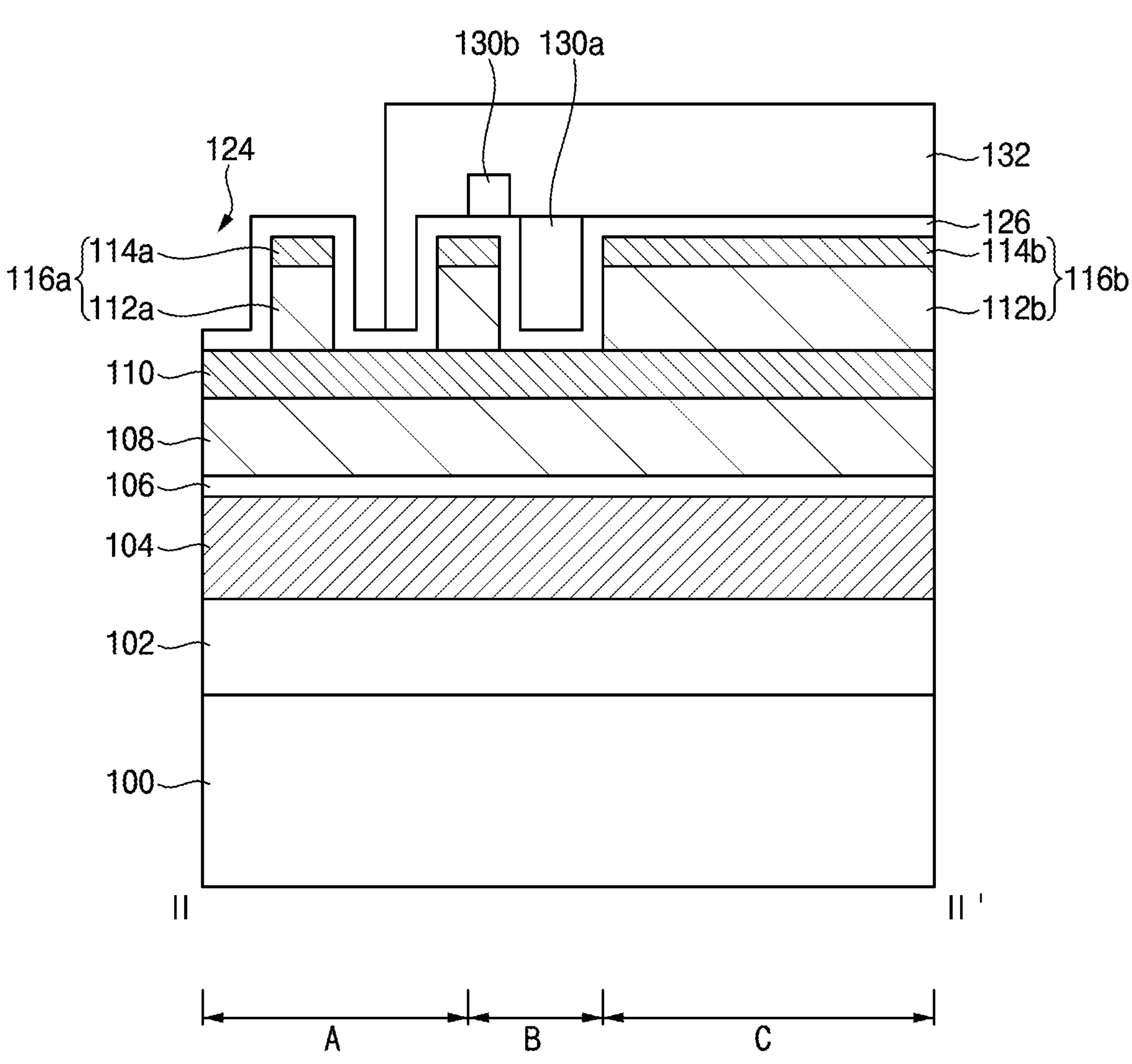
Figure 25:
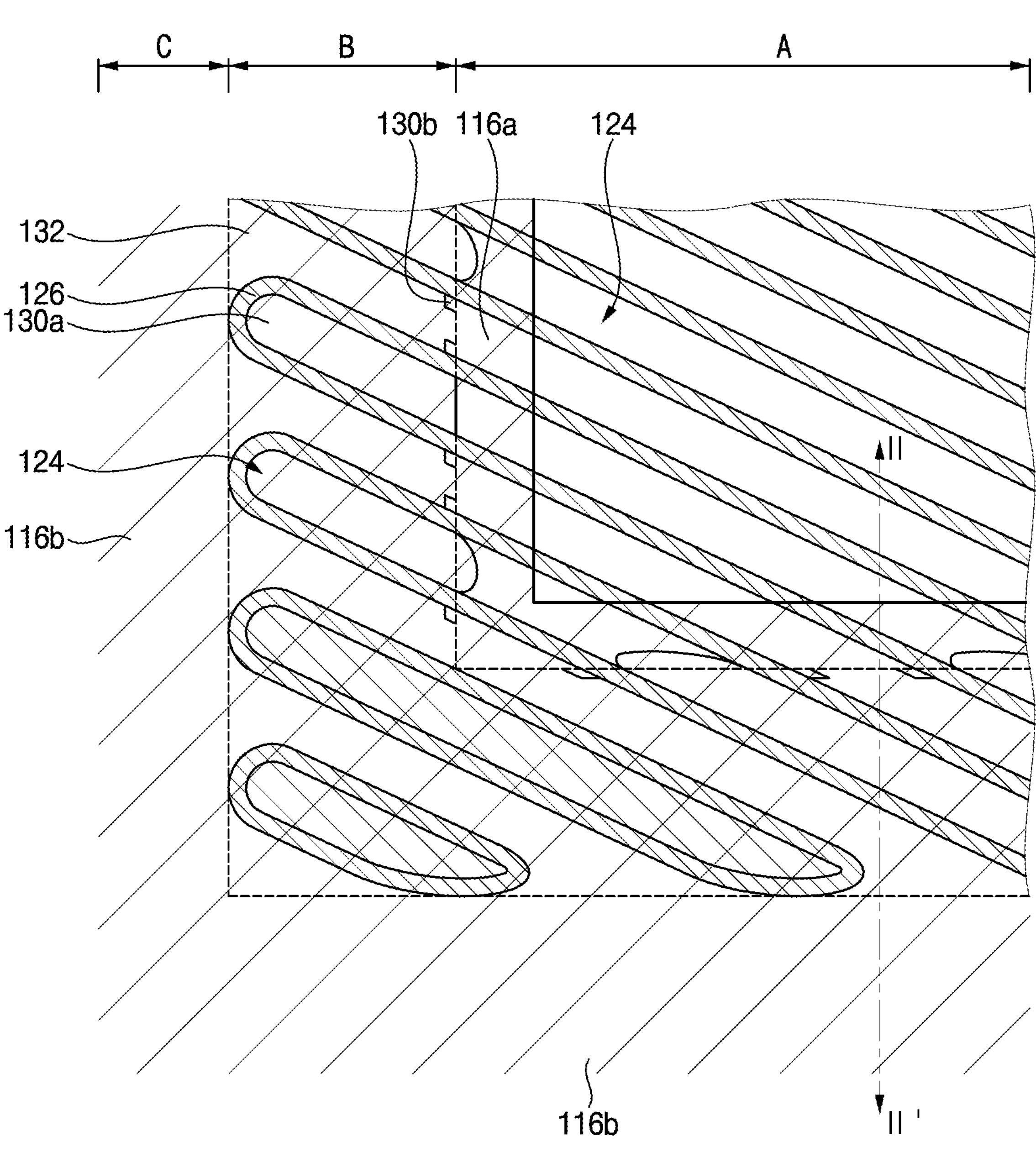

Referring to FIGS. 24 and 25, a fourth photoresist pattern 132 may be formed on the first spacer layer 126.

The fourth photoresist pattern 132 may cover the first spacer layer 126 and the first and second filling patterns 130*a* and 130*b* on the second and third regions B and C. The fourth photoresist pattern 132 may expose the entire first spacer layer 126 on the first region A.

In example embodiments, since the fourth photoresist pattern 132 covers the entire first spacer layer 126 and the first and second filling patterns 130*a* and 130*b* on the second and third regions B and C, the fourth photoresist pattern 132 may be formed to additionally cover a portion of the edge of the first region A to increase process margin.

Figure 26:
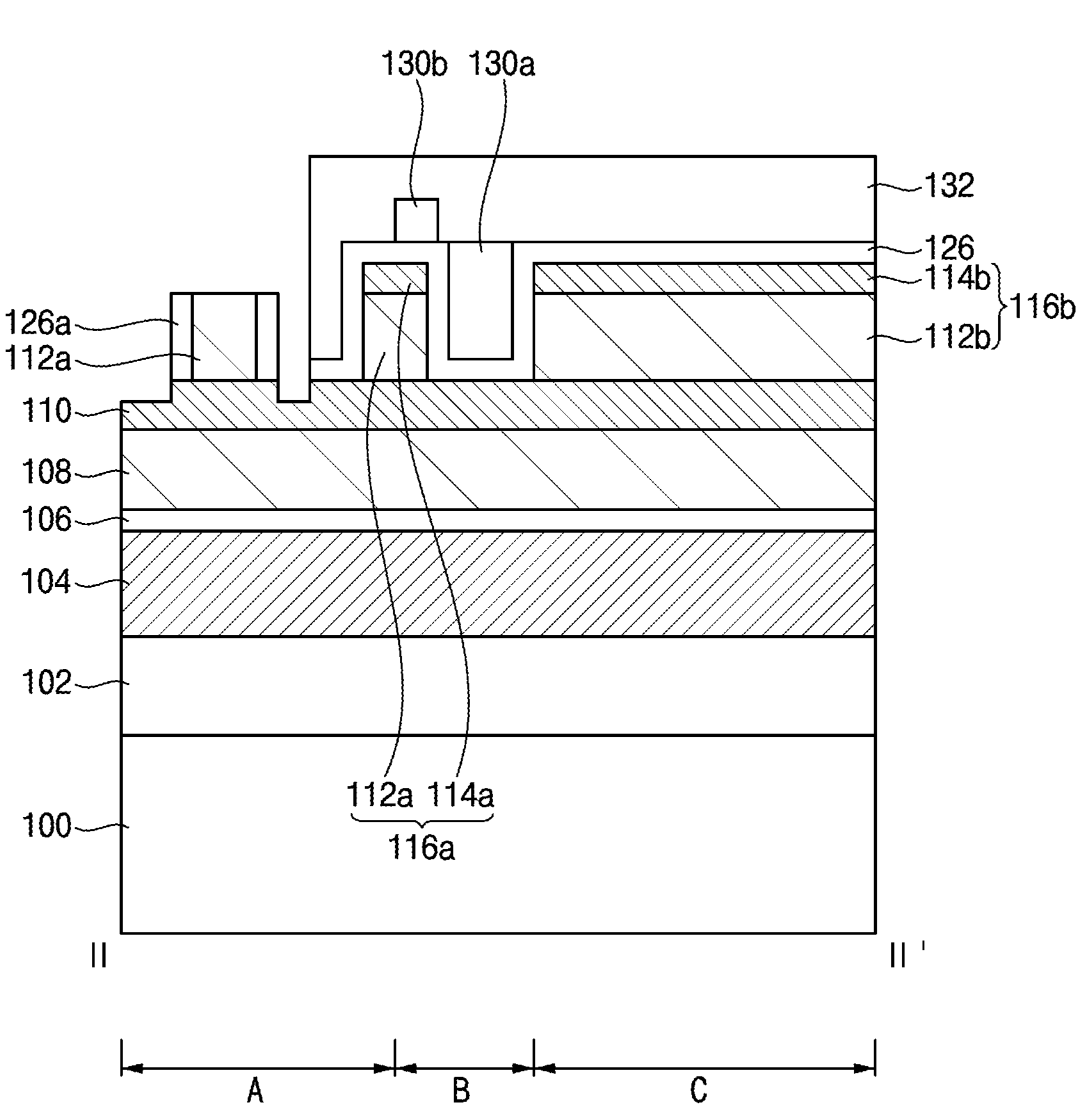

Referring to FIG. 26, the first spacer layer 126 on the first region A may be anisotropically etched using the fourth photoresist pattern 132 as an etching mask to form a first spacer 126*a* on the sidewall of the first stacked structure 116*a*.

The first separation layer pattern 114*a* on the first region A may be removed. Accordingly, an upper surface of the first mandrel pattern 112*a* may be exposed on the first region A. In the removing of the first separation layer pattern 114*a*, exposed first separation layer 110 on the first region A may be removed together by a partial thickness.

In this case, since the second and third regions B and C are covered by the fourth photoresist pattern 132, the first spacer layer 126, the first filling pattern 130*a*, and the second filling pattern 130*b* may remain without being removed, during the removing of the first separation layer pattern 114*a*.

Figure 27:
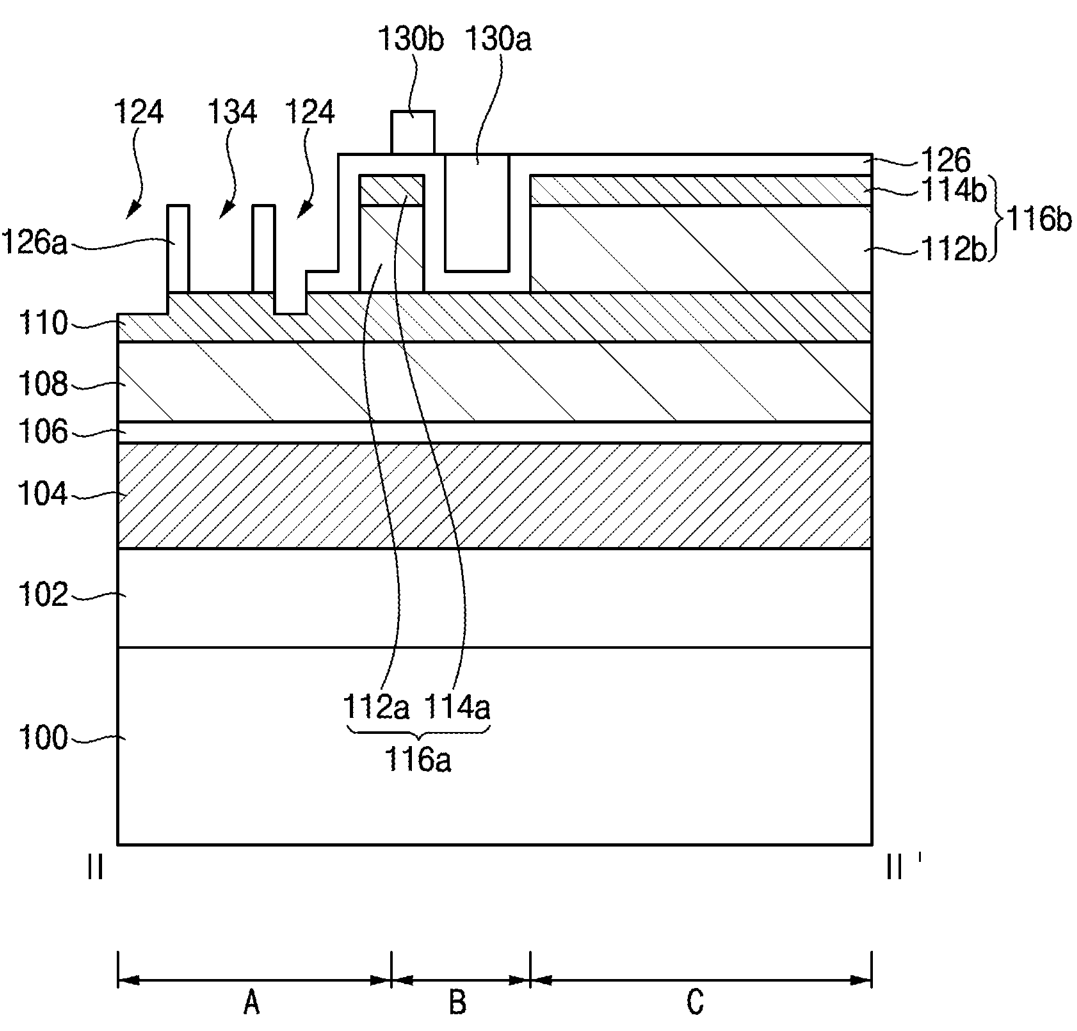
Figure 28:
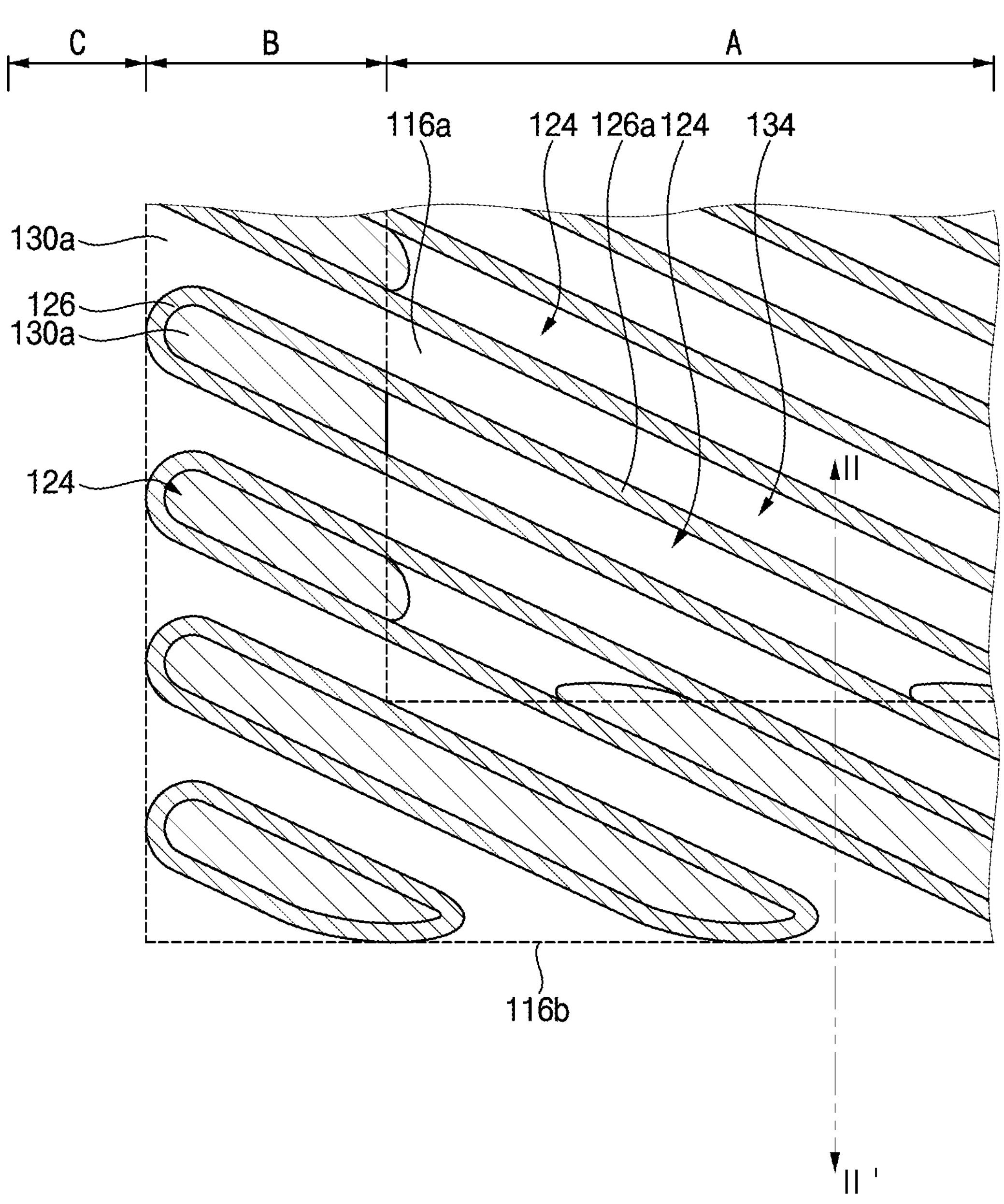

Referring to FIGS. 27 and 28, the first mandrel pattern 112*a* on the first region A may be removed. In the removing of the first mandrel pattern 112*a*, the fourth photoresist pattern 132 on the second and third regions B and C may be removed together. The removing of the first mandrel pattern 112*a* may include an ashing process.

A third opening 134 may be formed at a removed position of the first mandrel pattern 112*a*. Accordingly, the second opening 124 and the third opening 134 may be alternately and repeatedly disposed on the first region A.

The first spacers 126*a* may be spaced apart from each other on the first separation layer 110 of the first region A. In example embodiments, the first spacers 126*a* may be spaced apart to have a spacing of three times the first line width.

Since the first spacer layer 126 covers the first and second stacked structures 116*a* and 116*b* on the second and third regions B and C, the first and second layer stacked structures 116*a* and 116*b* on the second and third regions B and C may remain without being removed, during the removing of the first mandrel pattern 112*a*. Accordingly, the first and second stacked structures 116*a* and 116*b*, the first and second filling patterns 130*a* and 130*b*, and the first spacer layer 126 may cover the first separation layer 110 on the second and third regions B and C.

In some example embodiments, when an edge of the fourth photoresist pattern 132 is formed to cover a portion of the first region A, the first stacked structure 116*a* on the edge of the first region A covered by the fourth photoresist pattern 132 may remain without being removed in the removing of the first mandrel pattern 112*a*. That is, an end of the third opening 134 may be defined by the edge of the fourth photoresist pattern 132. Accordingly, in a plan view, the end of the second opening 124 may protrude toward the second region B more than the end of the third opening 134. For example, the second opening 124 may extend to the second region B adjacent to the first region A.

Figures 29, 30:
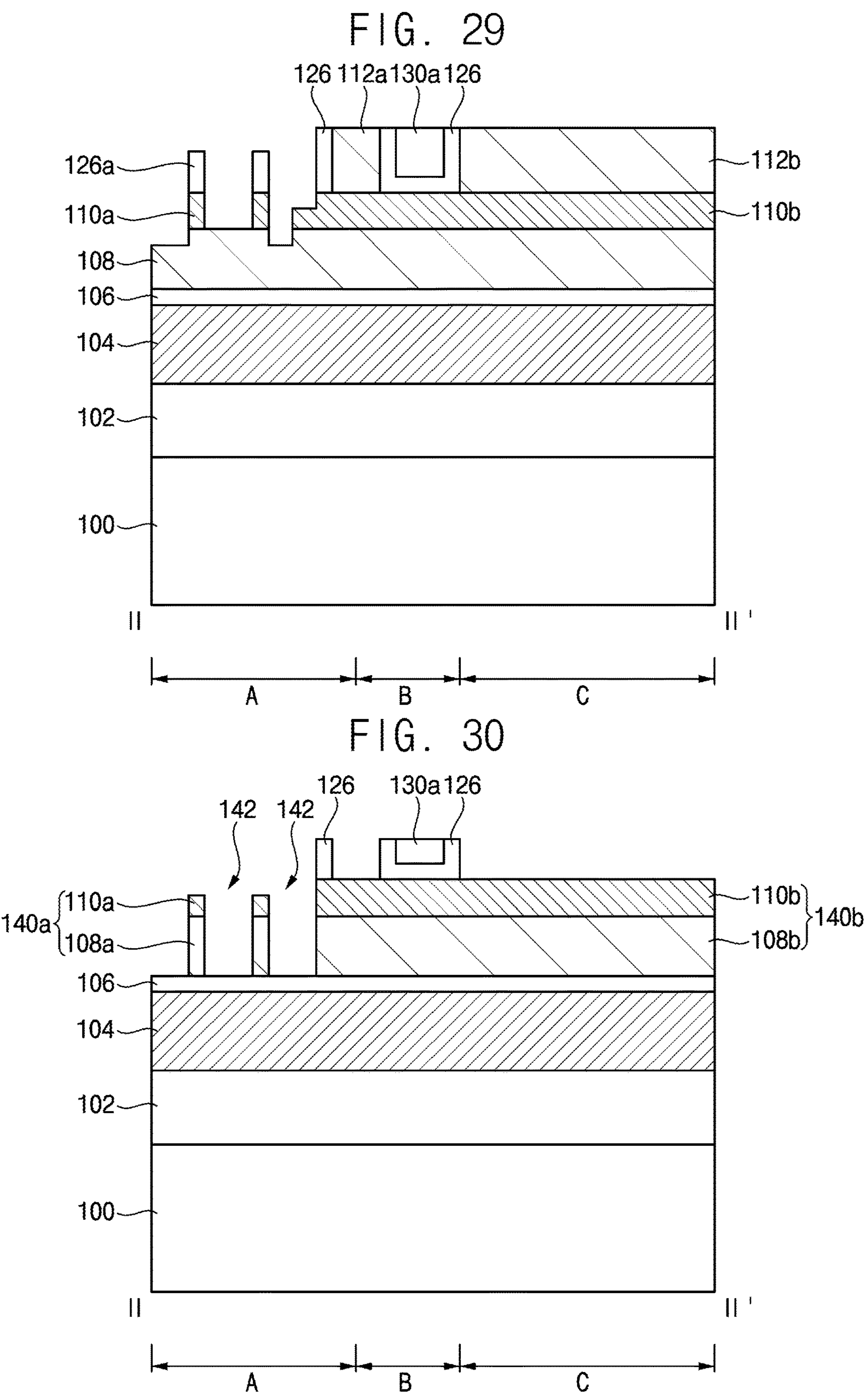

Referring to FIGS. 29 and 30, an exposed first separation layer 110 between the first spacers 126*a* may be anisotropically etched using the first spacers 126$a$ on the first region A, and the first stacked structure 116$a$, the second stacked structure 116$b$, the first spacer layer 126, and the first and second filling patterns 130$a$ and 130$b$ on the second and third areas B and C as etching masks. Subsequently, the first mandrel layer 108 may be anisotropically etched. In addition, the first and second stacked structures 116$a$ and 116$b$ on the second and third regions B and C may be removed.

Accordingly, a third stacked structure 140$a$ in which the third mandrel pattern 108$a$ and the third separation layer pattern 110$a$ are stacked may be formed on the buffer layer 106 of the first region A. A fourth opening 142 may be formed between the third stacked structures 140$a$. The buffer layer 106 may be exposed by a bottom of the fourth opening 142. The fourth opening 142 on the first region A may overlap the second and third openings 124 and 134. The third stacked structure 140$a$ may have a width the same as the first line width, and the fourth opening 142 may have a width of three times the first line width.

A fourth stacked structure 140$b$ in which a fourth mandrel pattern 108$b$ and a fourth separation layer pattern 110$b$ are stacked may be formed on the buffer layer 106 of the second and third regions B and C. The fourth stacked structure 140$b$ may not include an opening.

When the anisotropic etching process is performed, the first spacers 126$a$ having a narrow line width and densely arranged on the first region A may be quickly consumed due to a three-dimensional effect. Therefore, an upper portion of the third separation layer pattern 110$a$ in the third stacked structure 140$a$ on the first region A may be removed by a partial thickness. On the other hand, the fourth separation layer pattern 110$b$ in the fourth stacked structure on the second and third regions B and C may hardly be removed by etching loading. Therefore, the third separation layer pattern 110$a$ may have a thickness less than a thickness of the fourth separation layer pattern 110$b$. Accordingly, a height of the third stacked structure 140$a$ may be lower than a height of the fourth stacked structure 140$b$.

When the anisotropic etching process is performed, the first separation layer pattern 114$a$ and the second separation layer pattern 114$b$ on the second and third regions B and C may be removed. Accordingly, upper surfaces of the first and second mandrel patterns 112$a$ and 112$b$ may be exposed on the second and third regions B and C. In addition, portions of the first spacer layer 126 and the first and second filling patterns 130$a$ and 130$b$ on the second and third regions B and C may be removed.

After the anisotropic etching process, the first and second mandrel patterns 112$a$ and 112$b$ on the second and third regions B and C may be removed. Accordingly, the first and second stacked structures 116$a$ and 116$b$ on the second and third regions B and C may be removed.

In example embodiments, a portion of the first spacer layer 126 may remain on the fourth stacked structure 140$b$ in the edge of the second region B contacting the boundary between the first region A and the second region B. In addition, portions of the first filling pattern 130$a$ and the first spacer layer 126 surrounding sidewalls and bottom of the first filling pattern 130$a$ may remain on fourth stacked structure 140$b$ in the second and third regions B and C.

Figure 31:
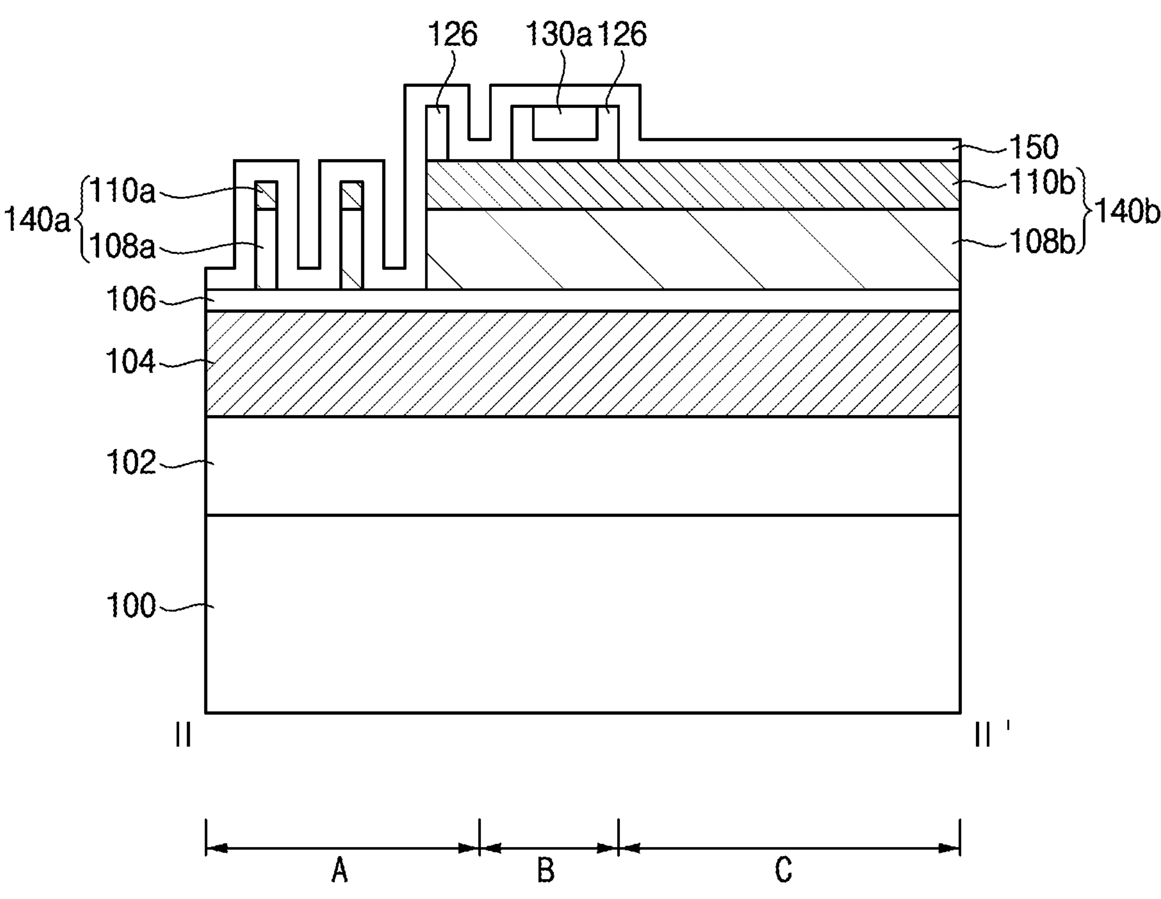
Figure 32:
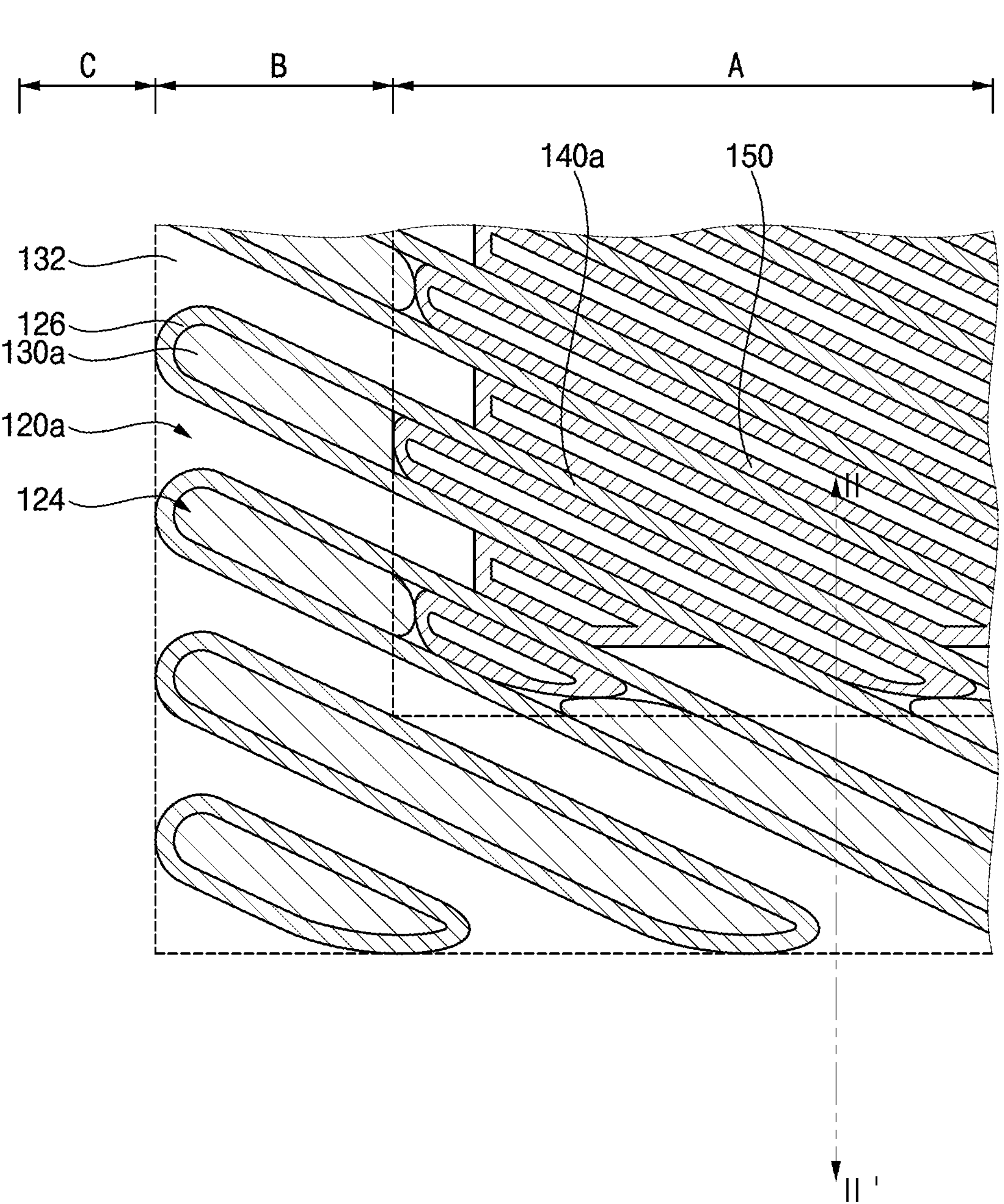

Referring to FIGS. 31 and 32, a second spacer layer 150 may be conformally formed on the surfaces of the third stacked structure 140$a$, the fourth stacked structure 140$b$, the buffer layer 106 and the remaining first filling pattern 130$a$ and the first spacer layer 126.

The second spacer layer 150 may serve as an etching mask for etching the second mask layer 104 formed thereunder. Therefore, the second spacer layer 150 may include a material having an etching selectivity with respect to the second mask layer 104. In example embodiments, the second spacer layer 150 may include silicon oxide.

The second spacer layer 150 may be deposited to have a deposition thickness substantially equal to the first line width. The second spacer layer 150 may be formed by an atomic layer deposition process.

As such, the second spacer layer 150 may directly contact the buffer layer 106. Therefore, the second spacer layer 150 may not directly contact the second mask layer 104 as an etch target layer.

In FIG. 32, the second spacer layer 150 may be shown only on the sidewall of the fourth opening 142, in order to avoid the complexity of the drawing.

Figure 33:
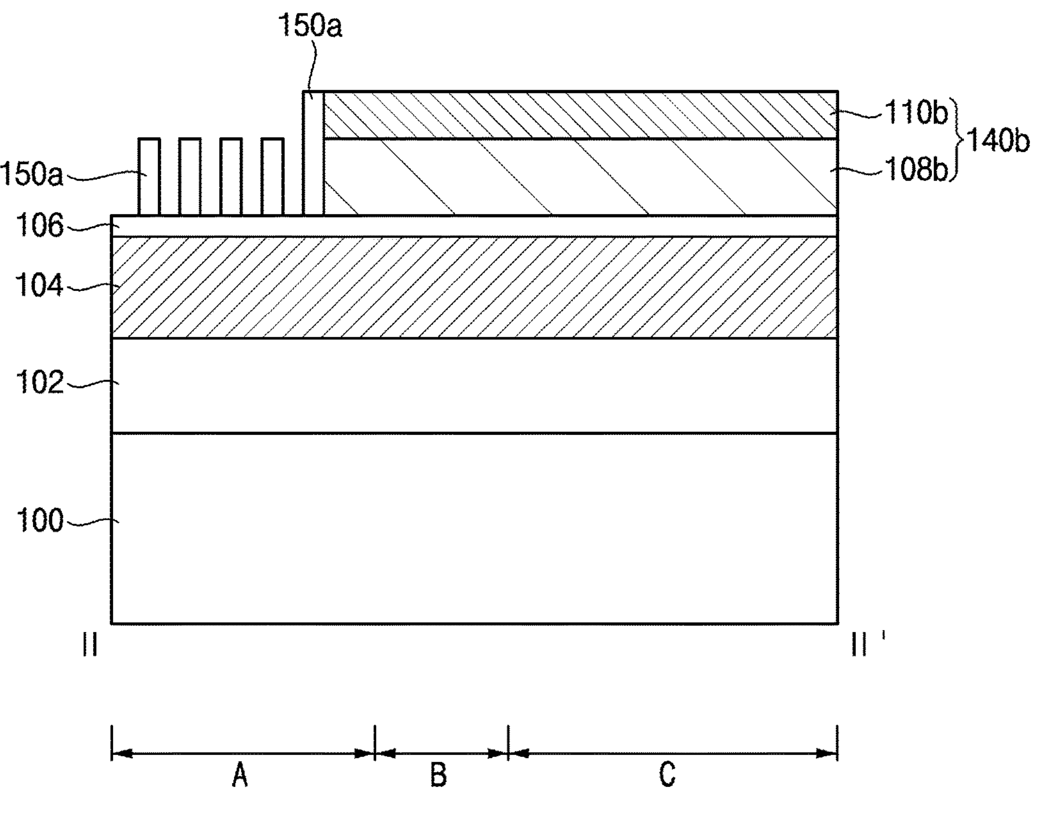

Referring to FIG. 33, the second spacer layer 150 may be anisotropically etched to form second spacers 150$a$ on sidewalls of the third and fourth stacked structures 140$a$ and 140$b$. Thus, the buffer layer 106 between the second spacers 150$a$ may be exposed on the first region A.

Thereafter, the entire third separation layer pattern 110$a$ may be removed, while the fourth separation layer pattern 110$b$ remains. In detail, since the thickness of the third separation layer pattern 110$a$ is less than the thickness of the fourth separation layer pattern 110$b$, the third separation layer pattern 110$a$ may be entirely removed and only a portion of the fourth separation layer pattern 110$b$ may be removed in the etching process.

Subsequently, the third mandrel pattern 108$a$ may be selectively removed. Since the fourth separation layer pattern 110$b$ covers the fourth mandrel pattern 108$b$ on the second and third regions B and C, the fourth mandrel pattern 108$b$ may remain without being removed during removing the third mandrel pattern 108$a$. Removing of the third mandrel pattern 108$a$ may include an ashing process.

Therefore, the entire third stacked structure 140$a$ on the first region A may be removed, and the fourth stacked structure 140$b$ on the second and third regions B and C may remain.

During the above processes, most of the first spacer layer 126 and the first filling pattern 130$a$ on the second and third regions B and C may be removed. In some example embodiments, portions of the first spacer layer 126 and the first filling pattern 130$a$ on the second and third regions B and C may remain.

The second spacers 150$a$ of the first region A may have a same width as the first line width, and may be spaced apart from each other by the first line width. The second spacer 150$a$ on the first region A may extend in the third direction. The second spacers 150$a$ on the first region A may include lines and spaces alternately and repeatedly arranged.

Figure 34:
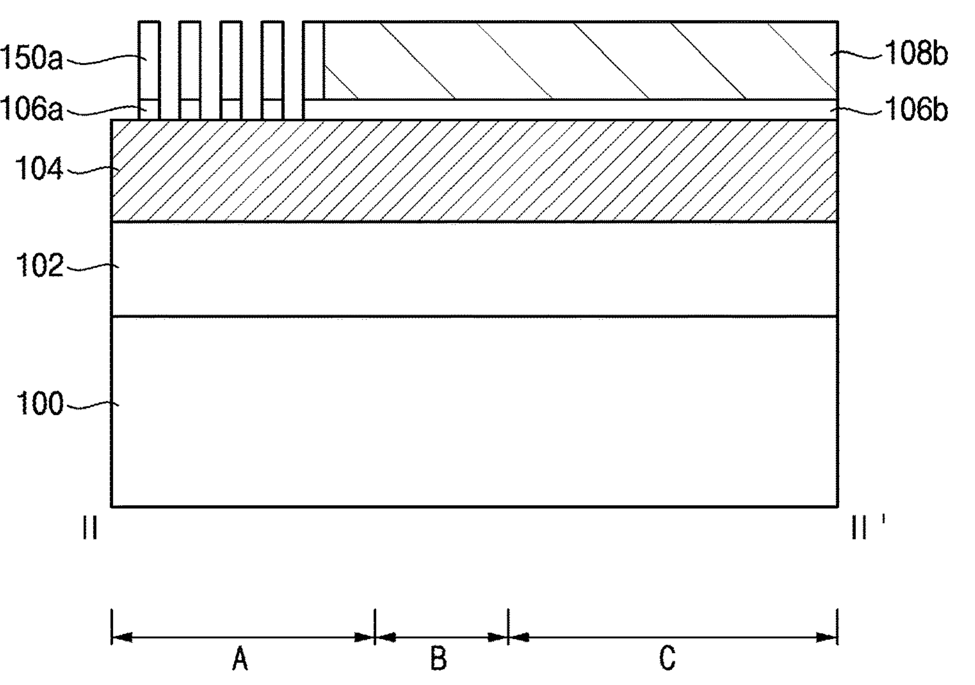

Referring to FIG. 34, the exposed buffer layer 106 on the first region A may anisotropically etched using the second spacer 150$a$ and the fourth stacked structure 140$b$ as etching masks. Accordingly, the first buffer layer pattern 106$a$ may be formed on the first region A, and the second buffer layer pattern 106$b$ may be formed on the second and third regions B and C. After that, the fourth separation layer pattern 110$b$ may be removed. As the fourth separation layer pattern 110$b$ is removed, an upper surface of the fourth mandrel pattern 108$b$ may be exposed on the second and third regions B and C.

If the first spacer layer 126 and the first filling pattern 130$a$ remain on the fourth separation layer pattern 110$b$, both the first spacer layer 126 and the first filling pattern 130$a$ may be removed by the above processes.

Figure 35:
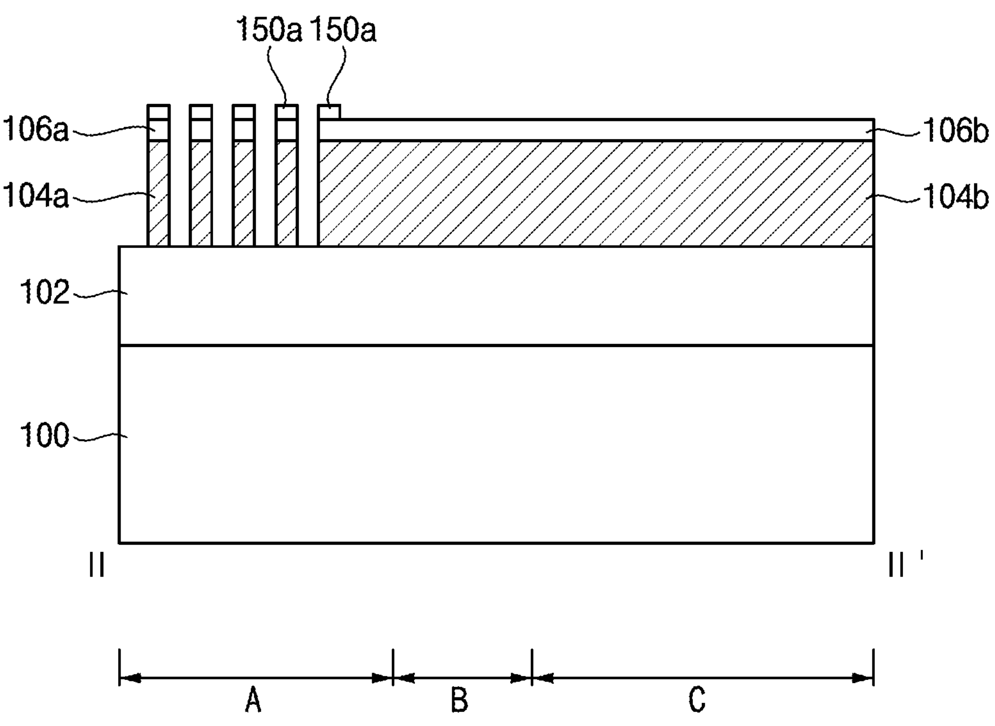
Figure 36:
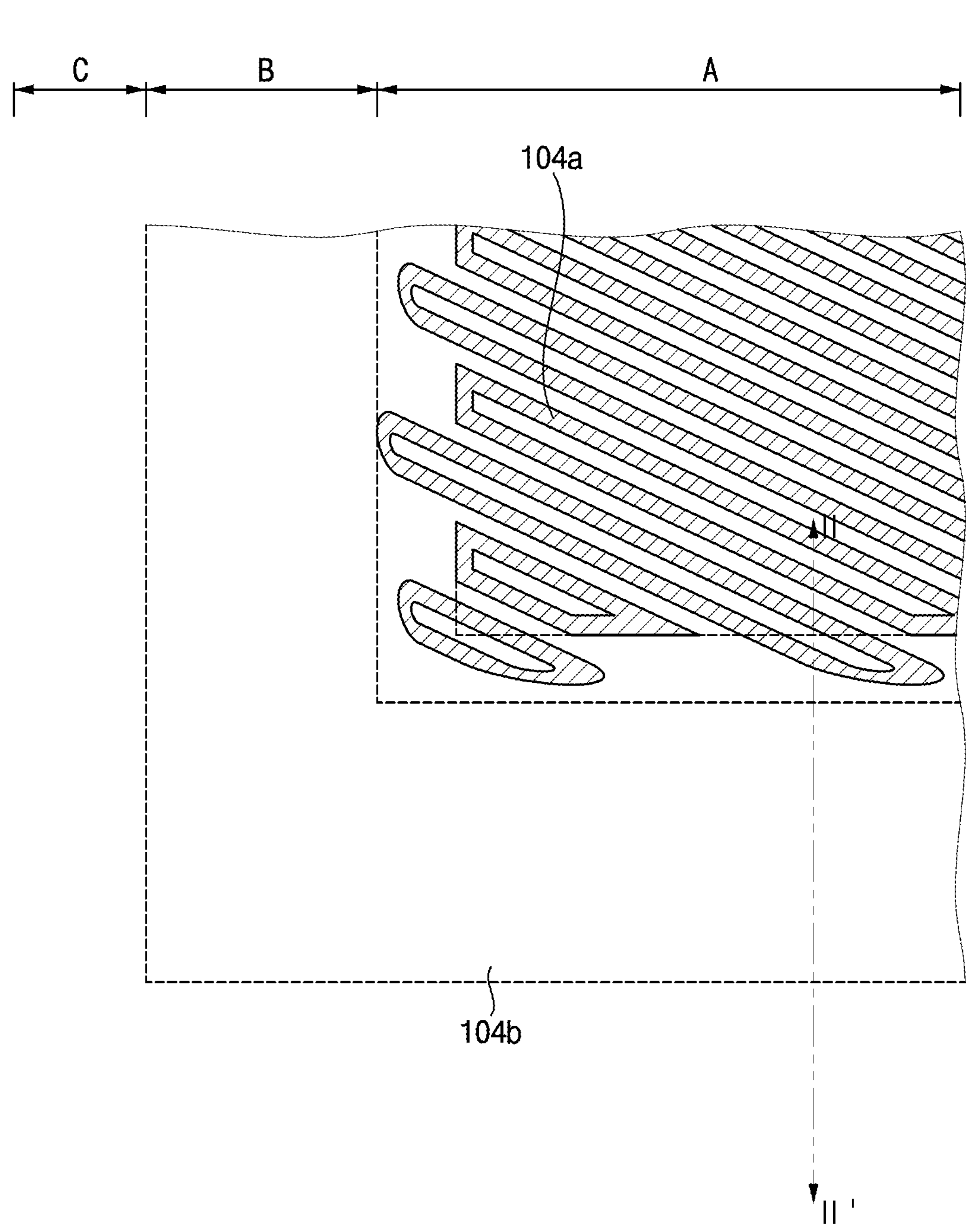

FIGS. 35 and 36, the second mask layer 104 may be etched using the second spacer 150*a*, the first and second buffer layer patterns 106*a* and 106*b*, and the fourth mandrel pattern 108*b* as etching masks to form a first mask pattern 104*a* on the first region A and a second mask pattern 104*b* on the second and third regions B and C.

The fourth mandrel pattern 108*b* on the second and third regions B and C may be removed. The fourth mandrel pattern 108*b* may be removed by an ashing process.

In example embodiments, the second mask layer may be etched so that the first mask layer 102 may not be exposed by a first etching process. Then, the fourth mandrel pattern 108*b* may be removed. Thereafter, a remaining second mask layer 104 may be etched so that the first mask layer 102 may be exposed by a second etching process to form the first and second mask patterns 104*a* and 104*b*.

In example embodiments, as shown in FIGS. 35 and 36, at least first and second buffer layer patterns 106*a* and 106*b* may remain on the first and second mask patterns 104*a* and 104*b*, respectively. In some example embodiments, a portion of the second spacer 150*a* may remain on the first buffer layer pattern 106*a*. A portion of the second spacer 150*a* may also remain on the second buffer layer pattern 106*b* at the boundary between the first region A and the second region B.

By the above process, the first mask patterns 104*a* including lines and spaces alternately and repeatedly arranged may be formed on the first region A. The second mask pattern 104*b* having no pattern may be formed on the second and third regions B and C to cover the second and third regions B and C.

In this case, the edge of the first mask patterns 104*a* may include a protruding portion formed by transferring the third photoresist pattern (refer to 128 in FIG. 19) and a non-protruding portion formed by transferring the fourth photoresist pattern (refer to 132 in FIG. 24), and the protruding portion and the non-protruding portion may be alternately and repeatedly arranged. Ends of the protruding portions of the first mask patterns 104*a* may not be aligned to a straight line, and may be irregularly arranged.

By performing subsequent processes, for example, active patterns of a semiconductor device may be formed. Also, memory cell patterns and peripheral patterns may be formed on the active patterns. Hereinafter, subsequent processes are briefly described.

Figure 37:
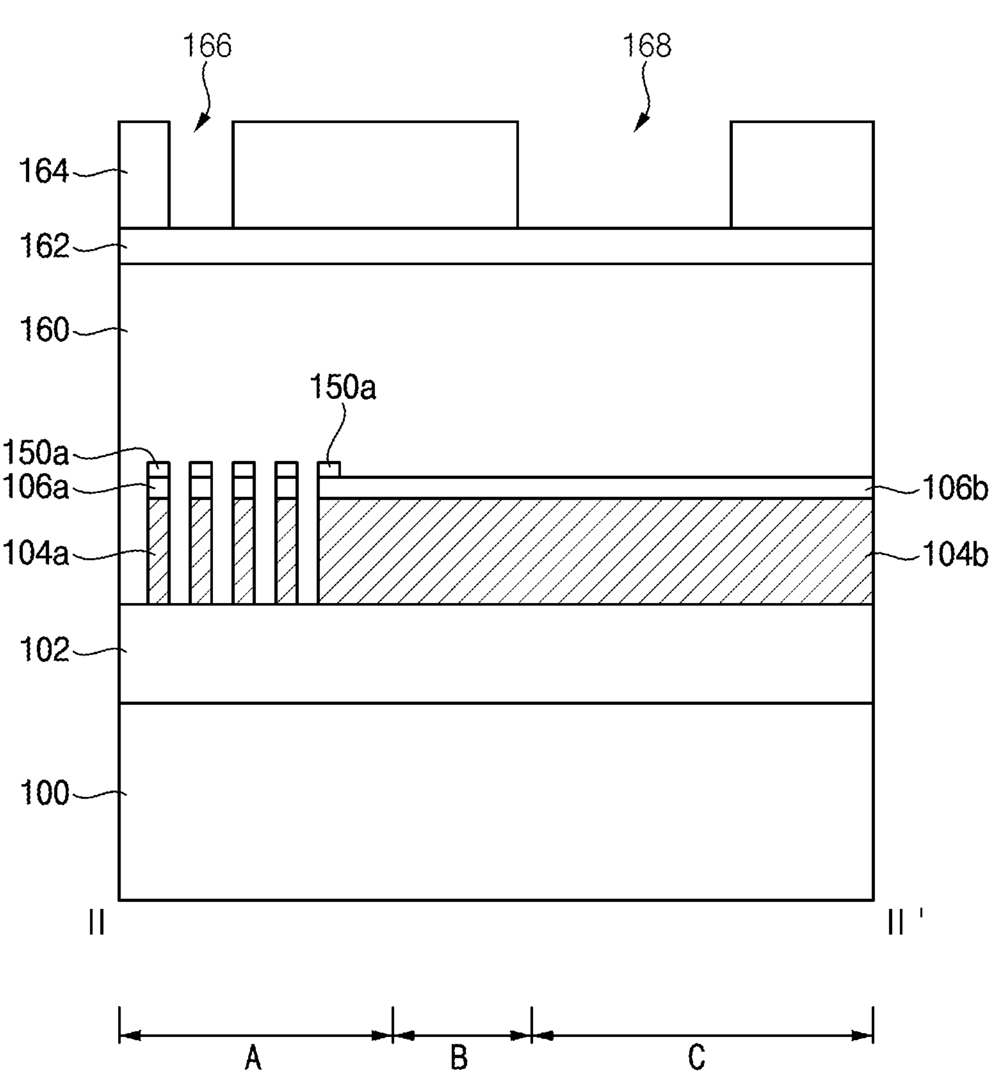

Referring to FIG. 37, a spin-on hard mask layer 160 may be formed to cover the first and second mask patterns 104*a* and 104*b*. A third separation layer 162 may be formed on the spin-on hard mask layer 160. The third separation layer 162 may include silicon oxynitride.

Fifth photoresist patterns 164 may be formed on the third separation layer 162. A fifth opening 166 and a sixth opening 168 may be formed between the fifth photoresist patterns 164. The fifth opening 166 may selectively expose a portion to be cut from the first mask pattern 104*a* in order to form a first active pattern (e.g., a cell active pattern) on the first region A of the substrate 100. The sixth opening 168 may face a portion of the second mask pattern 104*b*. The sixth opening 168 may be formed to form a peripheral active pattern and peripheral trench. The sixth opening 168 may be positioned at a position corresponding to the peripheral trench.

Figure 38:
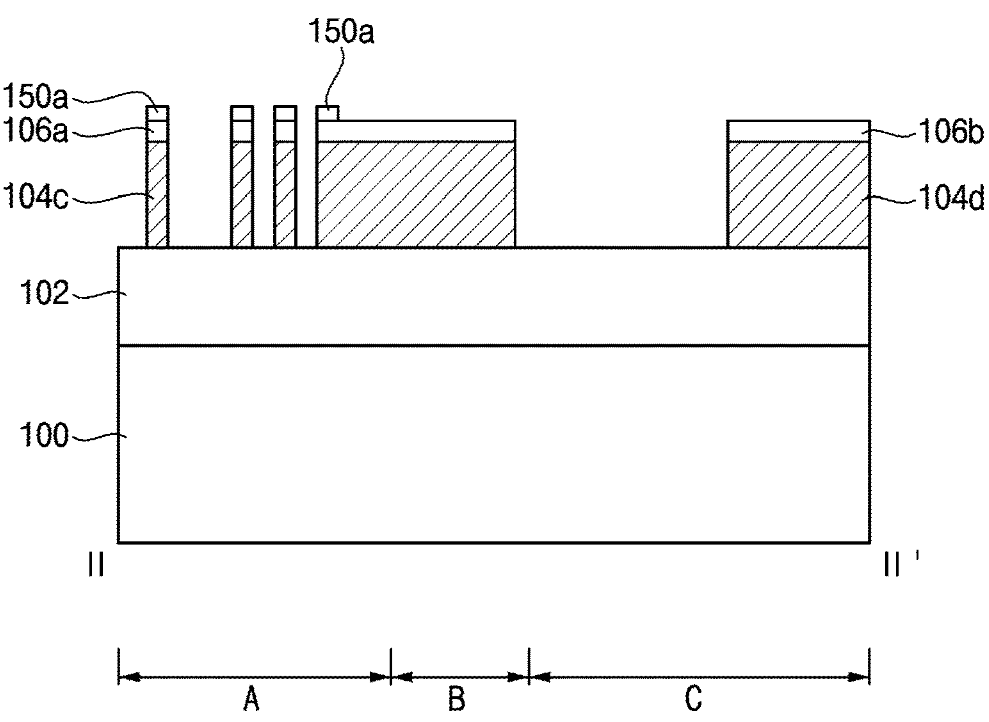

Referring to FIG. 38, the third separation layer 162 may be anisotropically etched using the fifth photoresist pattern 164 as an etching mask. Subsequently, the spin-on hard mask layer 160 may be anisotropically etched. In addition, exposed first and second buffer layer patterns 106*a* and 106*b* and the first and second mask patterns 104*a* and 104*b* may be anisotropically etched. Accordingly, a third mask pattern 104*c* and a fourth mask pattern 104*d* may be formed on the first mask layer 102 in the first to third regions A, B and C.

Thereafter, the fifth photoresist pattern 164 and the third separation layer 162 may be removed. In addition, the spin-on hard mask layer 160 may be removed by an ashing process.

Figure 39:
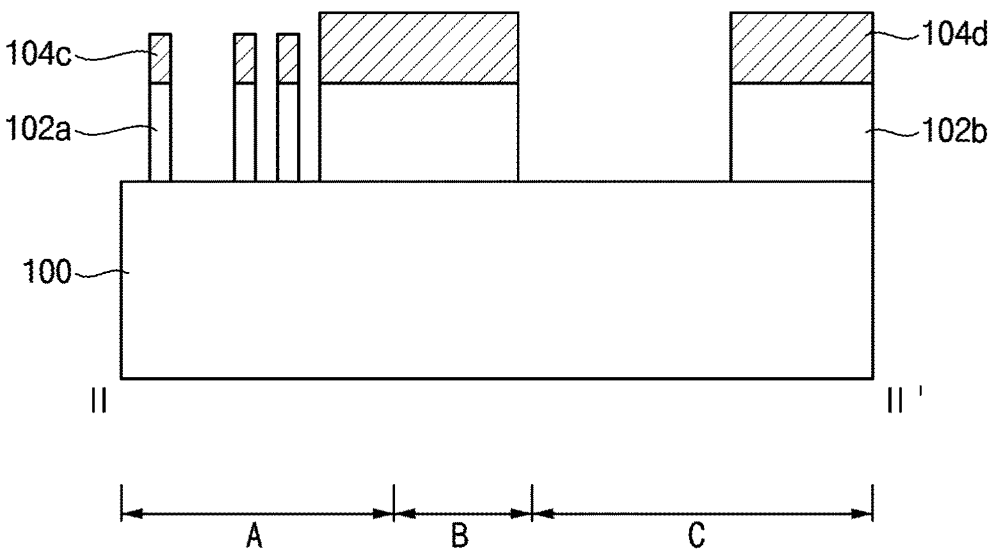

Referring to FIG. 39, the first mask layer 102 may be etched using the first and second buffer layer patterns 106*a* and 106*b* and the third mask pattern 104*c* as etching masks to form a fifth mask pattern 102*a* and a sixth mask pattern 102*b*.

The fifth mask pattern 102*a* on the first region A may cover a region of the substrate 100 for forming the first active pattern. The sixth mask pattern 102*b* on the second and third regions B and C may cover a region of the substrate 100 for forming the peripheral active pattern.

During the etching process, the entire first and second buffer layer patterns 106*a* and 106*b* and the second spacer 150*a* may be removed. Also, the third mask pattern 104*c* may be removed by a partial thickness.

Figure 40:
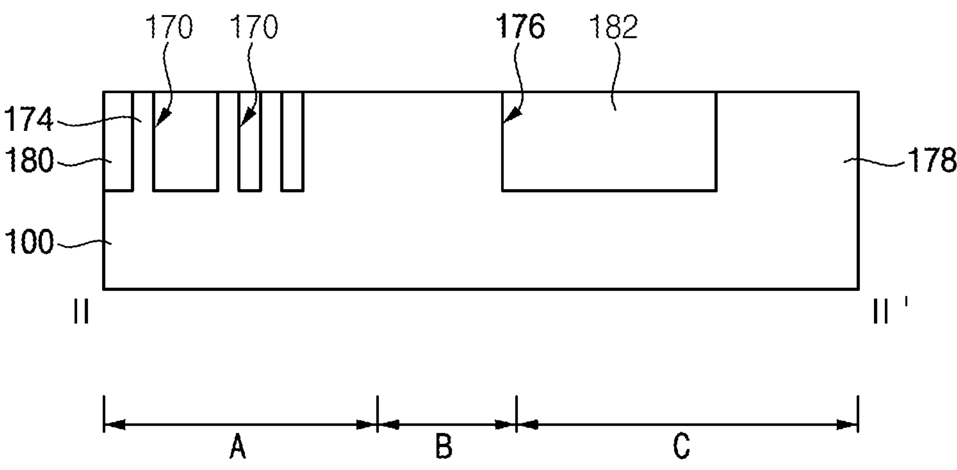

Referring to FIG. 40, an upper portion of the substrate 100 may be etched using the third mask pattern 104*c* and the fourth mask pattern 104*d* as etching masks to form first trenches 170 and the first active pattern 174 between the first trenches 170 on the first region A of the substrate 100. The peripheral trenches 176 and the peripheral active pattern 178 between the peripheral trenches 176 may be formed on the second and third regions B and C of the substrate 100.

Thereafter, an insulation material may be formed to fill the first trenches 170 and the peripheral trenches 176, and the insulation material may be planarized to form a first device isolation pattern 180 in each of the first trenches 170 and a second device isolation pattern 182 in each of the peripheral trenches 176.

By the above processes, the first active patterns 174 may be formed on the first region A. The peripheral active pattern 178 may be formed on the second and third regions B and C.

As described above, in the process for forming the first and second photoresist patterns 120*a* and 120*b*, which are initial etching mask patterns for forming the first active patterns 174, the first photoresist patterns 120*a* including the first opening 122 may be formed on the first region A and the second region B adjacent to the first region A and surrounding the edges of the first region A. That is, the first photoresist patterns may be formed so as to extend into the second region B designed as the bulk region, so that exposure failures of the first photoresist patterns 120*a* at the edge of the first region A may not occur.

In addition, the second opening 124 formed by the first photoresist pattern 120*a* on the second region B may be filled with the first filling pattern 130*a*. Accordingly, the second region B may be formed as the bulk region.

Although not shown, memory cells including a gate structure, a bit line structure, contact plugs, and a capacitor may be formed on the first active patterns 174 and the first device isolation pattern 180 on the first region A. In example embodiments, the memory cell may be a dynamic random access memory (DRAM) cell.

In the above description, a method for forming first and second active patterns on the first to third regions A, B, and C through a Quadruple Patterning Technique (QPT) process is described. However, the method for forming the first and second active patterns is not limited thereto, and may be formed by, e.g., a double patterning technique (DPT) process. In the case of the DPT process, a final etching mask may be formed by the processes described with reference to FIGS. 14 to 30. For example, the third stacked structure and the fourth stacked structure may be the final etching mask. Therefore, the process for forming the second spacer and the etching process of layers using the second spacer may not be performed.

FIGS. 41 to 49 are cross-sectional views of stages in a method of manufacturing a semiconductor device according to example embodiments.

Figure 41:
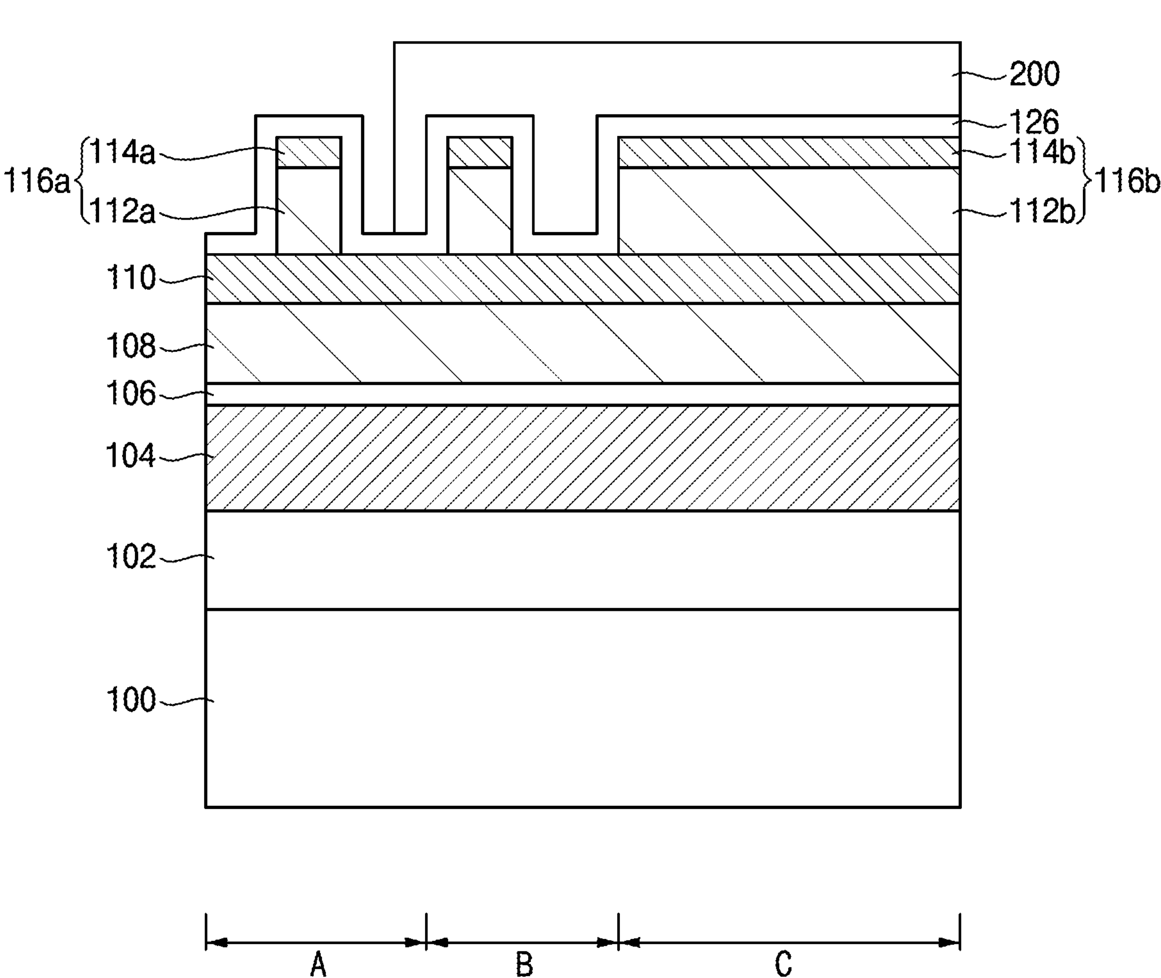
FIGS. 41 to 49 are cross-sectional views of stages in a method of manufacturing a semiconductor device according to example embodiments.

Referring to FIG. 41, the processes described with reference to FIGS. 14 to 18 may be performed. Accordingly, the first stacked structure 116*a*, in which the first mandrel pattern 112*a* and the first separation layer pattern 114*a* are stacked, may be formed on the first region A and the second region B of the substrate 100, and a second stacked structure 116*b*, in which the second mandrel pattern 112*b* and the second separation layer pattern 114*b* are stacked, may be formed on the third region C of the substrate 100. In addition, the first spacer layer 126 may be conformally formed on surfaces of the first separation layer 110, the first stacked structure 116*a*, and the second stacked structure 116*b*.

A third photoresist pattern 200 may be formed on the first spacer layer 126 of the second and third regions B and C. The third photoresist pattern 200 may cover the first spacer layer 126 on the second and third regions B and C. The third photoresist pattern 200 may selectively expose the first spacer layer 126 on the first region A.

Figure 42:
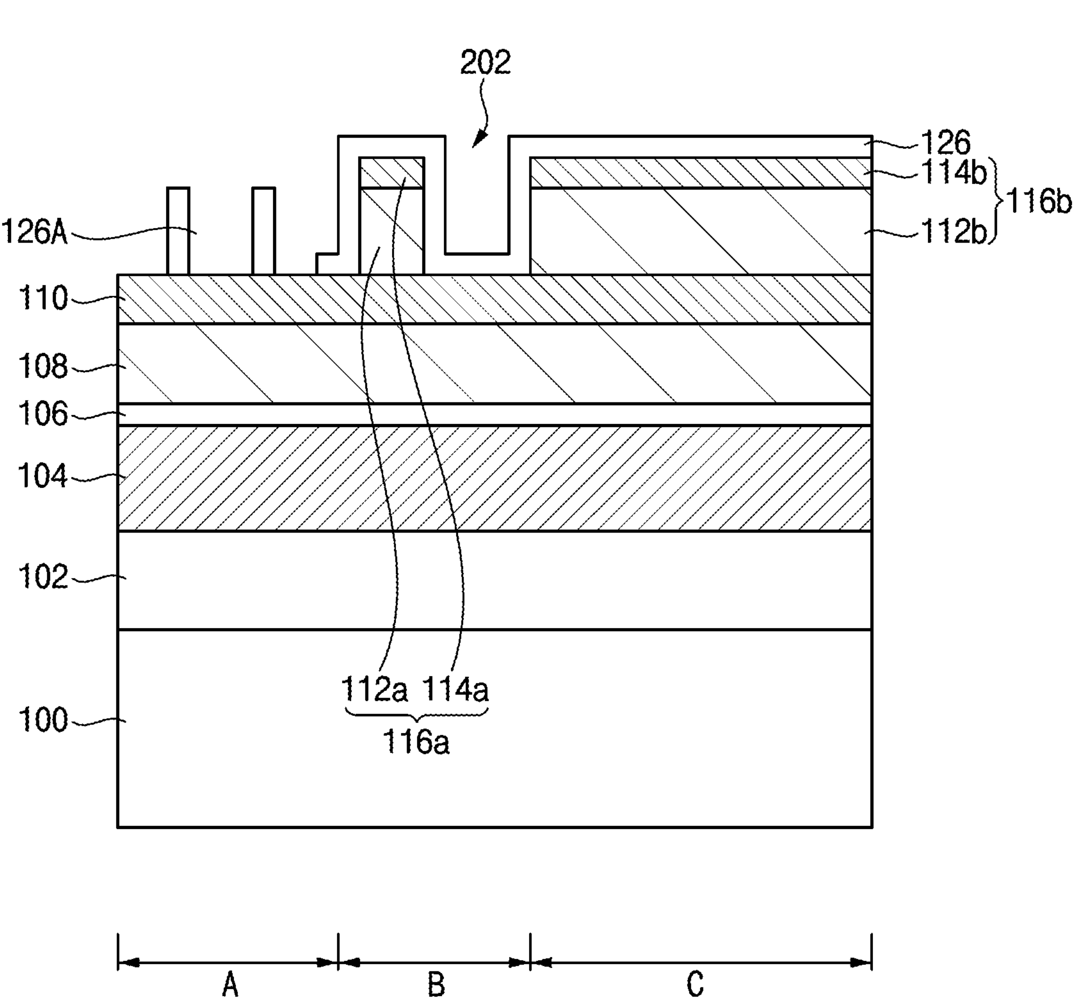

Referring to FIG. 42, the first spacer layer 126 may be anisotropically etched using the third photoresist pattern 200 as an etching mask to form the first spacers 126*a* on sidewalls of the first staked structure. That is, the first spacers 126*a* may be formed on the first separation layer 110 on the first region A.

Since the third photoresist pattern 200 covers the first spacer layer 126 on the second and third regions B and C, the first spacer layer 126 may cover the first and second stacked structures 116*a* and 116*b* on the second and third regions B and C, after the etching process.

Thereafter, the first stacked structure 116*a* on the first region A may be removed. Accordingly, the first spacers 126*a* may be formed on the first separation layer 110 of the first region A to be spaced apart from each other. Since the first spacer layer 126 may cover surfaces of the first and second stacked structures 116*a* and 116*b* on the second and third regions B and C, the first and the second stacked structures 116*a* and 116*b* may remain without being removed in the removing process of the first stacked structure 116*a* on the first region A. The first spacer layer 126 may be conformally formed between the first and second stacked structures 116*a* and 116*b* on the second and third regions B and C, so that an inner space of the first opening 202 may remain between the first and second stacked structures 116*a* and 116*b*.

Figure 43:
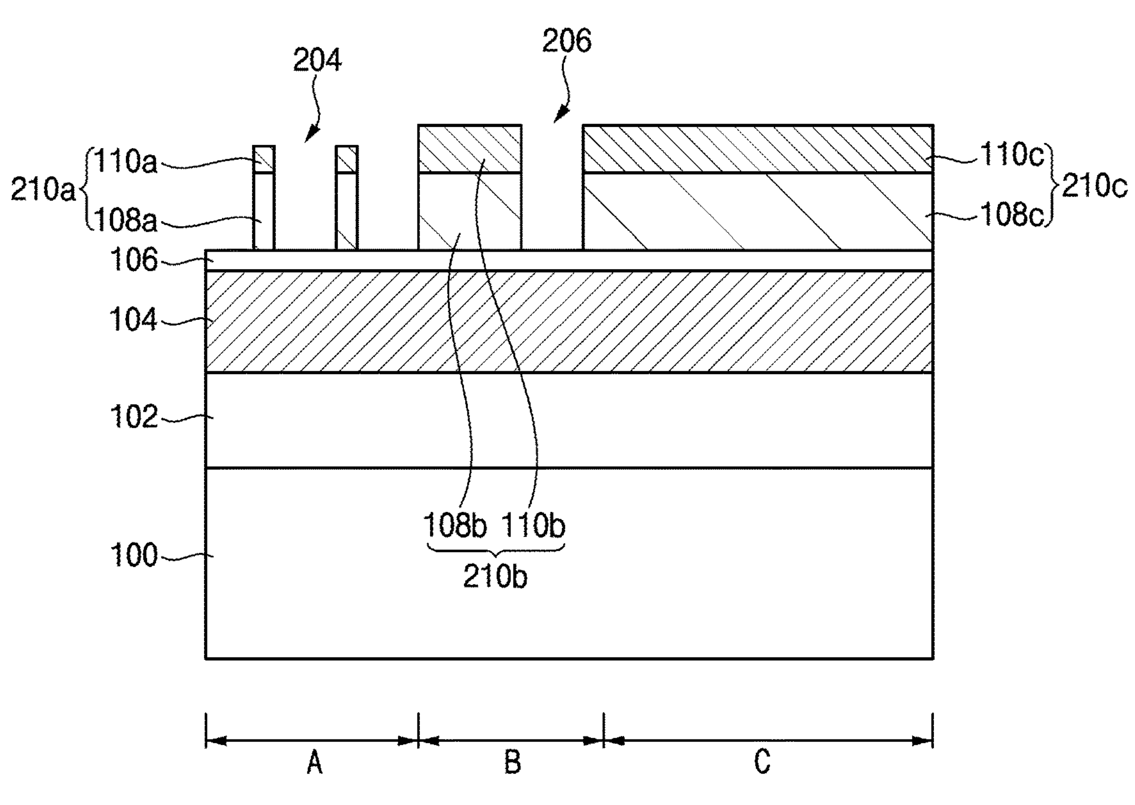

Referring to FIG. 43, the first separation layer 110 may be anisotropically etched using the first spacer 126*a*, the first spacer layer 126 and the first and second stacked structures 116*a* and 116*b* as etching masks. Then, the first mandrel layer 108 may be etched. Accordingly, a third stacked structure 210*a* in which a third mandrel pattern 108*a* and a third separation layer pattern 110*a* are stacked may be formed on the buffer layer 106 in the first region A. A fourth stacked structure 210*b* in which a fourth mandrel pattern 108*b* and a fourth separation layer pattern 110*b* are stacked may be formed on the buffer layer 106 in the second region B. A fifth stacked structure 210*c* in which a fifth mandrel pattern 108*c* and a fifth separation layer pattern 110*c* are stacked may be formed on the buffer layer 106 in the third region C.

The third stacked structure 210*a* may be formed by the etching process using the first spacer 126*a* as an etching mask, and the fourth stacked structure 210*b* may be formed by the etching process using the first stacked structure 116*a* and the first spacer layer 126 as etching masks. The fifth stacked structure 210*c* may be formed by the etching process using the second stacked structure 116*b* and the first spacer layer 126 as etching masks.

A second opening 204 may be formed between the third stacked structures 210*a* on the first region A. The second opening 204 may overlap the first stacked structure 116*a*. A third opening 206 may be formed between the fourth and fifth stacked structures 210*b* and 210*c* on the second and third regions B and C.

When the anisotropic etching process is performed, the first spacers 126*a* on the first region A may be rapidly consumed by the three-dimensional effect. Therefore, an upper portion of the third separation layer pattern 110*a* on the first region A may be removed by a partial thickness. On the other hand, the fourth and fifth separation layer patterns 110*b* and 110*c* on the second and third regions B and C may hardly be removed due to an etching loading in the etching process. Therefore, the third separation layer pattern 110*a* may have a thickness less than a thickness of the fourth and fifth separation layer patterns 110*b* and 110*c*.

Figure 44:
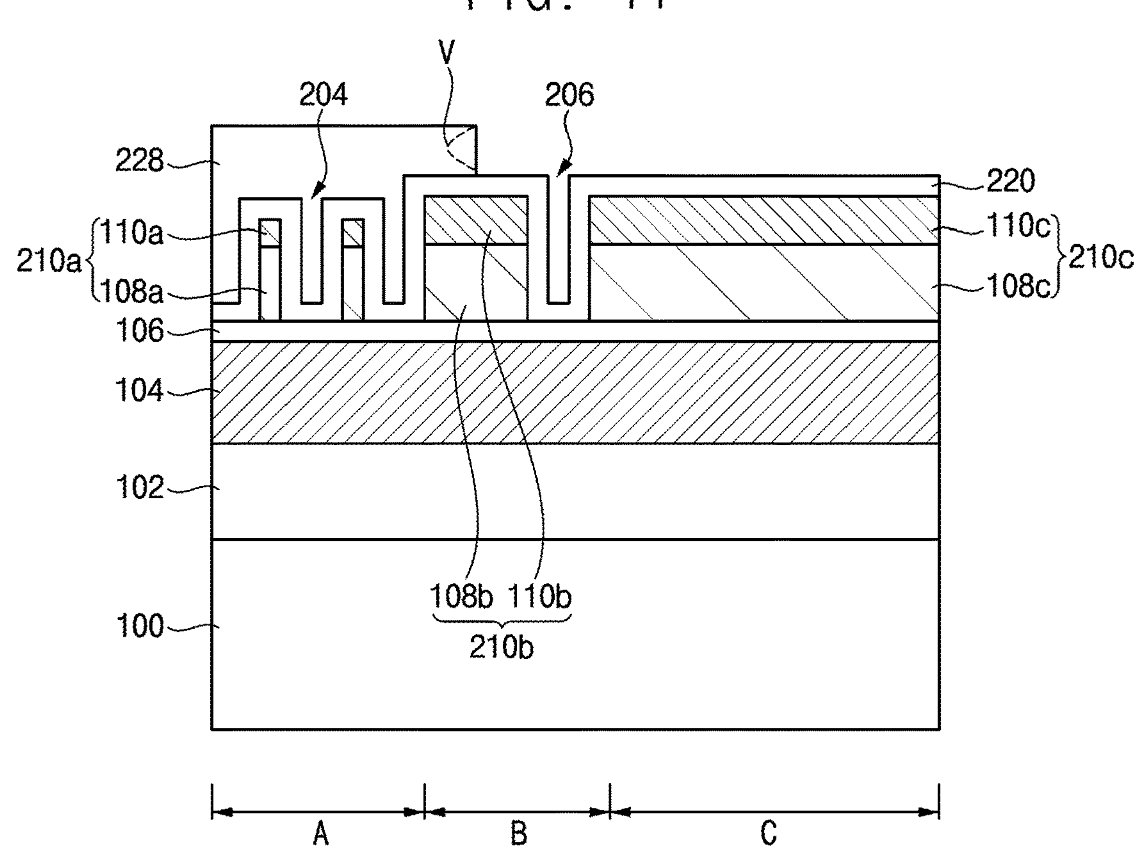

Referring to FIG. 44, a second spacer layer 220 may be conformally formed on the third, fourth, and fifth stacked structures 210*a*, 210*b*, and 210*c* and the buffer layer 106. A fourth photoresist pattern 228 may be formed on the second spacer layer 220 to cover the entire second spacer layer 220 on the first region A.

The fourth photoresist pattern 228 may be formed to sufficiently fill an inner space of the second opening 204 on the first region A. The fourth photoresist pattern 228 may not be formed on the second spacer layer 220 in the second and third regions B and C. Thus, an upper surface of the second spacer layer 220 may be exposed on the second and third regions B and C. In this case, an inner space of the third opening 206 between the second and third regions B and C may remain.

In example embodiments, the fourth photoresist pattern 228 may be formed to have a thickness of about 50 angstroms to about 2000 angstroms from the upper surface of the second spacer layer 220 on the fourth stacked structure 210*b*.

In some example embodiments, when the fourth photoresist layer is formed, voids V may be formed in the fourth photoresist layer.

When the fourth photoresist pattern 228 is formed by the exposure process, an edge of the fourth photoresist pattern 228 may not be aligned along a straight line. For example, as shown by a dotted line, a boundary of the fourth photoresist pattern 228 may be positioned at the inner portion of an edge of the first region A (i.e., in the first region).

Figure 45:
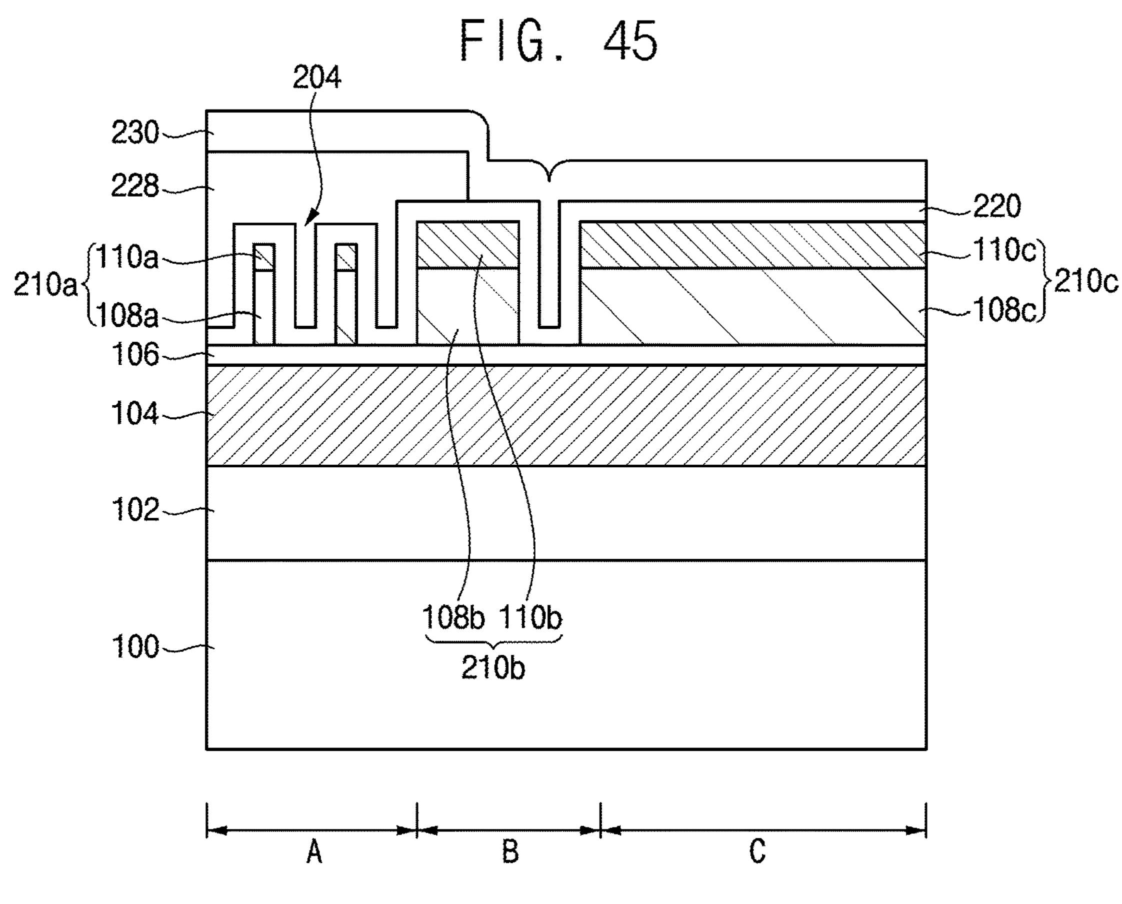

Referring to FIG. 45, a filling layer 230 may be formed on the fourth photoresist pattern 228 and the second spacer layer 220. The filling layer 230 may be formed to fill at least a remaining inner space of the third opening 206 between the second and third regions B and C.

The filling layer 230 may be conformally formed on surfaces of the fourth photoresist pattern 228 and the second spacer layer 220. In example embodiments, the filling layer 230 may be formed by an atomic layer deposition process. In example embodiments, the filling layer 230 may include silicon oxide.

Figure 46:
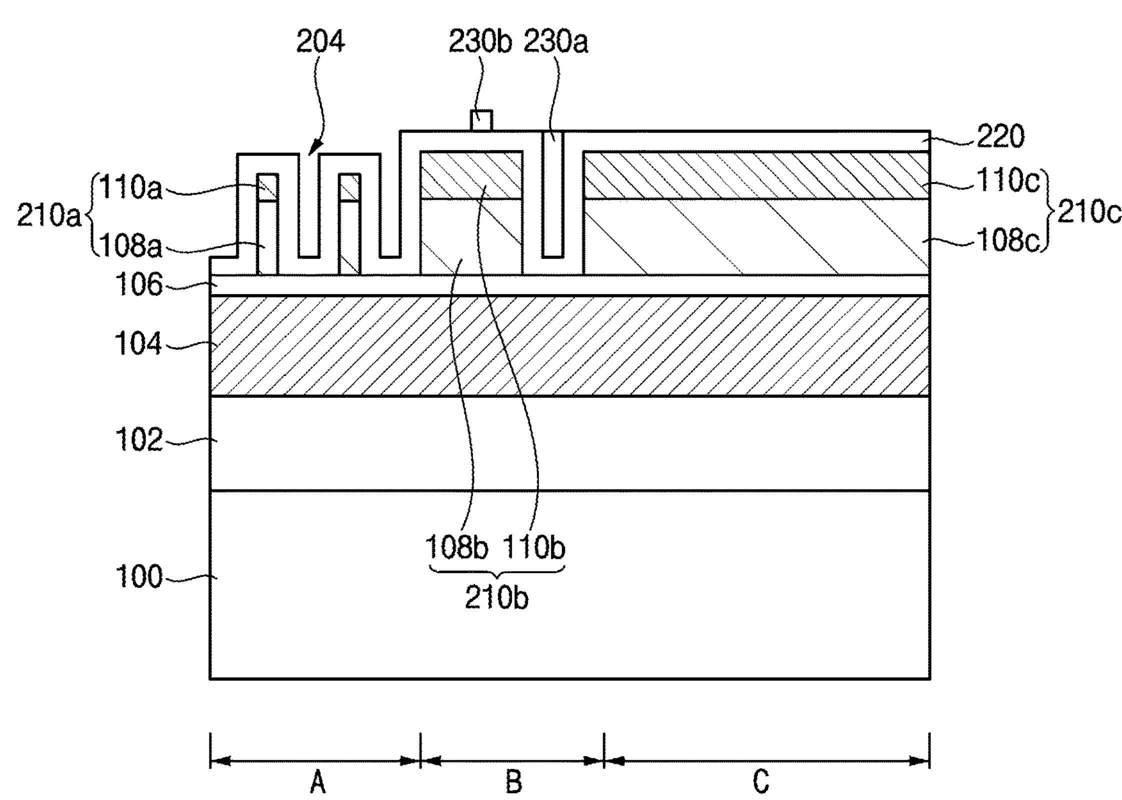

Referring to FIG. 46, the filling layer 230 may be etched to expose an upper surface of the fourth photoresist pattern 228. Accordingly, the filling layer 130 may remain in the third opening 206 between the second and third regions B and C, so that the first filling pattern 230*a* filling the third opening 206 may be formed. In addition, a second filling pattern 230*b* may be further formed on the fourth stacked structure 140*b* in the second region B contacting the boundary between the first and second regions A and B.

In order to decrease a thickness of the second filling pattern 230*b*, argon gas or oxygen gas may be further included and a bias of 50V to 1000V may be further applied in the etching process.

By the above process, the first filling pattern 230*a* may fill the third opening 206 between the second and third regions B and C, and thus pattern portions formed by the third opening 206 on the second and third regions B and C may be removed.

After that, the fourth photoresist pattern 228 may be removed.

Figure 47:
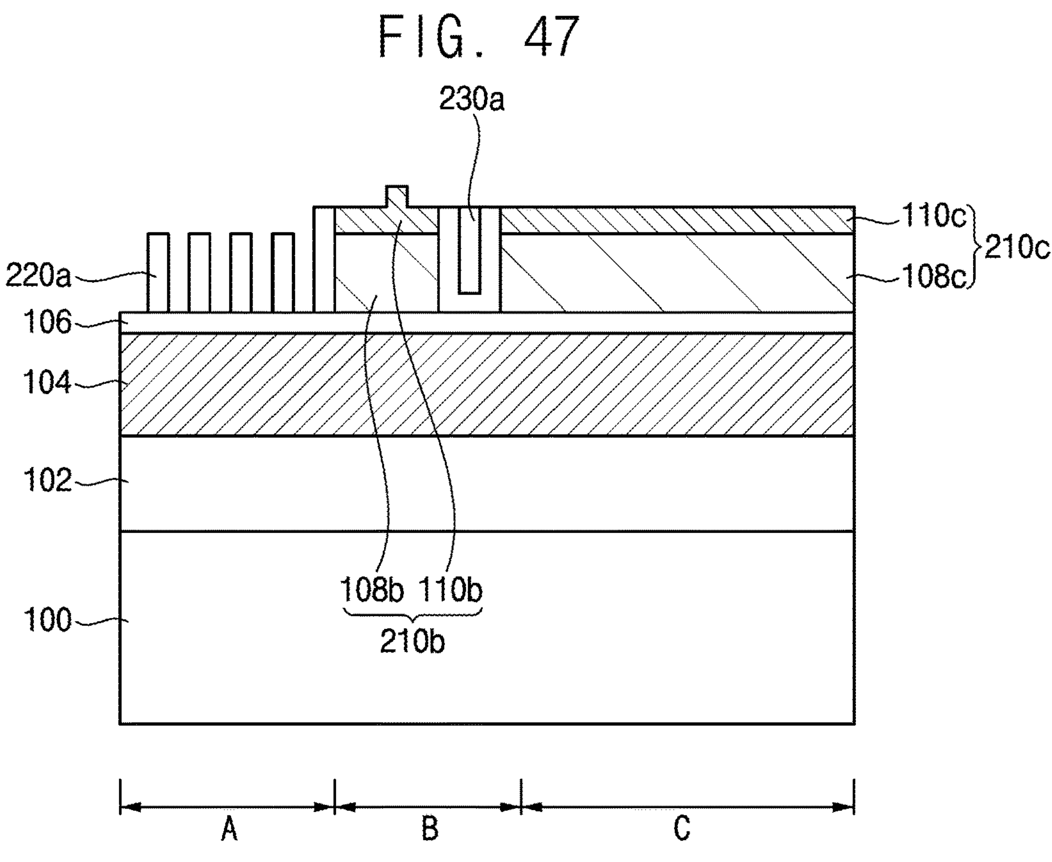

Referring to FIG. 47, the second spacer layer 220 may be anisotropically etched to form second spacers 220*a* on sidewalls of the third stacked structure 140*a*. In the anisotropic etching process, the second spacer layer 220 on the upper surfaces of the fourth and fifth stacked structures 140*b* and 140*c* in the second and third regions B and C may be removed together.

The third stacked structure 210*a* between the second spacers 220*a* on the first region A may be removed. When the third separation layer pattern 110*a* of the third stacked structure 210*a* on the first region A may be removed, the fourth and fifth separation layer patterns 110*b* and 110*c* of the fourth and fifth stacked structures 210*b* and 210*c* may remain to have a partial thickness. Therefore, after removing the third stacked structure 210*a*, the fourth and fifth stacked structures 210*b* and 210*c* on the second and third regions B and C may remain without being removed. In addition, the first filling pattern 230*a* may remain between the fourth and fifth stacked structures 210*b* and 210*c*.

Figure 48:
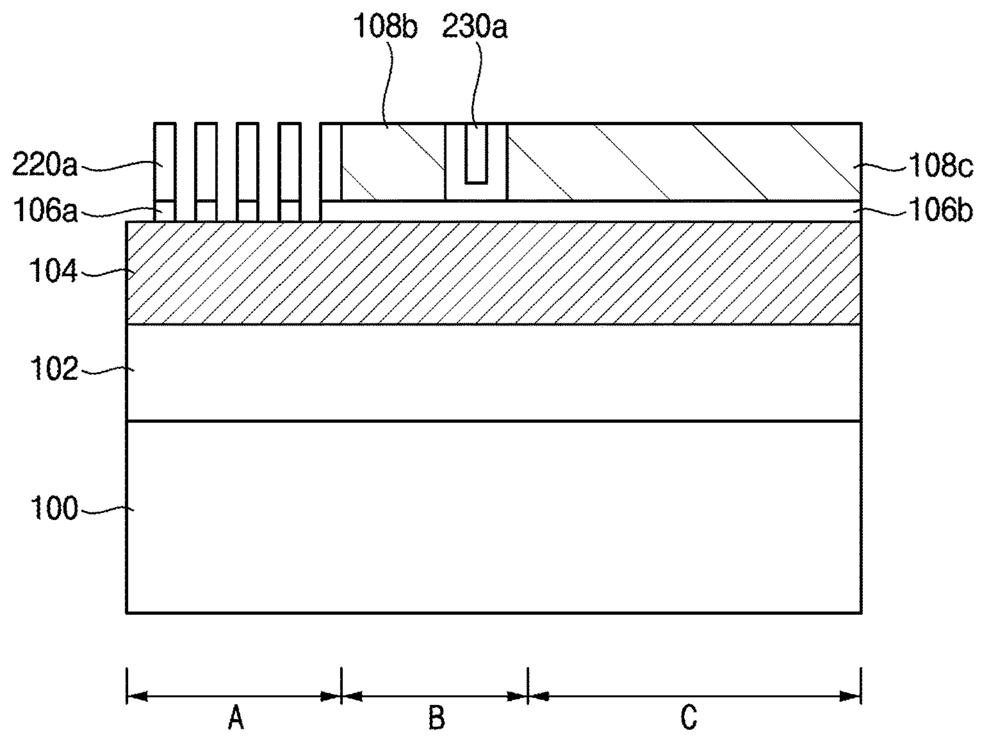

Referring to FIG. 48, an exposed buffer layer 106 may be anisotropically formed using the second spacer 220*a*, the fourth and fifth stacked structures 210*b* and 210*c* and the first filling pattern 230*a* as etching masks.

Accordingly, a first buffer layer pattern 106*a* may be formed on the first region A, and a second buffer layer pattern 106*b* may be formed on the second and third regions B and C. The second buffer layer pattern 106*b* may cover entire of the second mask layer 104 on the second and third regions B and C.

After that, the fourth and fifth separation layer patterns 110*b* and 110*c* may be removed. As the fourth and fifth separation layer patterns 110*b* and 110*c* may be removed, upper surfaces of the fourth and fifth mandrel patterns 108*b* and 108*c* may be exposed on the second and third regions B and C. The first filling pattern 230*a* may be disposed between the fourth and fifth mandrel patterns 108*b* and 108*c*. Accordingly, the second buffer layer pattern 106*b* on the second and third regions B and C may be covered by the fourth and fifth mandrel patterns 108*b* and 108*c* and the first filling pattern 230*a*.

Figure 49:
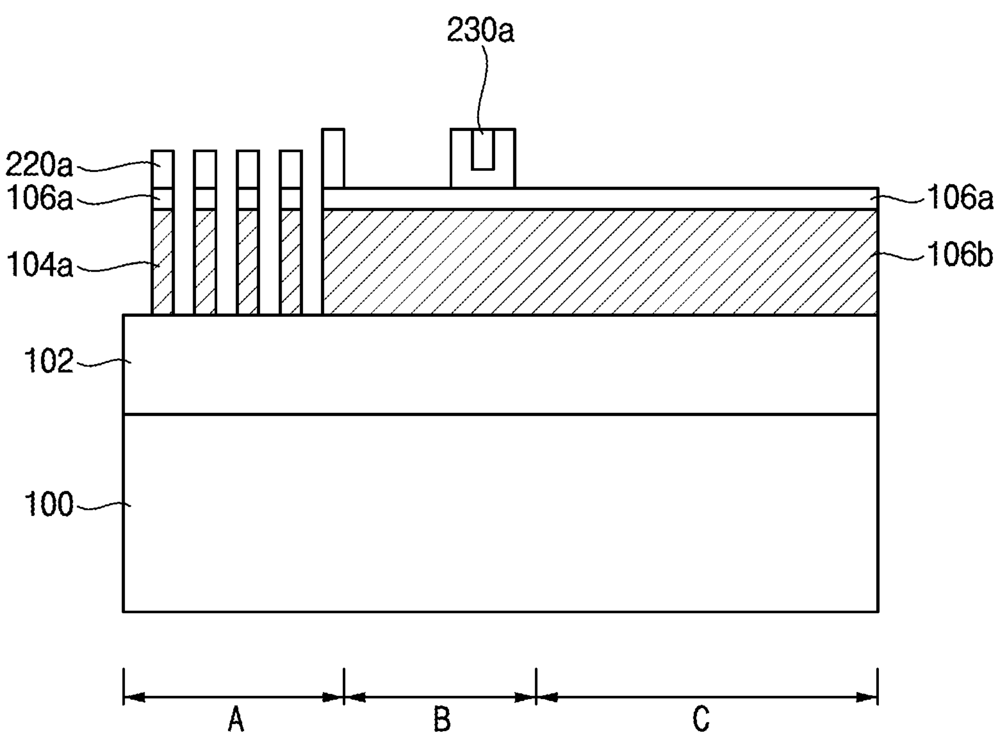

Referring to FIG. 49, the second mask layer 104 may be etched using the second spacer 220*a*, the first and second buffer layer patterns 106*a* and 106*b* and the fourth and fifth mandrel patterns 108*b* and 108*c* as etching masks to form a first mask pattern 104*a* on the first region A and a second mask pattern 104*b* on the second and third regions B and C.

The fourth and fifth mandrel patterns 108*b* and 108*c* on the second and third regions B and C may be removed. The fourth and fifth mandrel patterns 108*b* and 108*c* may be removed by an ashing process.

In example embodiments, the second mask layer may be etched so that the first mask layer 102 may not exposed by a first etching process. Then, the fourth and fifth mandrel patterns 108*b* and 108*c* may be removed. Thereafter, remaining second mask layer 104 may be etched so that the first mask layer 102 may be exposed by a second etching process to form the first and second mask patterns 104*a* and 104*b*.

As shown in FIG. 49, at least first and second buffer layer patterns 106*a* and 106*b* may remain on the first and second mask patterns 104*a* and 104*b*, respectively. In some exemplary embodiments, a portion of the second spacer 220*a* may remain on the first buffer layer pattern 106*a*. Portions of the second spacer 220*a* and the first filling pattern 230*a* may also remain on the second buffer layer pattern 106*b* in the second region B.

The first and second mask patterns 104*a* and 104*b* shown in FIG. 49 may be substantially the same as the first and second mask patterns described with reference to FIGS. 35 and 36, respectively.

After this, the same process as described with reference to FIGS. 37 to 40 may be performed. Accordingly, as shown in FIG. 40, the first trenches and first active pattern may be formed on the first region A of the substrate. Further, the peripheral trenches and peripheral active pattern may be formed on the second and third regions B and C of the substrate.

By way of summation and review, differences in pattern arrangement density between adjacent regions may cause difficulty in forming patterns at edges of the adjacent regions (e.g., by an exposure process).

In contrast, example embodiments provide a method for manufacturing a semiconductor device in which process defects are reduced. That is, according to example embodiments, the patterns on at least the first region may have no defect due to the exposure process. The bulk pattern may be formed on the second and third regions, so that a size of the bulk region may not be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a semiconductor device, the method comprising:

providing a substrate including a first region, a second region surrounding the first region and designed as a bulk region, and a third region positioned outside the second region and designed as the bulk region;

forming a first mask layer, a second mask layer, and a third mask layer stacked on the substrate;

forming first photoresist patterns on the third mask layer in the first region and the second region, such that the first photoresist patterns include lines and spaces repeatedly arranged;

forming a second photoresist pattern covering the third mask layer in the third region;

etching the third mask layer using the first photoresist patterns and the second photoresist pattern as etching masks to form first structures on the first region and the second region and a second structure on the third region, respectively;

forming conformally a first spacer layer on surfaces of the first structures and the second structure and on the second mask layer;

forming a filling pattern to fill a first opening between the first structures on the second region;

anisotropically etching the first spacer layer on the first region to form first spacers on sidewalls of the first structures on the first region;

removing the first structures between the first spacers on the first region; and etching the second mask layer using the first spacers on the first region and the first structures and the second structure and the filling pattern on the second region and the third region as etching masks to form first mask patterns on the first mask layer in the first region and a second mask pattern on the first mask layer in the second region and the third region, wherein the first mask patterns include lines and spaces repeatedly arranged.

2. The method as claimed in claim 1, wherein the first region is a region in which memory cells are formed, and the second region and the third region are the bulk region in which the memory cells are not formed.

3. The method as claimed in claim 1, wherein the first spacer layer includes silicon oxide.

4. The method as claimed in claim 1, wherein the first spacer layer is formed by an atomic layer deposition process.

5. The method as claimed in claim 1, wherein the third mask layer includes amorphous carbon.

6. The method as claimed in claim 1, wherein the third mask layer includes a mandrel layer and a separation layer that are stacked.

7. The method as claimed in claim 1, wherein the filling pattern includes silicon oxide.

8. The method as claimed in claim 1, wherein forming the filling pattern includes:

forming a third photoresist pattern covering the first spacer layer on the first region and exposing the first spacer layer on the second region and the third region;

forming conformally a filling layer on surfaces of the third photoresist pattern and the first spacer layer, such that the filling layer fills the first opening between the first structures;

partially removing the filling layer to expose an upper surface of the third photoresist pattern to form the filling pattern in the first opening; and removing the third photoresist pattern.

9. The method as claimed in claim 8, wherein forming the filling layer includes an atomic layer deposition process.

10. The method as claimed in claim 8, wherein the third photoresist pattern is formed to have a thickness of about 50 angstroms to about 2000 angstroms from an upper surface of the first spacer layer on the first structures.

11. The method as claimed in claim 8, wherein partially removing the filling layer includes an etching process using an argon gas or an oxygen gas and applying a bias of about 50 V to about 1000 V.

12. The method as claimed in claim 1, wherein an edge of the filling pattern adjacent to the first region is not aligned along a straight line.

13. The method as claimed in claim 1, further comprising:

forming a second spacer layer on surfaces of the first and second mask patterns and the first mask layer;

anisotropically etching the second spacer layer to form second spacers on sidewalls of the first mask patterns and the second mask pattern;

removing the first mask patterns between the second spacers in the first region; and etching the first mask layer using the second spacers and the second mask pattern as an etching mask to form third mask patterns on the first region of the substrate and a fourth mask pattern on the second and third regions of the substrate, wherein the third mask patterns include lines and spaces repeatedly arranged.

14. A method for manufacturing a semiconductor device, the method comprising:

forming a first mask layer, a second mask layer and a third mask layer sequentially stacked on a substrate, the substrate including a first region, a second region surrounding the first region and designed as a bulk region, and a third region positioned outside the second region and designed as the bulk region;

forming a first photoresist pattern on the third mask layer in the first region and the second region and a second photoresist pattern covering the third mask layer in the third region, such that the first photoresist pattern includes lines and spaces repeatedly arranged;

etching the third mask layer using the first photoresist pattern and the second photoresist pattern as etching masks to form first structures on the first region and the second region and second structures on the third region, respectively;

forming conformally a first spacer layer on surfaces of the first structures and the second structures and on the second mask layer;

forming a filling pattern to fill a first opening between the first structures in the second region;

anisotropically etching the first spacer layer on the first region to form first spacers on sidewalls of the first structures on the first region;

removing the first structures between the first spacers on the first region;

etching the second mask layer using the first spacers on the first region and the first structures and the second structures and the filling pattern on the second region and the third region as etching masks to form first mask patterns including a second opening on the first mask layer in the first region and a second mask pattern covering the first mask layer in the second region and the third region;

forming second spacers on sidewalls of the first mask pattern and the second mask pattern;

removing the first mask pattern; and etching the first mask layer using the second spacers and the second mask pattern as etching masks to form third mask patterns including a third opening on the first region of the substrate and a fourth mask pattern on the second region and the third region.

15. The method as claimed in claim 14, wherein forming the filling pattern includes:

forming a third photoresist pattern covering the first spacer layer on the first region and exposing the first spacer layer on the second region and the third region;

forming conformally a filling layer on surfaces of the third photoresist pattern and the first spacer layer, such that the filling layer fills the first opening between the first structures on the second region;

partially removing the filling layer to expose an upper surface of the third photoresist pattern to form the filling pattern in the first opening; and removing the third photoresist pattern.

16. The method as claimed in claim 15, wherein forming the filling layer includes an atomic layer deposition process.

17. The method as claimed in claim 15, wherein the third photoresist pattern is formed to have a thickness of about 50 angstroms to about 2000 angstroms from an upper surface of the first spacer layer formed on the first structures.

18. The method as claimed in claim 14, wherein an end of the filling pattern adjacent to the first region is not aligned along a straight line.

19. A method for manufacturing a semiconductor device, the method comprising:

forming an etch target layer and an etching mask layer stacked on a substrate, the substrate including a first region, a second region surrounding the first region and designed as a bulk region, and a third region positioned outside the second region and designed as the bulk region;

forming first photoresist patterns on the etching mask layer in the first region and the second region and a second photoresist pattern completely covering the etching mask layer in the third region, the first photoresist patterns including lines and spaces repeatedly arranged;

etching the etching mask layer using the first photoresist patterns and the second photoresist pattern as etching masks to form first mask patterns on the first region and the second region and a second mask pattern on the third region, respectively;

forming a filling pattern to fill a first opening between the first mask patterns on the second region; and etching the etch target layer using the first mask patterns and the second mask pattern and the filling pattern as etching masks to form first patterns including second openings on the first region and a bulk pattern covering the second region and the third region of the substrate, wherein the first patterns include lines and spaces repeatedly arranged.

20. The method as claimed in claim 19, further comprising:

forming a third photoresist pattern covering a first spacer layer on the first region and exposing the first spacer layer on the second region and the third region;

forming conformally a filling layer on surfaces of the third photoresist pattern and the first spacer layer, such that the filling layer fills the first opening between first structures;

partially removing the filling layer to expose an upper surface of the third photoresist pattern to form the filling pattern in the first opening; and removing the third photoresist pattern.

* * * * *